(12) United States Patent
Ju et al.

(10) Patent No.: US 11,289,606 B2
(45) Date of Patent: Mar. 29, 2022

(54) CAPACITANCE REDUCTION FOR BACK-SIDE POWER RAIL DEVICE

(71) Applicant: Taiwan Semiconductor Manufacturing Co., Ltd., Hsin-Chu (TW)

(72) Inventors: Shi Ning Ju, Hsinchu (TW); Chih-Hao Wang, Baoshan Township (TW); Kuo-Cheng Chiang, Zhubei (TW); Kuan-Lun Cheng, Hsin-Chu (TW); Wen-Ting Lan, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/034,347

(22) Filed: Sep. 28, 2020

(65) Prior Publication Data
US 2021/0351303 A1 Nov. 11, 2021

Related U.S. Application Data

(60) Provisional application No. 63/022,666, filed on May 11, 2020.

(51) Int. Cl.
| | |
|---|---|
| *H01L 29/786* | (2006.01) |
| *H01L 29/417* | (2006.01) |
| *H01L 29/423* | (2006.01) |
| *H01L 29/66* | (2006.01) |
| *H01L 29/06* | (2006.01) |

(52) U.S. Cl.
CPC .. *H01L 29/78618* (2013.01); *H01L 29/41733* (2013.01); *H01L 29/42392* (2013.01); *H01L 29/66545* (2013.01); *H01L 29/66742* (2013.01); *H01L 29/78603* (2013.01); *H01L 29/0653* (2013.01); *H01L 29/0673* (2013.01); *H01L 29/66553* (2013.01); *H01L 29/78696* (2013.01)

(58) Field of Classification Search
CPC ......... H01L 29/78618; H01L 29/41733; H01L 29/42392; H01L 29/66545; H01L 29/66742; H01L 29/78603; H01L 29/0653; H01L 29/0673; H01L 29/66553; H01L 29/78696
USPC ....................................... 257/401
See application file for complete search history.

(56) References Cited

U.S. PATENT DOCUMENTS

| | | | | |
|---|---|---|---|---|
| 2020/0035560 | A1* | 1/2020 | Block | H01L 27/1203 |
| 2020/0365509 | A1* | 11/2020 | Sasaki | H01L 23/481 |
| 2021/0134721 | A1* | 5/2021 | Chiang | H01L 29/66439 |

* cited by examiner

*Primary Examiner* — Tong-Ho Kim
(74) *Attorney, Agent, or Firm* — Eschweiler & Potashnik, LLC

(57) ABSTRACT

A semiconductor transistor device includes a channel structure, a gate structure, a first source/drain epitaxial structure, a second source/drain epitaxial structure, a gate contact, and a back-side source/drain contact. The gate structure wraps around the channel structure. The first source/drain epitaxial structure and the second source/drain epitaxial structure are disposed on opposite endings of the channel structure. The gate contact is disposed on the gate structure. The back-side source/drain contact is disposed under the first source/drain epitaxial structure. The first source/drain epitaxial structure has a concave bottom surface contacting the back-side source/drain contact.

20 Claims, 51 Drawing Sheets

CAPACITANCE REDUCTION FOR BACK-SIDE POWER RAIL DEVICE

REFERENCE TO RELATED APPLICATION

This application claims the benefit of U.S. Provisional Application No. 63/022,666, filed on May 11, 2020, the contents of which are hereby incorporated by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
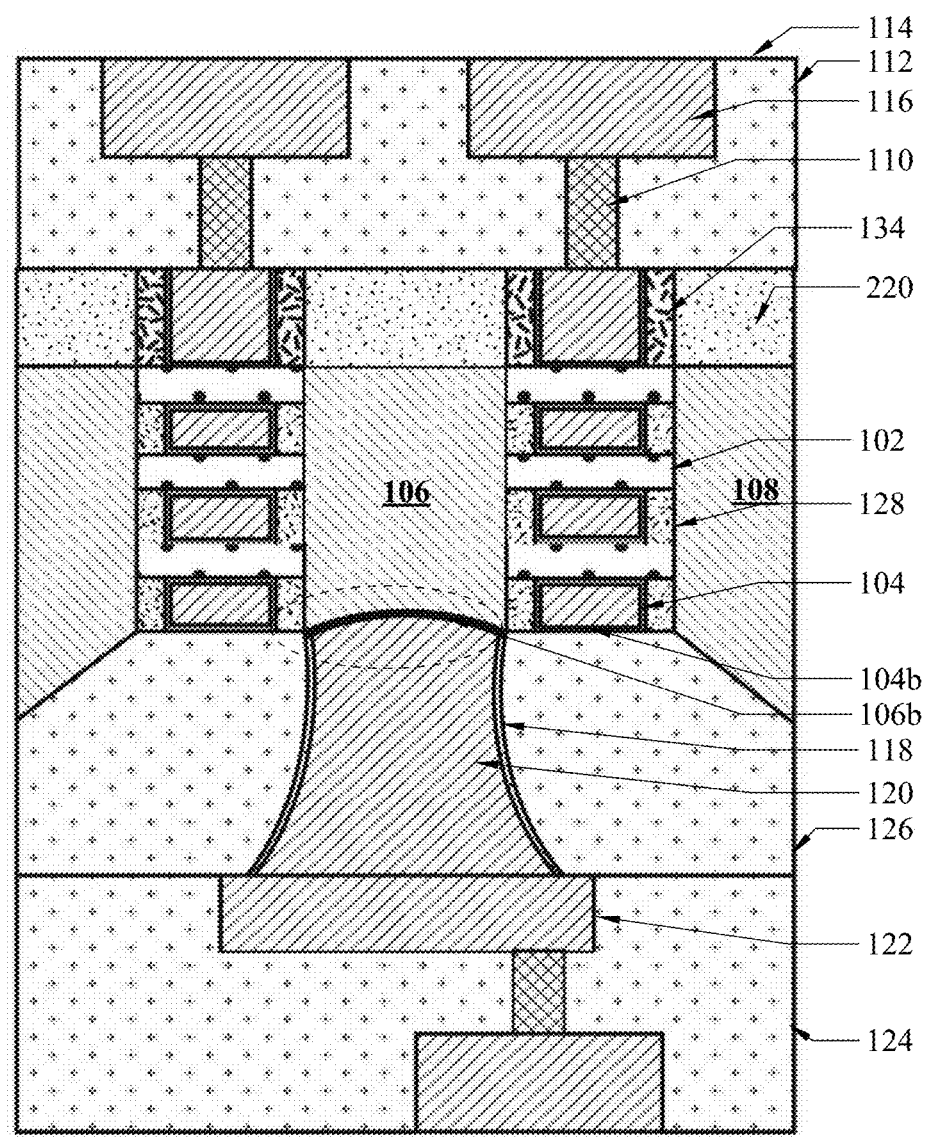
FIG. 1 illustrates a cross-sectional view of some embodiments of a semiconductor transistor device having a back-side power rail.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA transistor structures. After forming the GAA transistor structures, an interconnect structure may be formed thereover including power rails and signal lines disposed within interlayer dielectric (ILD) layers.

Current power rail design will suffer a complex metal layer routing in back-end-of-line (BEOL) when semiconductor process continues to shrink, for example, beyond 3 nm. As a result of complex metal layer routing, more masks are needed, and voltage drop (also referred as IR drop) suffers when metal wires become thinner.

In view of the above, the present disclosure is related to a semiconductor transistor device having a back-side power rail and manufacturing methods thereof. By moving the power rail from a front-side to a back-side of the semiconductor transistor device, the metal layer routing is relaxed in BEOL. Thus, fewer masks are needed, IR drop is improved, and both power rail area and active region can be enlarged.

More particularly, some embodiments of the present disclosure are related to a GAA device. The GAA device comprises a channel structure, a gate structure wrapping around the channel structure, a first source/drain epitaxial structure and a second source/drain epitaxial structure disposed on opposite endings of the channel structure, and a gate contact disposed on the gate structure. The GAA device further comprises a back-side source/drain contact landing on a recessed bottom surface of the first source/drain epitaxial structure, and a back-side power rail disposed under and connecting the back-side source/drain contact. The back-side source/drain contact and the back-side power rail may comprise metal materials for example. In some embodiments, a bottom surface of the first source/drain epitaxial structure may be recessed to a location vertically deeper than a bottom surface of the gate structure or the channel structure. Thus, the cell capacitance can be reduced.

In some embodiments, the back-side source/drain contact is formed self-aligned by forming a sacrificial back-side contact prior to forming the first source/drain epitaxial structure. The dummy back-side contact is selectively removed later and replaced with the the back-side source/drain contact such that an overlay shift of contact landing is eliminated.

In some additional embodiments, the GAA device further comprises a back-side dielectric cap disposed under the gate structure and the second source/drain epitaxial structure. The back-side dielectric cap may comprise an oxide, nitride, carbon nitride, or low-κ dielectric materials. The back-side dielectric cap replaces original semiconductor body material, and thus reduces cell capacitance and thereby eliminates current leakage problems such as a leakage between the gate structure and the back-side source/drain contact.

Further, the second source/drain epitaxial structure may have a recessed bottom surface. A bottom surface of the second source/drain epitaxial structure may be recessed to a location vertically aligned or even deeper than a bottom surface of the gate structure. Thus, the cell capacitance can be further reduced.

The GAA devices presented herein include a p-type GAA device or an n-type GAA device. Further, the GAA devices may have one or more channel regions (e.g., semiconductor nanowires, nanodots, etc.) associated with a single, contiguous gate structure, or multiple gate structures. One of ordinary skill may recognize other examples of semiconductor transistor devices that may benefit from aspects of the present disclosure. The GAA devices may be a portion of an integrated circuit (IC) that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

FIG. 1 illustrates a cross-sectional view of a semiconductor transistor device 100 according to some embodiments. The semiconductor transistor device 100 comprises a channel structure 102 and a gate structure 104 wrapping around the channel structure 102. The channel structure 102 may comprise a stack of semiconductor layers separated and surrounded by a stack of metal components of the gate structure 104. A first source/drain epitaxial structure 106 and a second source/drain epitaxial structure 108 are disposed on opposite endings of the channel structure 102. Inner spacers 128 are disposed on opposite endings of the metal components of the gate structure 104 to isolate the gate structure 104 from the first and second source/drain epitaxial structures 106, 108. In some embodiments, gate spacers 134 are disposed along opposite sidewalls of an upper portion of the gate structure 104. The outer surfaces of the inner spacers 128 may be substantial coplanar with outer surfaces of the channel structure 102 and/or the gate spacers 134. In some embodiments, an upper isolation structure 220 is disposed in trenches between the gate spacers 134. The upper isolation structure 220 provides electrical insulation between the gate structures 104. As an example, the channel structure 102 may be pure silicon layers not doped with p-type and n-type impurities. A thickness of the channel structure 102 may be in a range between about 3 nm and about 15 nm. As an example, the gate structure 104 may comprise a gate dielectric material such as high-κ materials (κ is greater than 7), a work function metal material, and a filling metal material such as tungsten or aluminum. A thickness of the gate structure 104 may be in a range between about 2 nm and about 10 nm. In some embodiments, the first and second source/drain epitaxial structures 106, 108 comprise a semiconductor material such as silicon, germanium, or silicon germanium. The first and second source/drain epitaxial structures 106, 108 may be hexagonal or diamond-like shapes. In some embodiments, the first and second source/drain epitaxial structures 106, 108 have different conductivity types. For example, the first source/drain epitaxial structure 106 can be an N-type epitaxial structure, and the second source/drain epitaxial structures 108 can be a P-type epitaxial structure, or vice versa. The first and second source/drain epitaxial structures 106, 108 may respectively be a source and a drain of the semiconductor transistor device 100.

At a front side of the semiconductor transistor device 100, a front-side interconnect structure 114 may be disposed over the gate structure 104 and the first and second source/drain epitaxial structures 106, 108. The front-side interconnect structure 114 may comprise a plurality of front-side metal layers 116 disposed within and surrounded by a front-side interlayer dielectric layer 112. The front-side metal layers 116 includes vertical interconnects, such as vias or contacts, and horizontal interconnects, such as metal lines. The front-side interconnect structure 114 electrically connects various features or structures of the semiconductor transistor device. For example, a gate contact 110 may be disposed on the gate structure 104 and connected to external circuits through the front-side metal layers 116.

At a back side of the semiconductor transistor device 100, in some embodiments, a back-side source/drain contact 120 is disposed underlying the first source/drain epitaxial structure 106 and connects the first source/drain epitaxial structure 106 to a back-side power rail 122 disposed under the back-side source/drain contact 120. In some embodiments, a dielectric sidewall spacer 118 is disposed along a sidewall of the back-side source/drain contact 120 and separates the back-side source/drain contact 120 from the back-side dielectric cap 126. The back-side source/drain contact 120 and the back-side power rail 122 may comprise metal materials for example. For example, the back-side source/drain contact 120 may comprise metal, such as tungsten (W), cobalt (Co), ruthenium (Ru), aluminum (Al), copper (Cu), or other suitable materials. Thus, the first source/drain epitaxial structure 106 can be connected to external circuits from the back side of the semiconductor transistor device 100 through the back-side source/drain contact 120. Thereby, more metal routing flexibility is provided, and the cell capacitance can be reduced.

Further, the back-side source/drain contact 120 may land on a recessed bottom surface 106b of the first source/drain epitaxial structure 106. In some embodiments, the bottom surface 106b of the first source/drain epitaxial structure 106 may be recessed as a convex shape reaching a location vertically deeper than a bottom surface 104b of the gate structure 104.

Also at the back side of the semiconductor transistor device 100, in some embodiments, a back-side dielectric cap 126 is disposed under the gate structure 104. The back-side dielectric cap 126 may also extend under the second source/drain epitaxial structure 108. The back-side dielectric cap 126 replaces original semiconductor body material, helps to separate and insulate the gate structure 104 and the back-side source/drain contact 120, and thus reduces cell capacitance and eliminates current leakage problems such as a leakage between the gate structure 104 and the back-side source/drain contact 120. The back-side dielectric cap 126 may comprise an oxide, nitride, carbon nitride, or low-κ dielectric materials.

Figure 2:
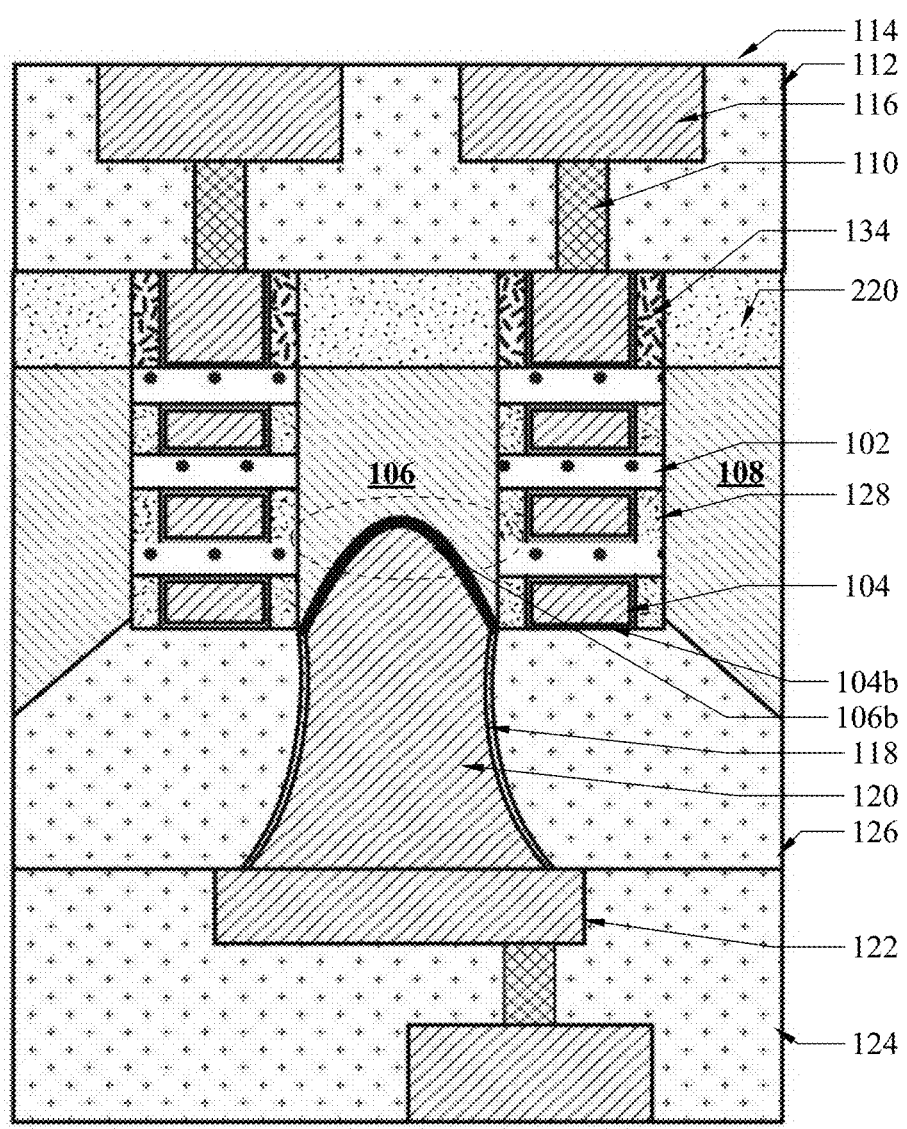
FIG. 2 illustrates a cross-sectional view of some additional embodiments of a semiconductor transistor device having a back-side power rail.

FIG. 2 illustrates a cross-sectional view of a semiconductor transistor device 200 having a back-side power rail according to some embodiments. Besides features disclosed with reference to FIG. 1, in some further embodiments, the bottom surface 106b of the first source/drain epitaxial structure 106 may be recessed even deeper to a location vertically exceeding a bottom surface 102b of the channel structure 102. The cell capacitance is further reduced compared to the semiconductor transistor device 100 of FIG. 1, where the the bottom surface 106b of the first source/drain epitaxial structure 106 is below the bottommost of the channel structure 102.

Figure 3:
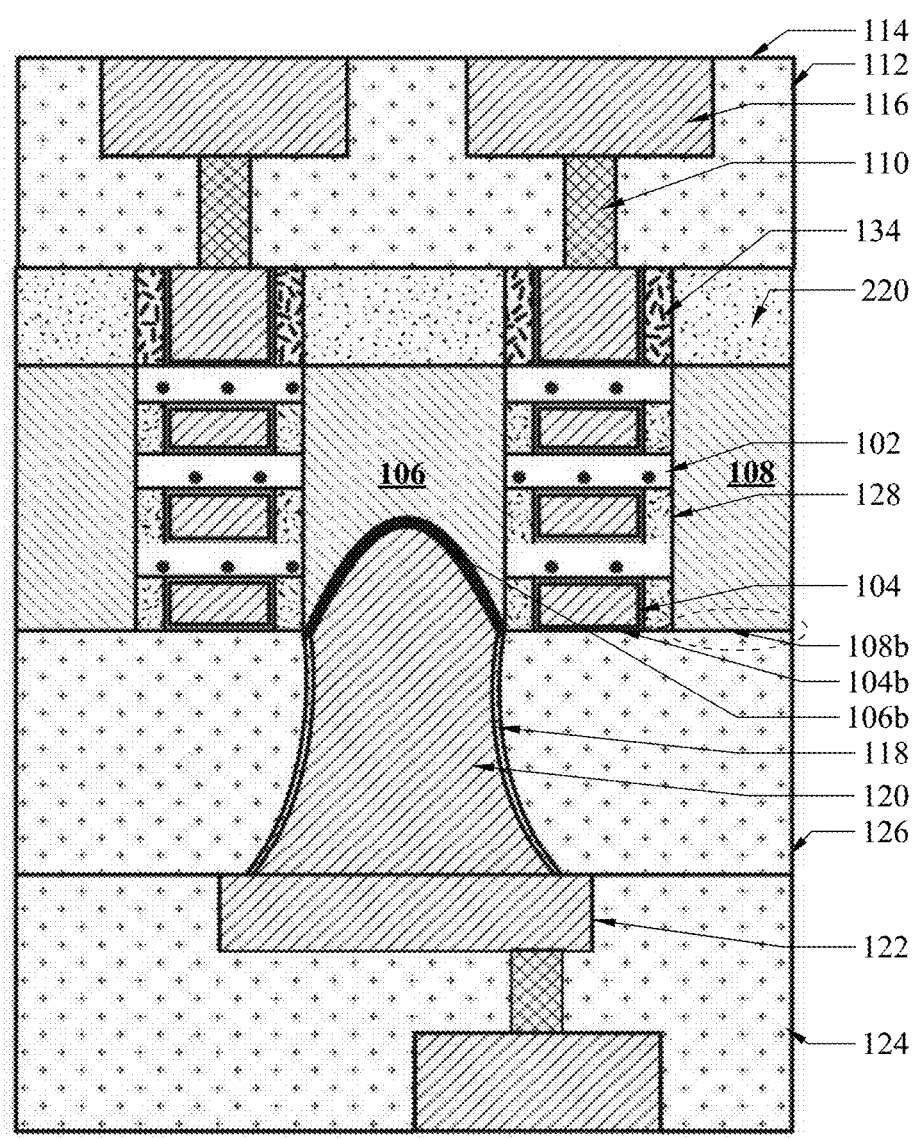
FIG. 3 illustrates a cross-sectional view of some additional embodiments of a semiconductor transistor device having a back-side power rail.

FIG. 3 illustrates a cross-sectional view of a semiconductor transistor device 300 having a back-side power rail according to some embodiments. Besides features disclosed with reference to FIG. 1 and FIG. 2, in some further embodiments, a bottom surface 108b of the second source/drain epitaxial structure 108 may be recessed back and have a concave shape as shown in FIG. 1 and FIG. 2 to a position leveled with a bottom surface 104b of the gate structure 104. The cell capacitance can be further reduced compared to the semiconductor transistor devices 100, 200 of FIGS. 1, 2.

Figure 4:
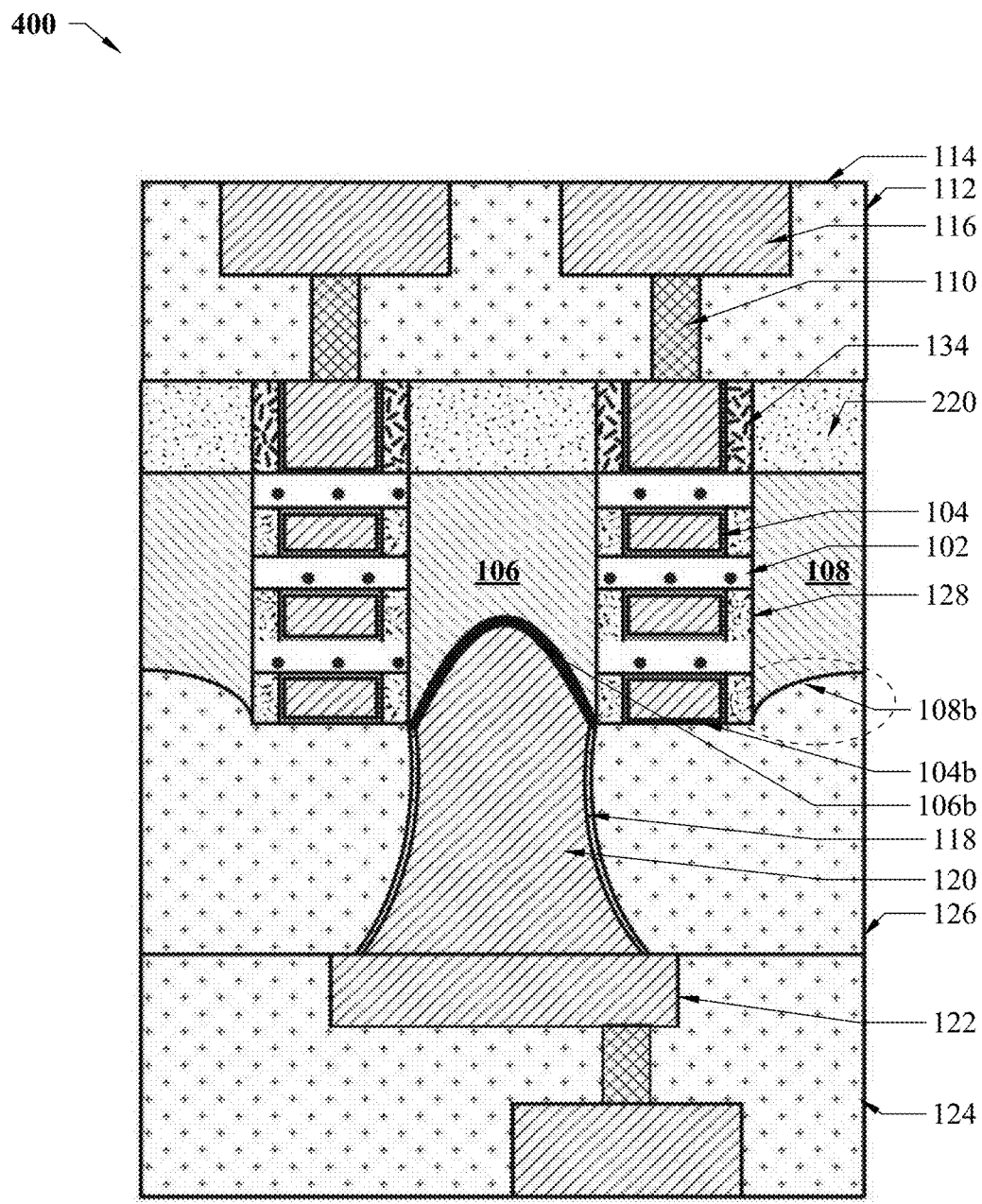
FIG. 4 illustrates a cross-sectional view of some additional embodiments of a semiconductor transistor device having a back-side power rail.

FIG. 4 illustrates a cross-sectional view of a semiconductor transistor device 400 having a back-side power rail according to some embodiments. Besides features disclosed above, in some further embodiments, the bottom surface 108b of the second source/drain epitaxial structure 108 may be recessed to a location vertically deeper than the bottom surface 104b of the gate structure 104, and the cell capacitance can be further reduced compared to the semiconductor transistor devices 100, 200, 300 of FIGS. 1, 2, 3.

Figure 5:
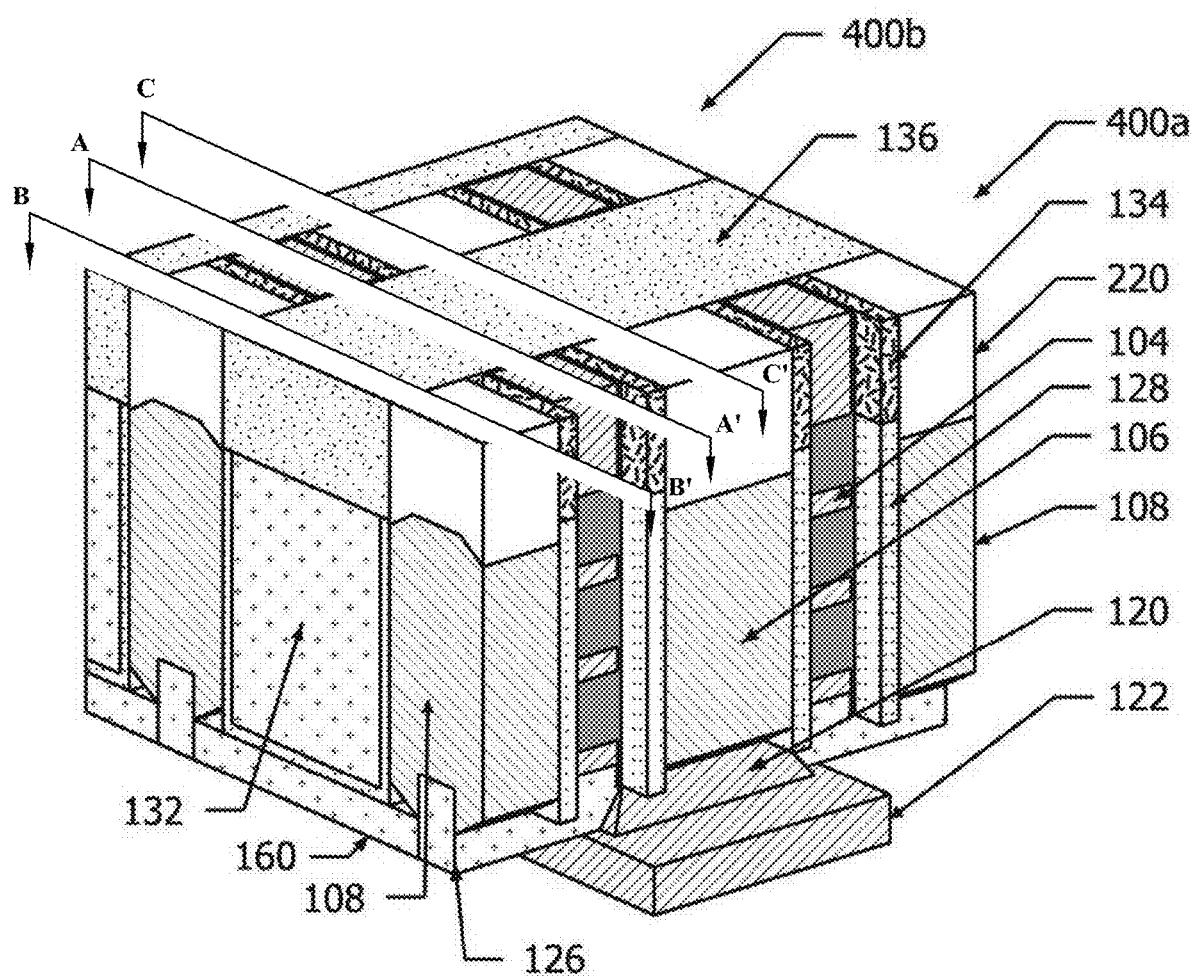
FIG. 5 illustrates a perspective view of some embodiments of a semiconductor transistor device having a back-side power rail.
Figure 6A:
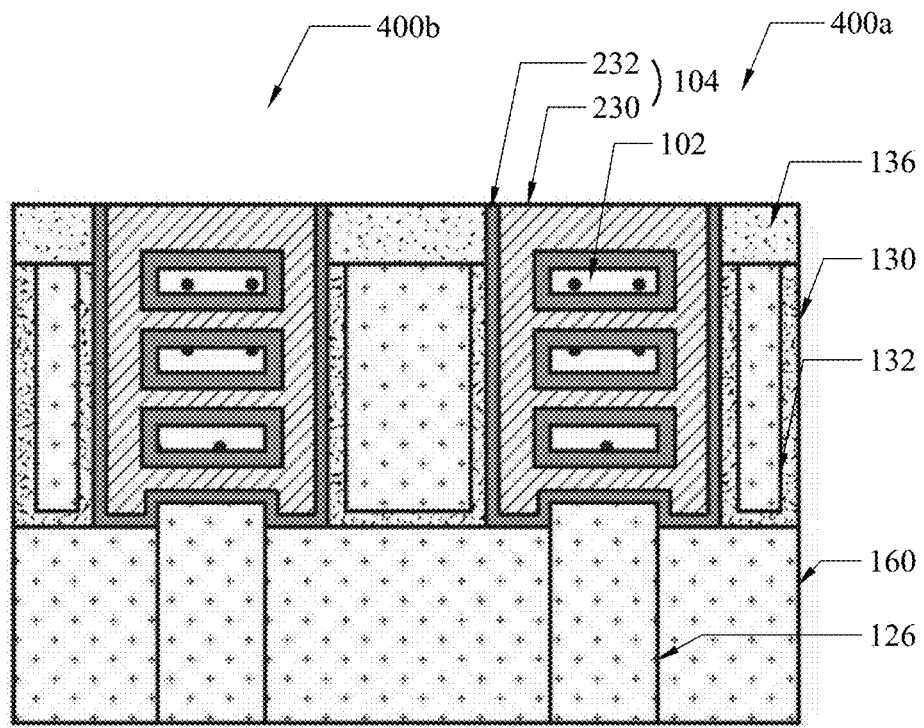
FIG. 6A is a cross-sectional view of some embodiments of a semiconductor transistor device taken along line A-A' of FIG. 5.
Figure 6B:
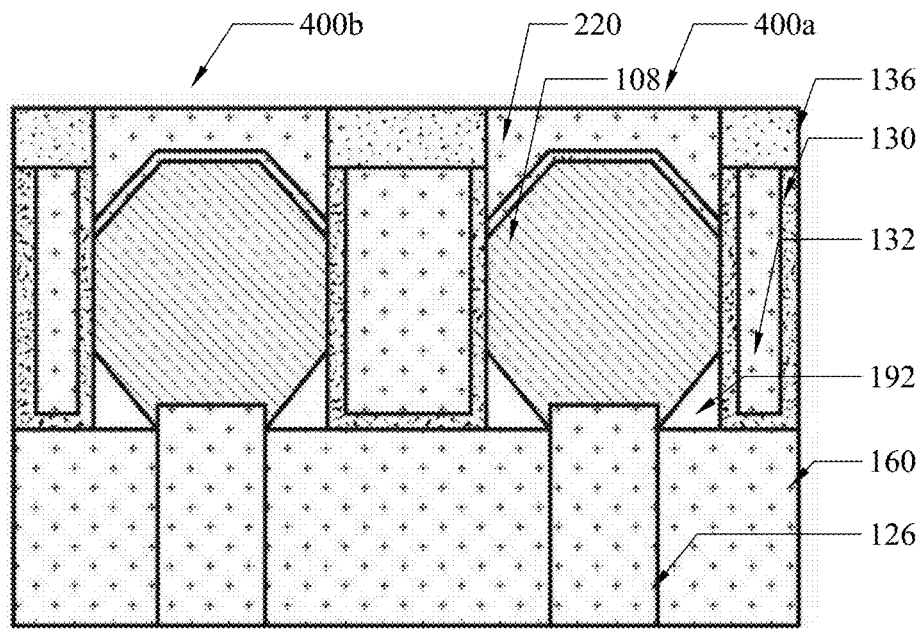
FIG. 6B is a cross-sectional view of some embodiments of a semiconductor transistor device taken along line B-B' of FIG. 5.
Figure 6C:
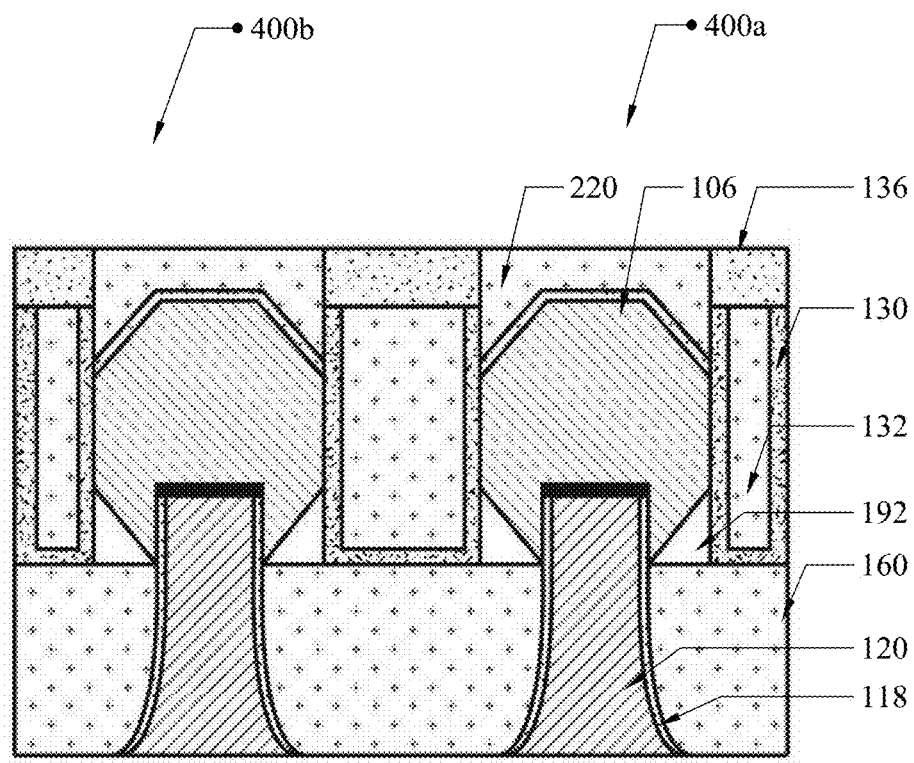
FIG. 6C is a cross-sectional view of some embodiments of a semiconductor transistor device taken along line C-C' of FIG. 5.

FIG. 5 shows a perspective view of the semiconductor transistor device 400 of FIG. 4 according to some embodiments. FIG. 4 may be considered as the cross-sectional view taken along the x-direction of FIG. 5. FIGS. 6A-6C may be considered as the cross-sectional views taken respectively along the y-direction in a gate region, a first source/drain region, and a second source/drain region of FIG. 5. Alternatively, FIGS. 4-6C, and other figures hereafter, can also stand alone to show varies embodiments, and features discussed associated with one figure can be incorporated to another when applicable.

As shown in FIGS. 5-6C, in some embodiments, a lower isolation structure 160, a middle isolation structure 132, and a hard mask 136 can collectively function as an insulating structure separating two semiconductor transistor devices 400a, 400b along the y-direction. As shown in FIG. 6A, in some embodiments, a gate structure 104 comprises a gate dielectric layer 232 and a gate electrode 230. The gate electrode 230 includes one or more work function metal layer (s) and a filling metal. The gate dielectric layer 232 may be conformally formed lining outer surfaces of the gate electrode 230. The gate dielectric layer 232 may be in contact with the lower isolation structure 160 and a channel structure 102. In some embodiments, the gate dielectric layer 232 includes a high-κ material (κ is greater than 7) such as hafnium oxide (HfO2), zirconium oxide (ZrO2), lanthanum oxide (La2O3), hafnium aluminum oxide (HfAlO2), hafnium silicon oxide (HfSiO2), aluminum oxide (Al2O3), or other suitable materials.

As shown in FIGS. 5 and 6C, a first source/drain epitaxial structure 106 may have a bottom surface recessed (e.g., convex) and a back-side source/drain contact 120 electrically coupled to the recessed bottom surface. As shown in FIGS. 5, 6A, and 6B, a second source/drain epitaxial structure 108 may have a bottom surface recessed (e.g., convex) and a back-side dielectric cap 126 disposed directly under the second source/drain epitaxial structure 108 and the gate structure 104. The back-side dielectric cap 126 may be surrounded by the lower isolation structure 160. In some embodiments, air gaps 192 may be formed surrounding lower portions of the first source/drain epitaxial structure 106 and the second source/drain epitaxial structure 108.

FIGS. 7-27B illustrate a method for manufacturing a semiconductor transistor device at various stages in accordance with some embodiments of the present disclosure. In some embodiments, the semiconductor transistor device shown in FIGS. 7-27B may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 7:
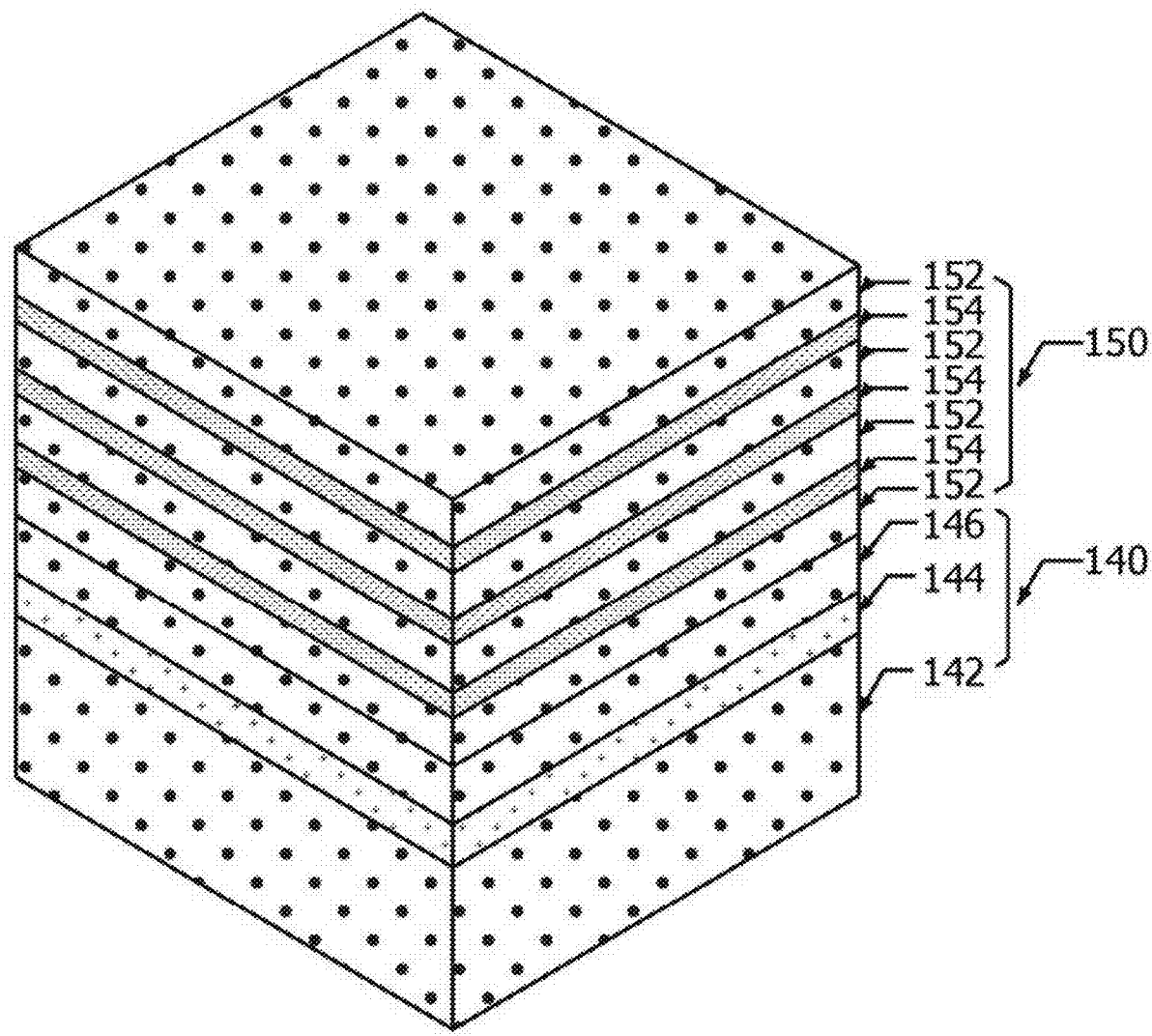
FIGS. 7-27B illustrate various views of some embodiments of a method of forming a semiconductor transistor device having a back-side power rail at various stages.

As shown in a perspective view of FIG. 7, in some embodiments, a stacked structure 150 is formed on a substrate 140. In some embodiments, the substrate 140 may be a part of a wafer, and may comprise silicon (Si), germanium (Ge), silicon germanium (SiGe), gallium arsenide (GaAs) or other appropriate semiconductor materials. In some embodiments, the substrate 140 is a semiconductor-on-insulator (SOI) structure comprising a bulk substrate 142, an insulator substrate layer 144 on the bulk substrate 142, and a semiconductor substrate layer 146 on the insulator substrate layer 144. In various embodiments, the substrate 140 may include any of a variety of substrate structures and materials.

The stacked structure 150 includes first semiconductor layers 152 and second semiconductor layers 154 stacked alternately. The first semiconductor layers 152 will serve as channel regions of the semiconductor transistor device, and the second semiconductor layers 154 are sacrificial layers which will be subsequently removed and replaced with a gate material. The first semiconductor layers 152 and the second semiconductor layers 154 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layers 152 and the second semiconductor layers 154 are made of Si, a Si compound, SiGe, Ge or a Ge compound. The stacked structure 150 may be formed on the substrate 140 through epitaxy, such that the stacked structure 150 forms crystalline layers. Though FIG. 7 shows four layers of the first semiconductor layer 152 and three layers of the second semiconductor layer 154, the number of the layers are not so limited, and may be as small as 1 for each layer. In some embodiments, 2-10 layers of each of the first and second semiconductor layers are formed. By adjusting the numbers of the stacked layers, a driving current of the semiconductor transistor device can be adjusted.

In some embodiments, the first semiconductor layers 152 may be pure silicon layers that are free from germanium. The first semiconductor layers 152 may also be substantially pure silicon layers, for example, with a germanium atomic percentage lower than about 1 percent. Furthermore, the first semiconductor layers 152 may be intrinsic, which are not doped with p-type and n-type impurities. In some embodiments, a thickness of the first semiconductor layers 152 is in a range between about 3 nm and about 15 nm.

In some embodiments, the second semiconductor layers 154 can be SiGe layers having a germanium atomic percentage greater than zero. In some embodiments, the germanium percentage of the second semiconductor layers 154 is in a range between about 10 percent and about 50 percent. In some embodiments, a thickness of the second semiconductor layers 154 is in a range between about 2 nm and about 10 nm.

Figure 8:
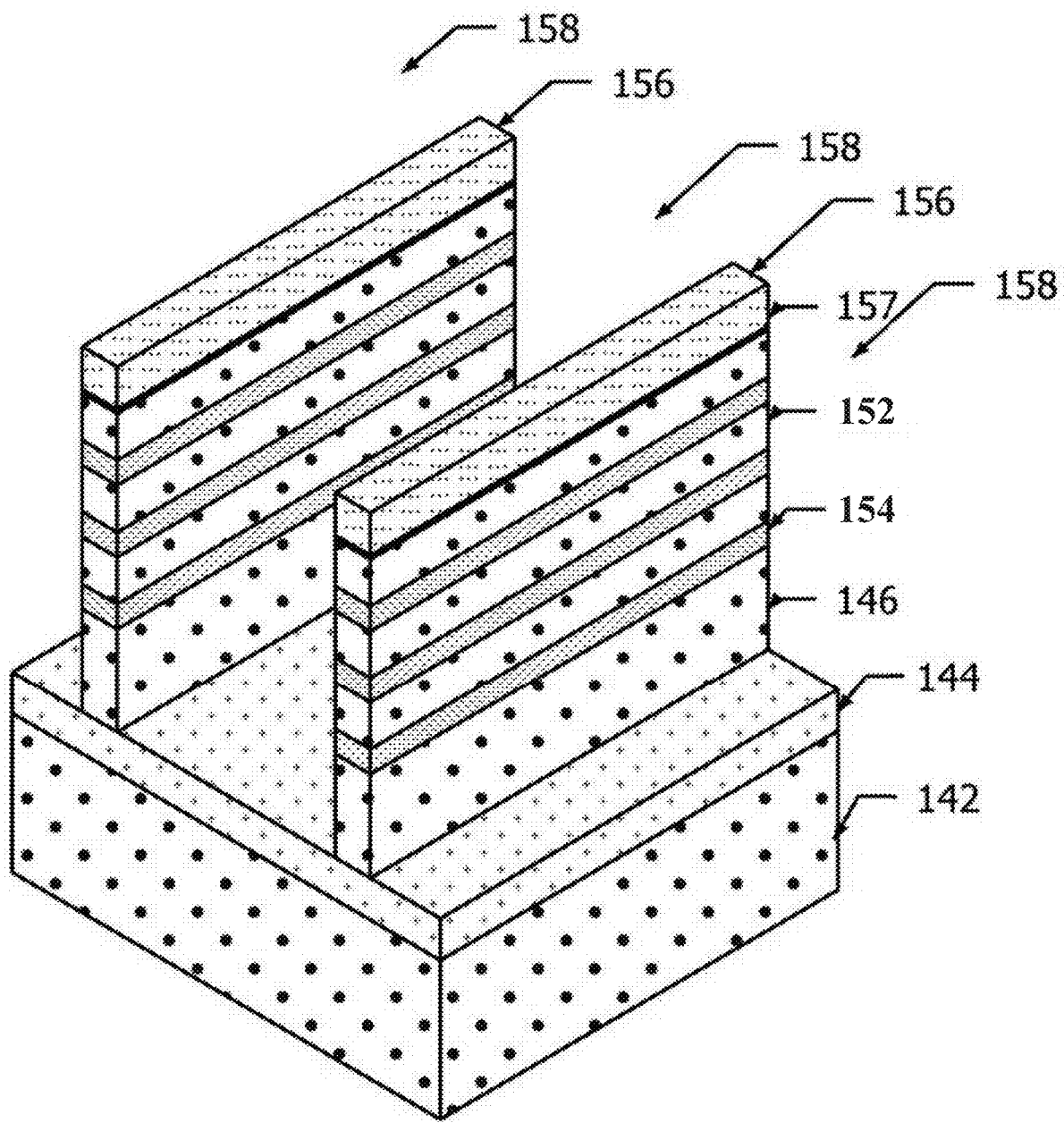

As shown in a perspective view of FIG. 8, in some embodiments, the stacked structure 150 (see FIG. 7) is patterned to form fin structures 156 and trenches 158 extending in the X direction. In some embodiments, the stacked structure 150 is patterned by an etching process using a patterned mask layer 157 as an etch mask, such that portions of the stacked structure 150 not covered by the mask layer 157 are removed. The semiconductor substrate layer 146 may also be partially or fully removed in this process. The mask layer 157 may include a first mask layer and a second mask layer. The first mask layer may be a pad oxide layer made of a silicon oxide, which can be formed by a thermal oxidation. The second mask layer may be made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 157 may be patterned using varies multiple patterning techniques. FIG. 8 shows two fin structures 156 arranged in the Y direction and parallel to each other, but the number of the fin structures is not limited to, and may be as small as one and three or more. In some embodiments, one or more dummy fin structures are formed on both sides of the fin structures 156 to improve pattern fidelity in the patterning operations.

Figure 9:
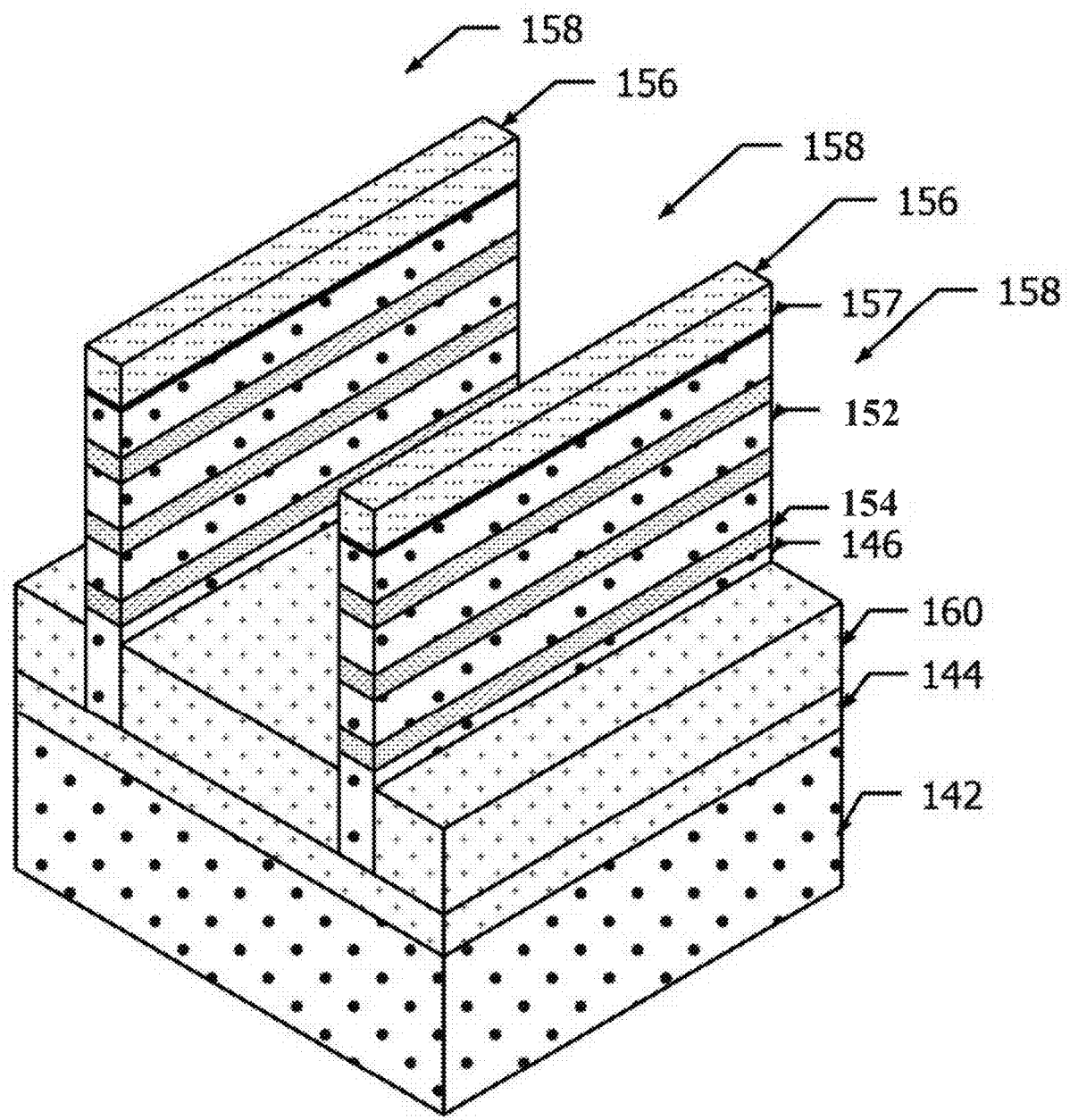

As shown in a perspective view of FIG. 9, in some embodiments, a lower isolation structure 160 is formed over the insulator substrate layer 144 in lower portions of the trenches 158, which is also referred to as a shallow trench isolation (STI) structure. Upper portions of the fin structures 156 are exposed from the lower isolation structure 160. The lower isolation structure 160 may be formed by forming an insulating material over the insulator substrate layer 144 followed by a planarization operation. The insulating material is then recessed to form the lower isolation structure 160 so that the upper portions of the fin structures 156 are exposed. The insulating material may comprise a dielectric material such as, for example, a nitride (e.g., silicon nitride, silicon oxynitride, silicon oxygen carbon nitride, silicon carbon nitride), a carbide (e.g., silicon carbide, silicon oxygen carbide), an oxide (e.g., silicon oxide), borosilicate glass (BSG), phosphoric silicate glass (PSG), borophosphosilicate glass (BPSG), a low-κ dielectric material with a dielectric constant less than 7 (e.g., a carbon doped oxide, SiCOH), or the like. In some embodiments, the lower isolation structures 160 are formed through various steps comprising a thermal oxidation or deposition process (e.g., physical vapor deposition (PVD), chemical vapor deposition (CVD), PECVD, atomic layer deposition (ALD), sputtering, etc.), and removal processes (e.g., wet etching, dry etching, chemical mechanical planarization (CMP), etc.).

Figure 10:
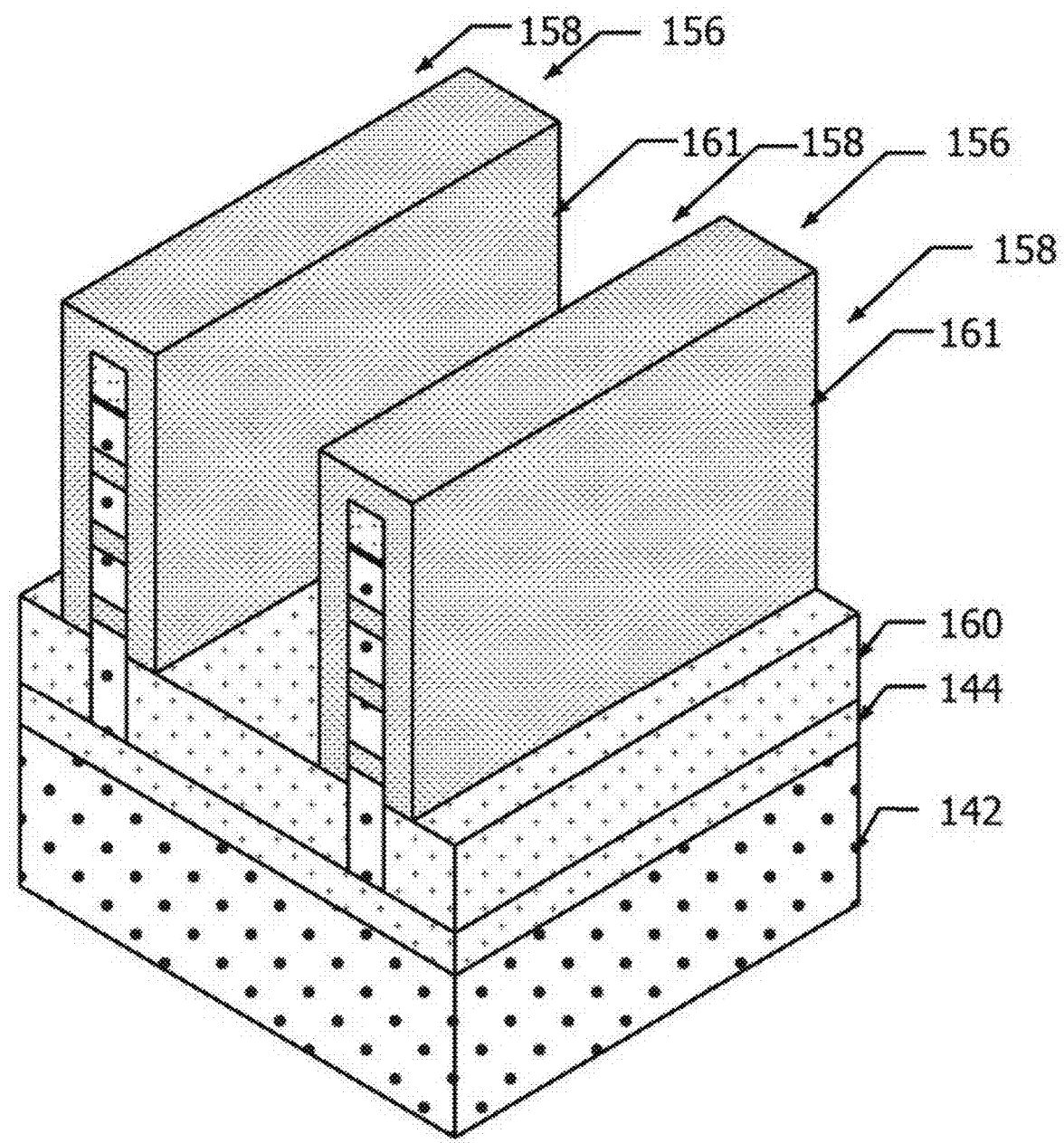

As shown in a perspective view of FIG. 10, in some embodiments, a cladding semiconductor layer 161 is formed over outer surfaces of the fin structures 156. In some embodiments, the cladding semiconductor layer 161 comprises a semiconductor material, such as germanium, silicon germanium, or the like. In some embodiments, the cladding semiconductor layer 161 comprises the same material as the second semiconductor layers 154. Further, in some embodiments, the cladding semiconductor layer 161 may be formed by an epitaxy growth process or a deposition process (e.g., PVD, CVD, PE-CVD, ALD, sputtering, etc.).

Figure 11:
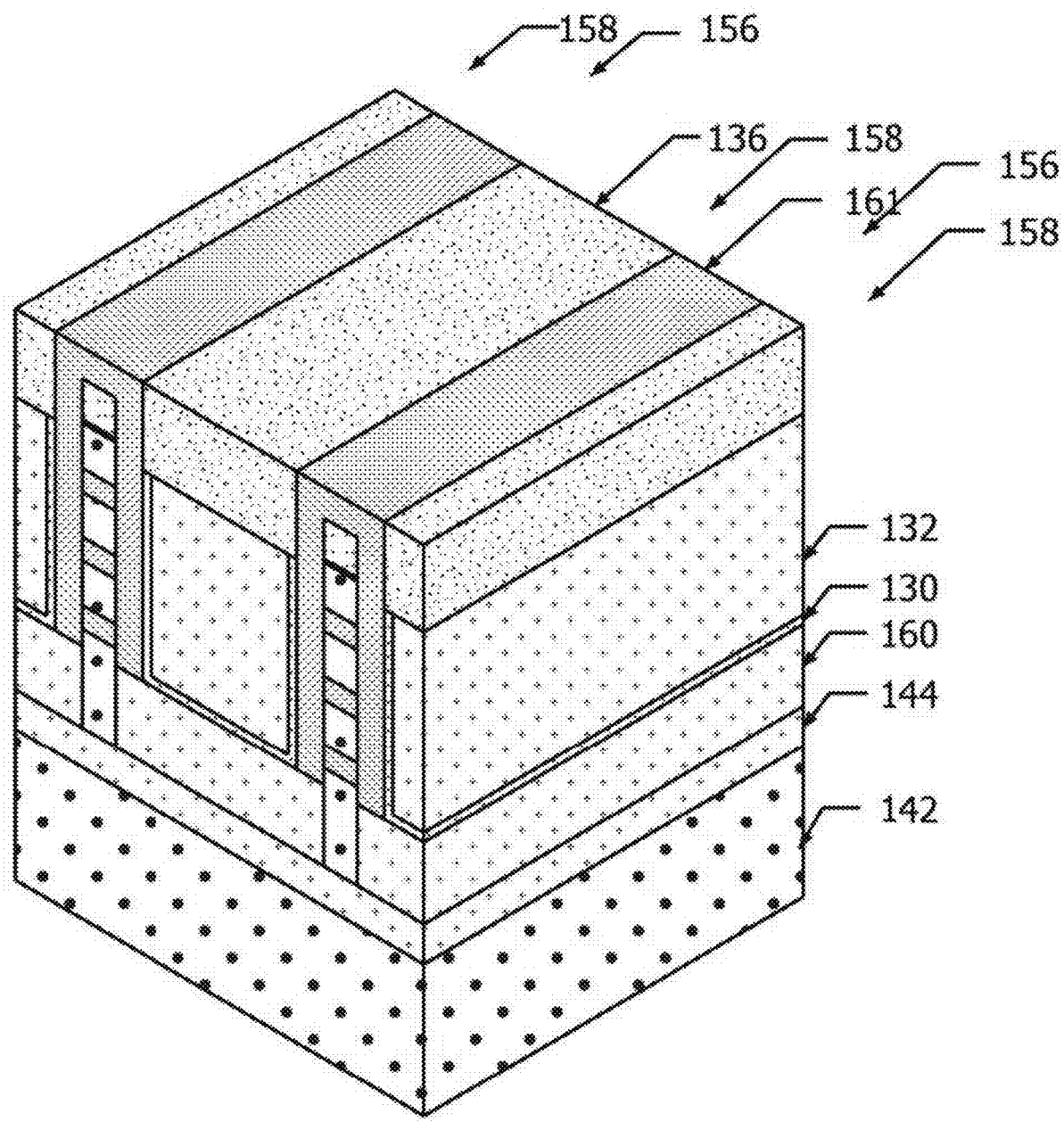

As shown in a perspective view of FIG. 11, in some embodiments, a middle isolation structure 132 is formed over the lower isolation structure 160 between the fin structures 156. A dielectric liner 130 may be formed between the middle isolation structure 132 and the lower isolation structure 160 along sidewalls of the cladding semiconductor layer 161 and the lower isolation structure 160. A hard mask 136 may then be formed on top of the middle isolation structure 132 and the dielectric liner 130. The middle isolation structure 132 and the dielectric liner 130 provide electrical insulation between the fin structures 156, and the hard mask 136 prevents loss of the middle isolation structure 132 during future patterning steps.

In some embodiments, the dielectric liner 130, the middle isolation structure 132, and the hard mask 136 are formed by deposition (e.g., PVD, CVD, PE-CVD, ALD, sputtering, etc.) and removal (e.g., etching, chemical mechanical planarization (CMP), etc.) processes. The middle isolation structure 132 may have a top surface below that of the fin structures 156. In some embodiments not shown in FIG. 11, the planarization process of the hard mask 136 may also remove the cladding semiconductor layer 161 from above the fin structures 156. The hard mask 136 may have a top surface coplanar with that of the fin structures 156. In some embodiments, the dielectric liner 130 and the middle isolation structure 132 and the lower isolation structures 160 may each comprise a low-κ dielectric material, wherein the dielectric constant is less than 7, such as, for example, silicon oxynitride, silicon carbon nitride, silicon oxygen carbide, silicon oxygen carbon nitride, silicon nitride, or some other suitable low-κ dielectric material. The dielectric liner 130 may comprise a different material than the middle isolation structure 132 for selective removal processes. The hard mask 136 may comprise a high-κ dielectric material, wherein the dielectric constant is greater than 7, such as, for example, hafnium oxide, zirconium oxide, hafnium aluminum oxide, hafnium silicon oxide, aluminum oxide, or some other suitable high-κ dielectric material.

Figure 12:
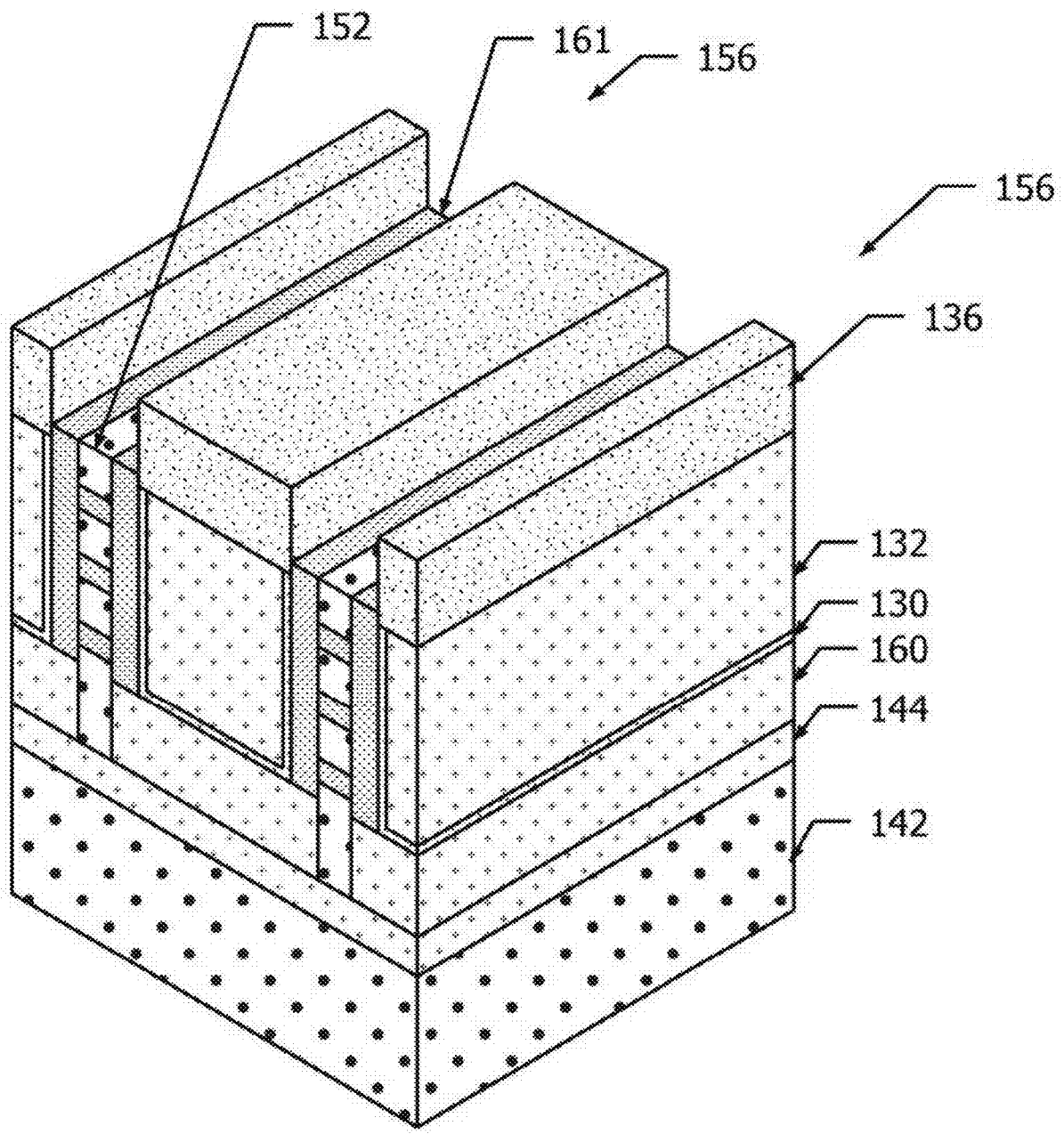

As shown in the perspective view of FIG. 12, in some embodiments, the hard mask 136 is selectively removed from top of the fin structures 156. Top surfaces of the first semiconductor layer 152 and the cladding semiconductor layer 161 may be exposed from the removal process. In some embodiments, the hard mask 136 is selectively etched by a dry etching process and/or a wet etching process, for example.

Figure 13:
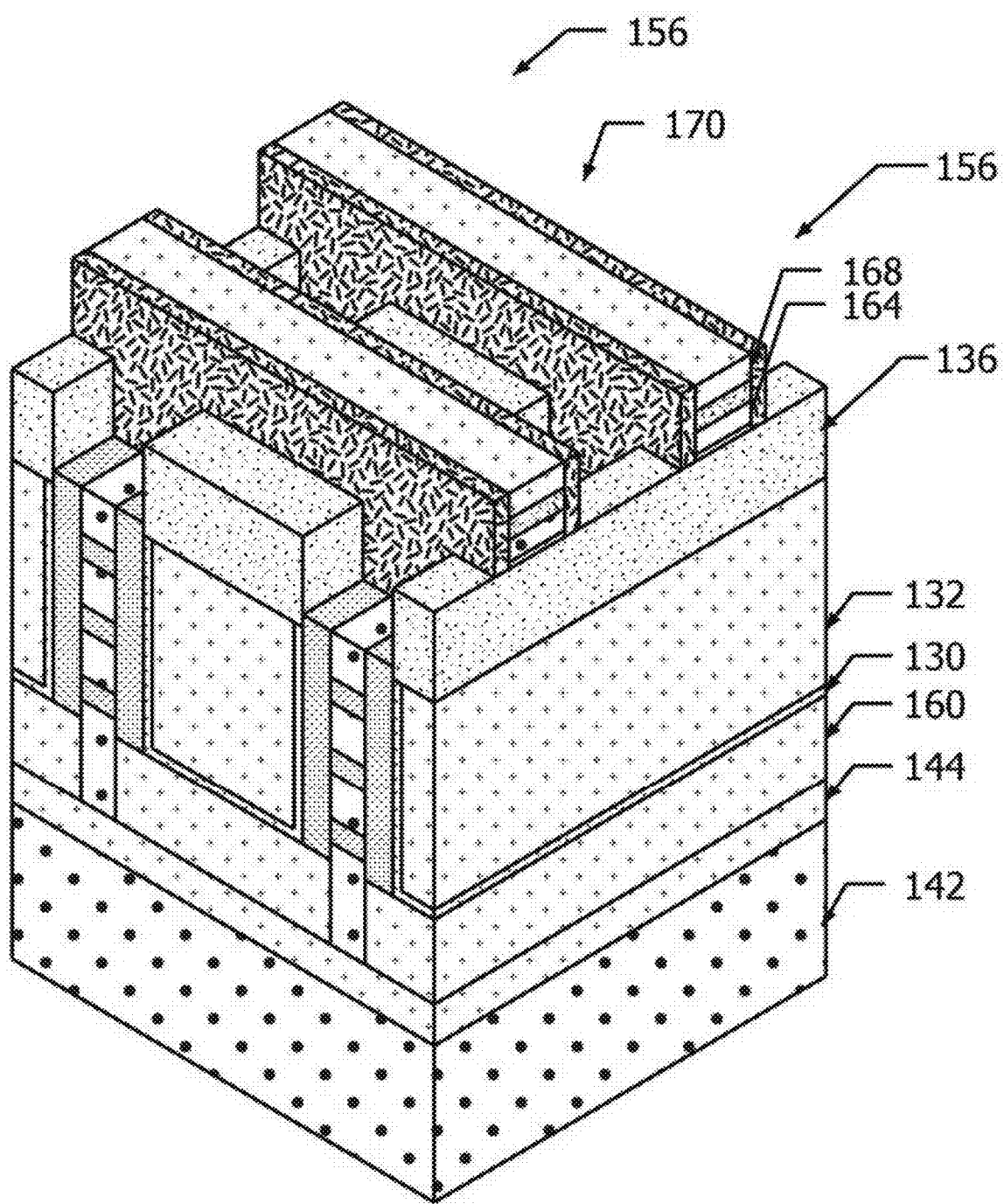

As shown in the perspective view of FIG. 13, in some embodiments, dummy gate structures 170 are formed over the fin structures 156 along the y-direction spaced apart from one another in the x-direction. In some embodiments, the dummy gate structures 170 may comprise a sacrificial gate dielectric layer 162, a sacrificial gate electrode layer 164, a pad layer 166, and a mask layer 168 one stacked over another in the order stated. Though two dummy gate structures 170 are shown in FIG. 13, but the number of the dummy gate structures 170 are not limited to, and may be more or fewer than two. In some embodiments, the sacrificial gate dielectric layer 162 may comprise, for example, a dielectric material such as a nitride (e.g., silicon nitride, silicon oxynitride), a carbide (e.g., silicon carbide), an oxide (e.g., silicon oxide), or some other suitable material. The sacrificial gate electrode layer 164 may comprise, for example, polysilicon. The pad layer 166 and the mask layer 168 may comprise thermal oxide, nitride, and/or other hard mask materials and are formed by way of photolithography processes.

Subsequently, gate spacers 134 are formed along opposite sidewalls of the dummy gate structures 170. For example, a blanket layer of an insulating material for sidewall spacers is conformally formed to cover the dummy gate structures 170 by using plasma enhanced chemical vapor deposition (PECVD), low-pressure chemical vapor deposition (LPCVD), sub-atmospheric chemical vapor deposition (SACVD), or the like. The blanket layer is deposited in a conformal manner so that it is formed to have substantially equal thicknesses on vertical surfaces, such as the sidewalls, horizontal surfaces, and the top of the dummy gate structures 170. In some embodiments, the insulating material of the blanket layer may comprise a silicon nitride-based material. The blanket layer is then etched using an anisotropic process to form the gate spacers 134 on opposite sidewalls of the dummy gate structures 170.

Figure 14A:
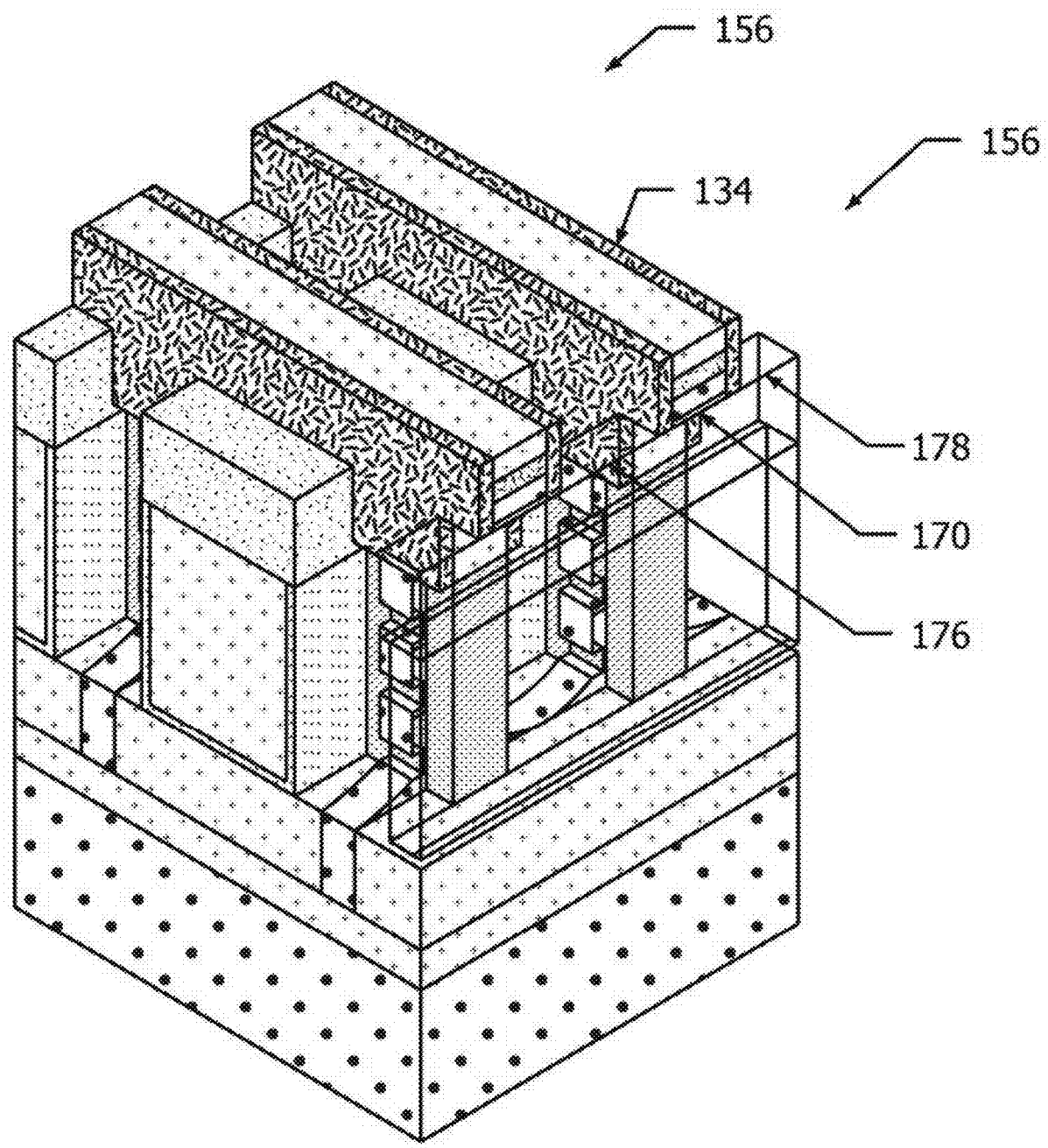
Figure 14B:
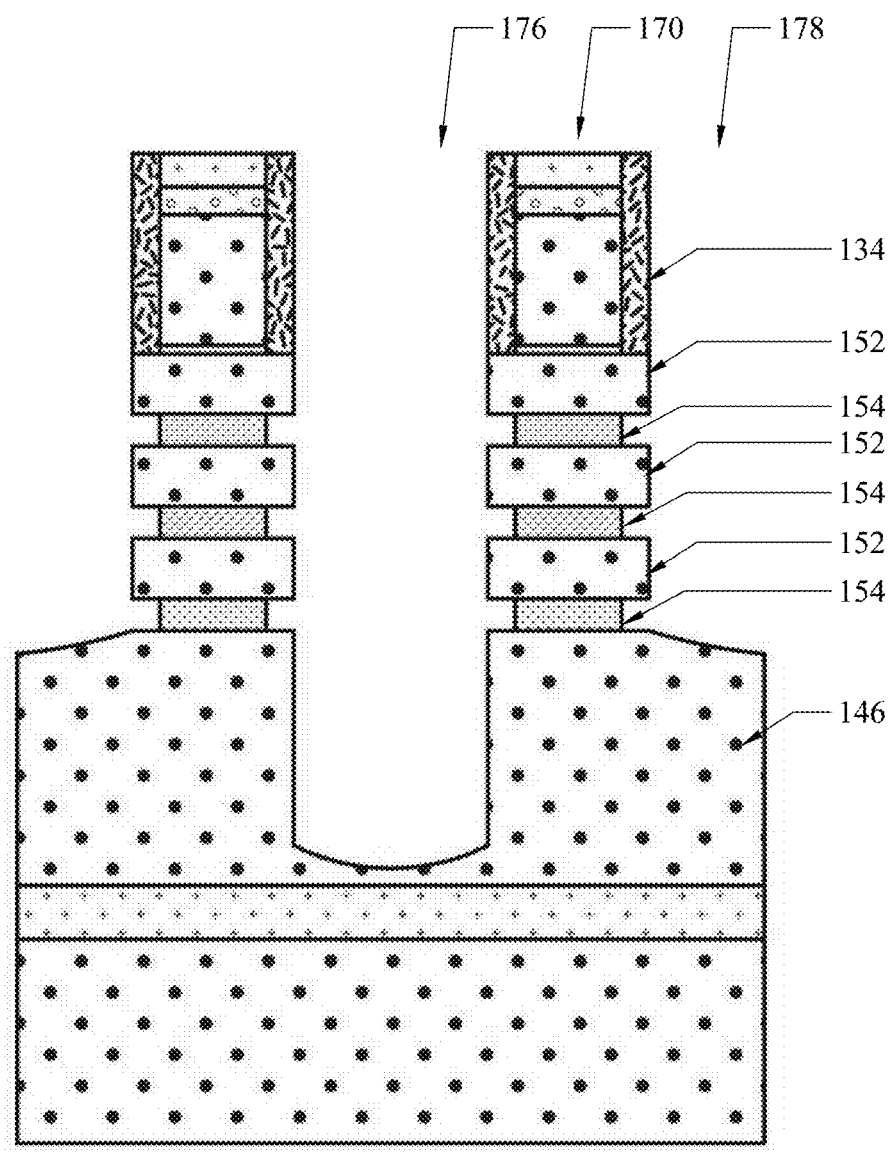
Figure 14C:
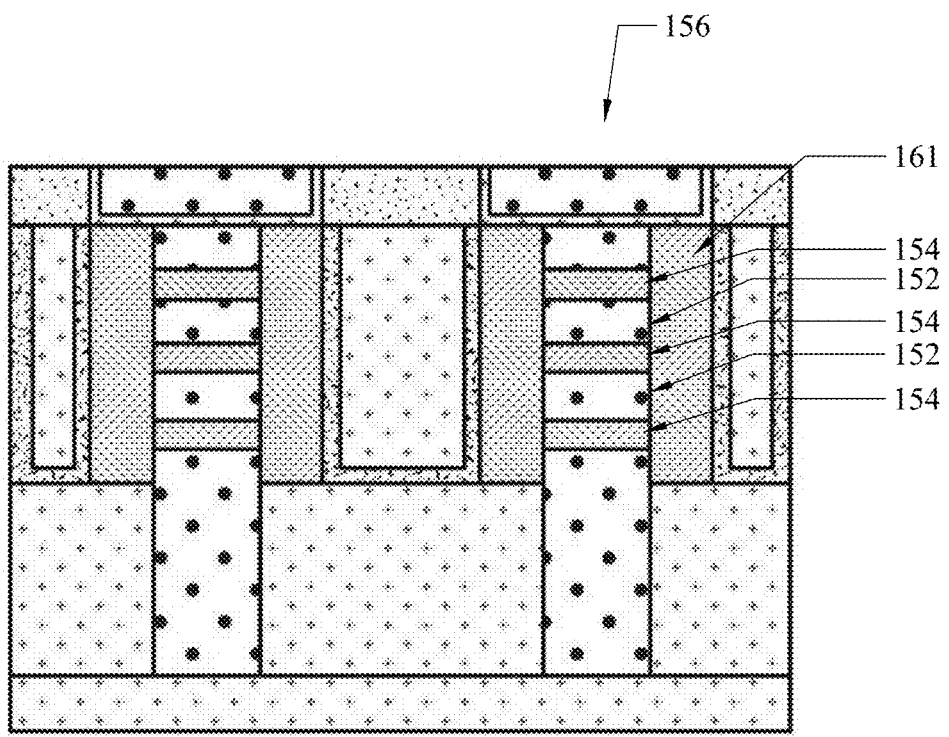
Figure 14D:
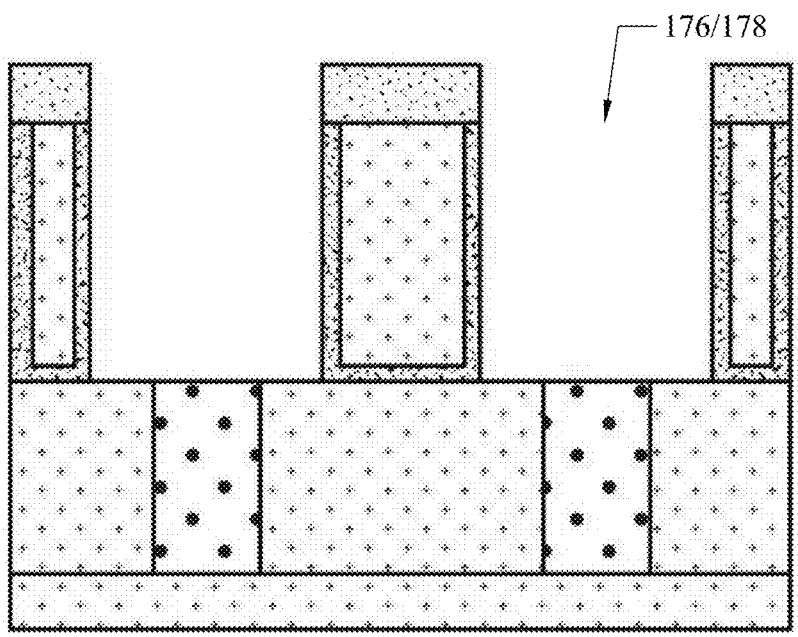

As shown in the perspective view of FIG. 14A, the x-direction cross-sectional view of FIG. 14B, the y-direction cross-sectional view of FIG. 14C in a gate region, and the y-direction cross-sectional view of FIG. 14D in a source region or a drain region, in some embodiments, a removal process is performed to remove fin structures 156 from a first source/drain region 176 and a second source/drain region 178 according to the dummy gate structures 170. As a result, the first semiconductor layers 152 and the second semiconductor layers 154 are shortened along x-direction and may be vertically aligned with the gate spacers 134. As an example, the exposed portions of the fin structures 156 are removed by using a strained source/drain (SSD) etching process. The SSD etching process may be performed in a variety of ways. In some embodiments, the SSD etching process may be performed by a dry chemical etch with a plasma source and a reaction gas. The plasma source may be an inductively coupled plasma (ICR) etch, a transformer coupled plasma (TCP) etch, an electron cyclotron resonance (ECR) etch, a reactive ion etch (RIE), or the like and the reaction gas may be a fluorine-based gas, chloride (Cl2), hydrogen bromide (HBr), oxygen (O2), the like, or combinations thereof. In some other embodiments, the SSD etching process may be performed by a wet chemical etch, such as ammonium peroxide mixture (APM), ammonium hydroxide (NH4OH), tetramethylammonium hydroxide (TMAH), combinations thereof, or the like. In yet some other embodiments, the SSD etch step may be performed by a combination of a dry chemical etch and a wet chemical etch. Further, in some embodiments, the removal process may also remove an upper portion of the semiconductor substrate layer 146 between the dummy gate structures 170 after removing the bottommost first semiconductor layer 152. The semiconductor substrate layer 146 or the bottommost first semiconductor layer 152 may have a concave top surface along the x-direction in the first source/drain region 176 and the second source/drain region 178. The top surface may be recessed between the lower isolation structure 160.

In addition, the removal process may also comprise an isotropic etchant to further remove ending portions of the second semiconductor layers 154 under the gate spacers 134 and/or the dummy gate structures 170. Thus, after the removal process, the first semiconductor layers 152 are wider than the second semiconductor layers 154 in the x-direction. The first semiconductor layers 152 may be formed as the channel structure of the transistor device after the removal process. It will be appreciated that the channel structure may exhibit stacked rectangle-like shapes as illustrated in the cross-sectional view of FIG. 14B and other figures, whereas in other embodiments, the channel structure may exhibit other shapes such as circles, octagons, ovals, diamonds, or the like.

Figure 15A:
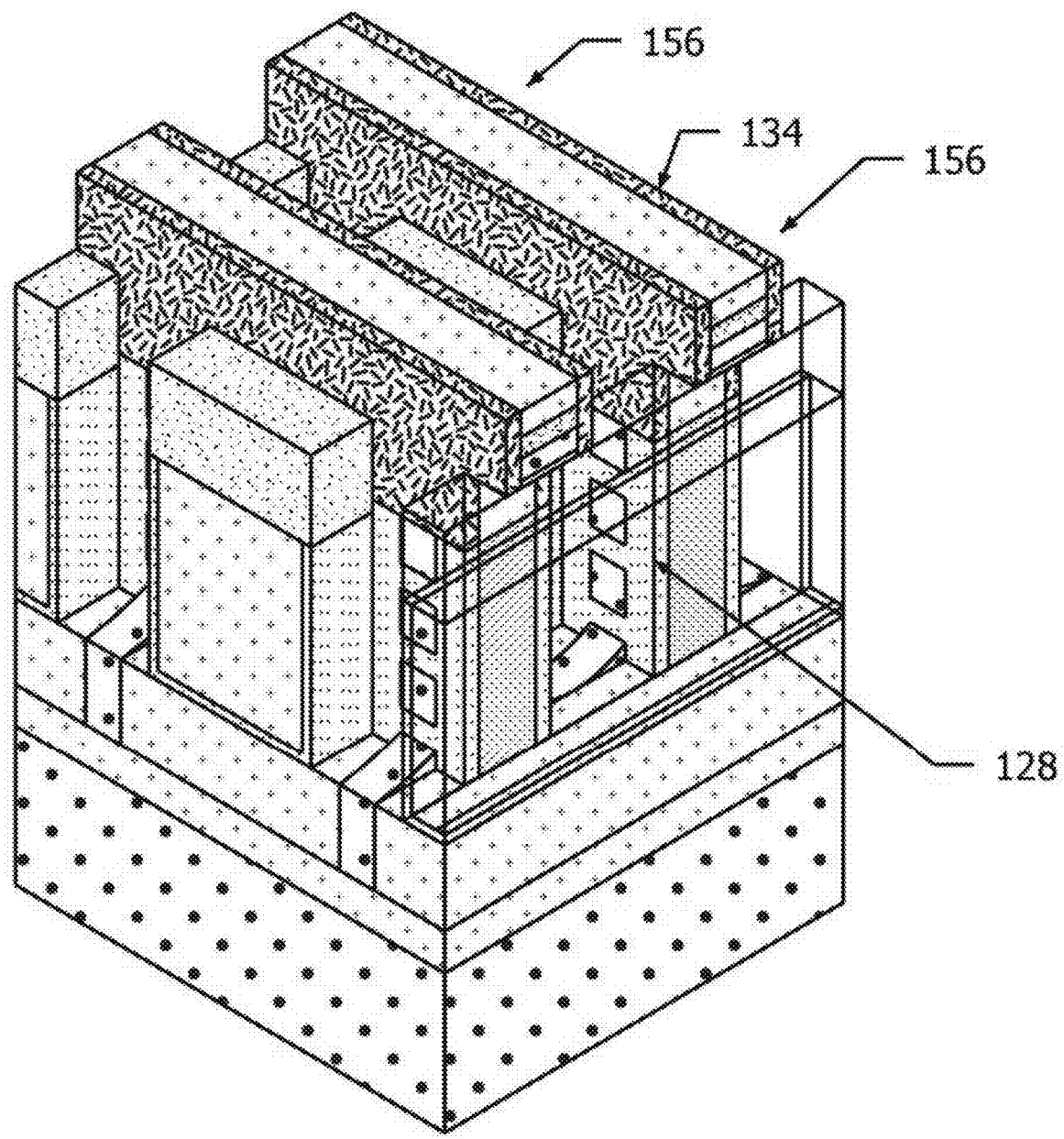
Figure 15B:
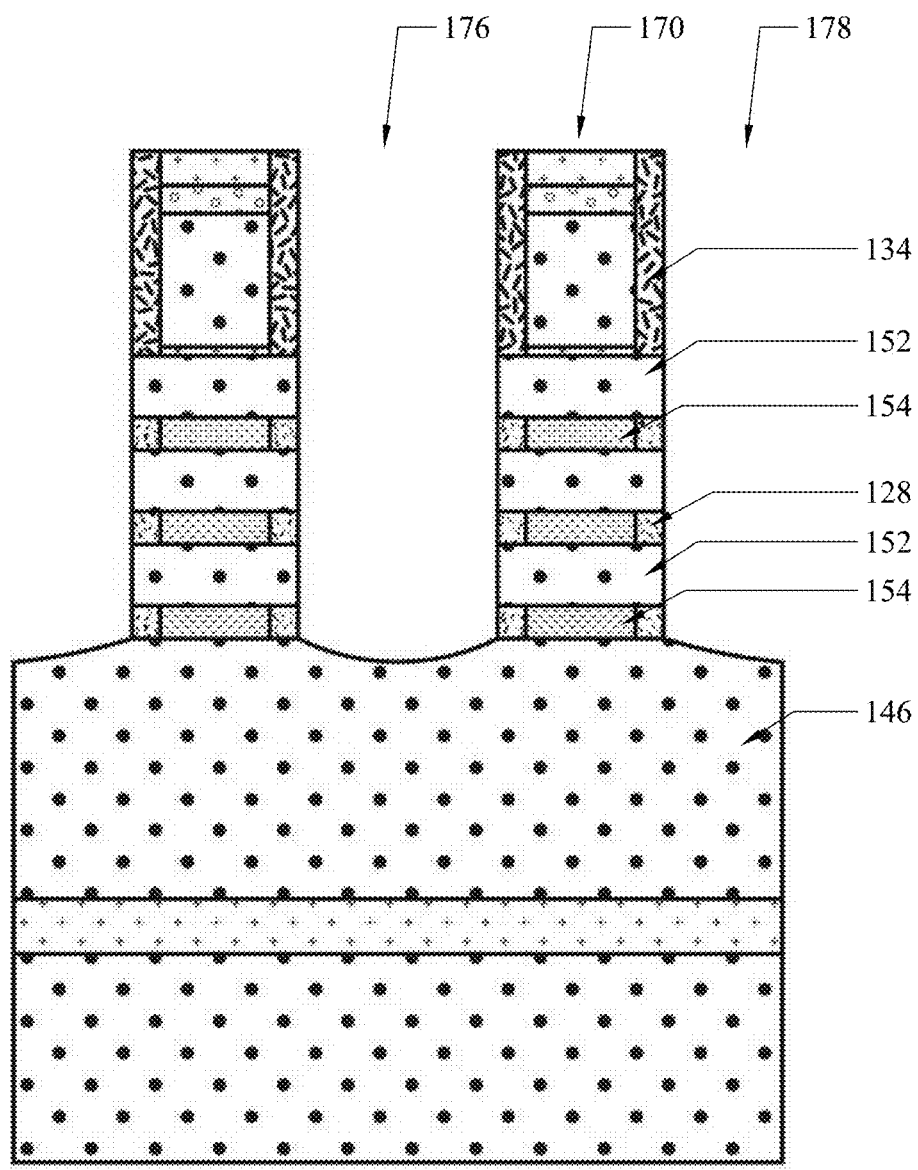

As shown in the perspective view of FIG. 15A and the x-direction cross-sectional view of FIG. 15B, in some embodiments, inner spacers 128 are formed on the endings of the second semiconductor layers 154 in the x-direction having outermost sidewalls. The outermost sidewalls of the inner spacers 128 may be substantial coplanar with outer surfaces of the first semiconductor layers 152 and/or the gate spacers 134. In some embodiments, the inner spacers 128 are formed by a deposition process (e.g., CVD, PVD, PE-CVD, ALD, sputtering, etc.), which may be followed by a selective removal process (e.g., etching). For example, in some embodiments, a continuous layer may first be formed along sidewalls and over the dummy gate structures 170. Then, a vertical etching process can be conducted to remove portions of the continuous layer not vertically covered by the gate spacers 134 to form the inner spacers 128. Further, in some embodiments, the inner spacers 128 comprise a low-κ dielectric material (i.e., dielectric constant less than 7) such as, for example, silicon oxynitride, silicon carbon nitride, silicon oxygen carbide, silicon oxygen carbon nitride, silicon nitride or some other suitable material.

Figure 16A:
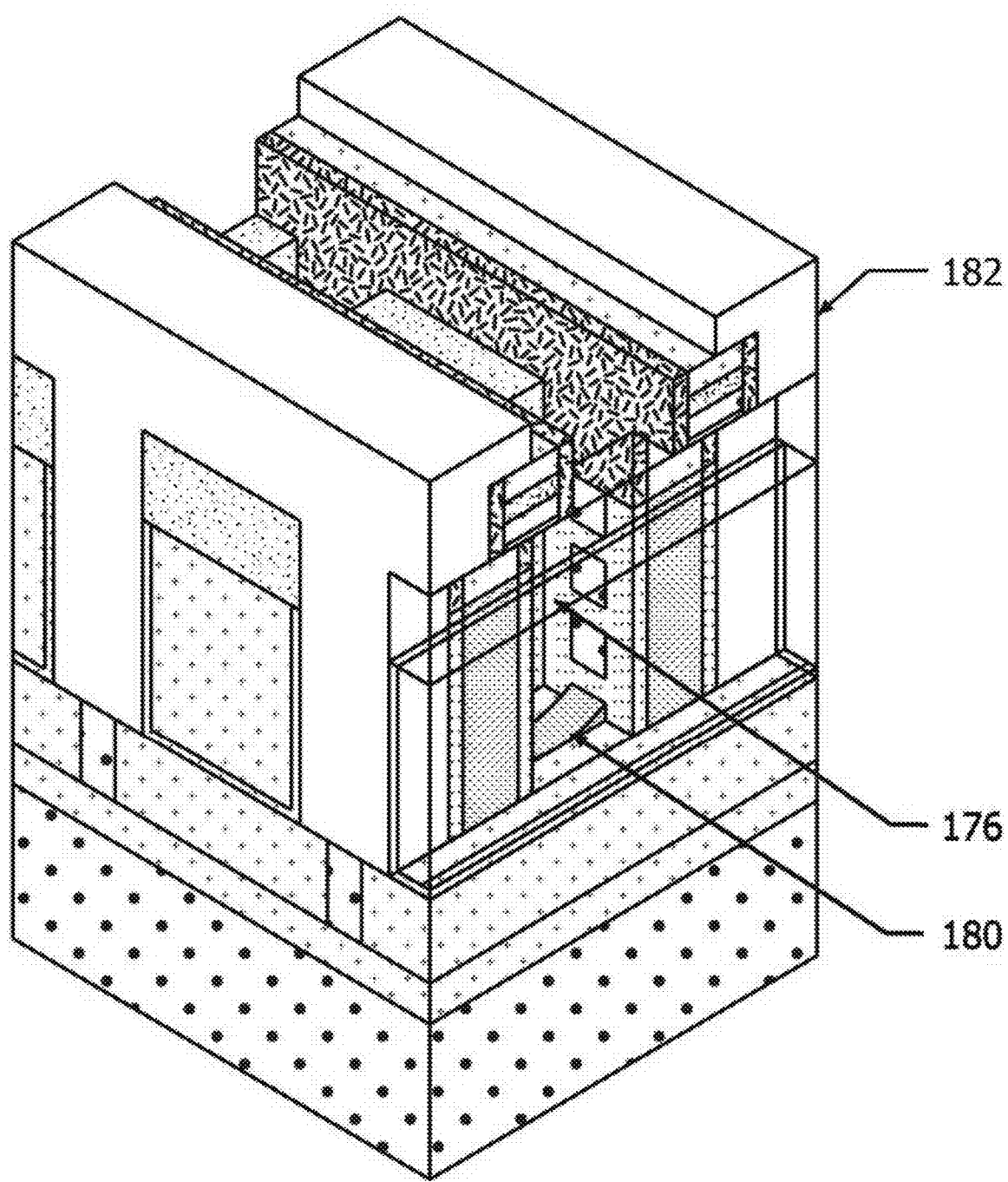
Figure 16B:
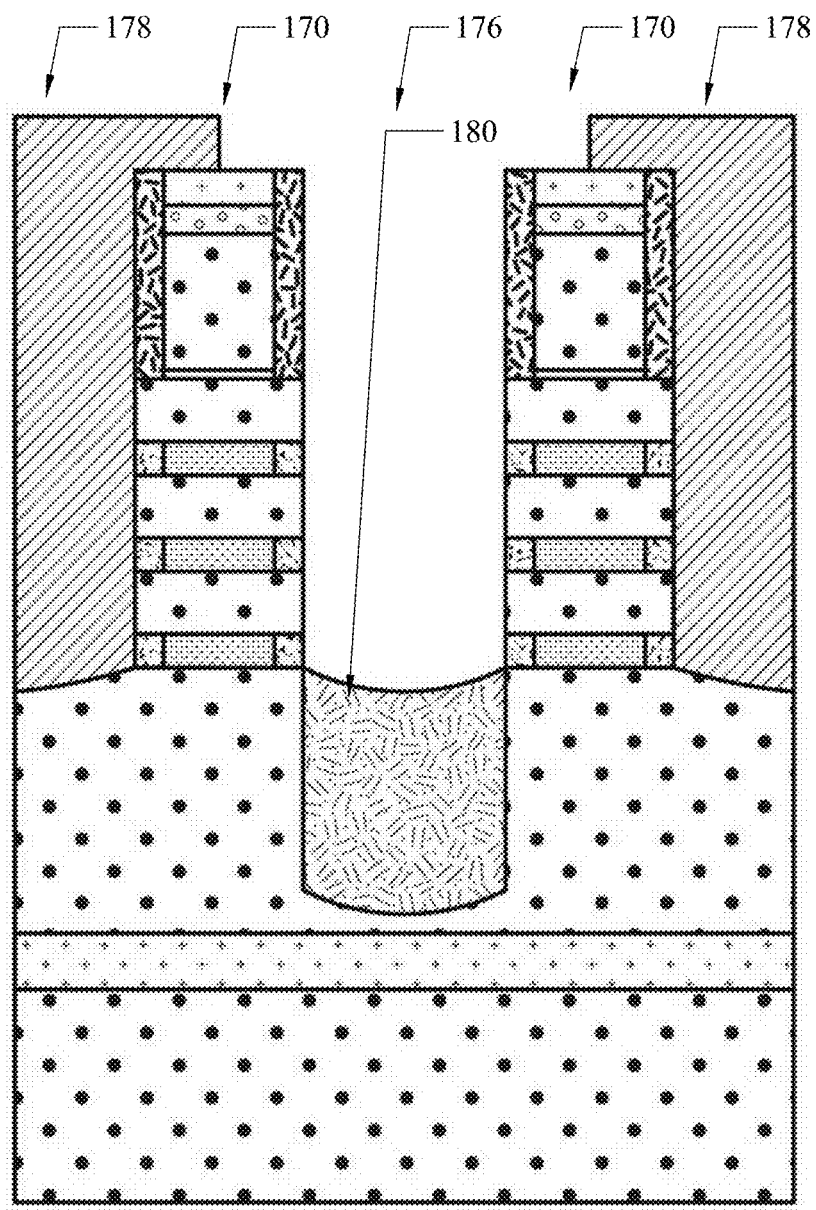
Figure 16C:
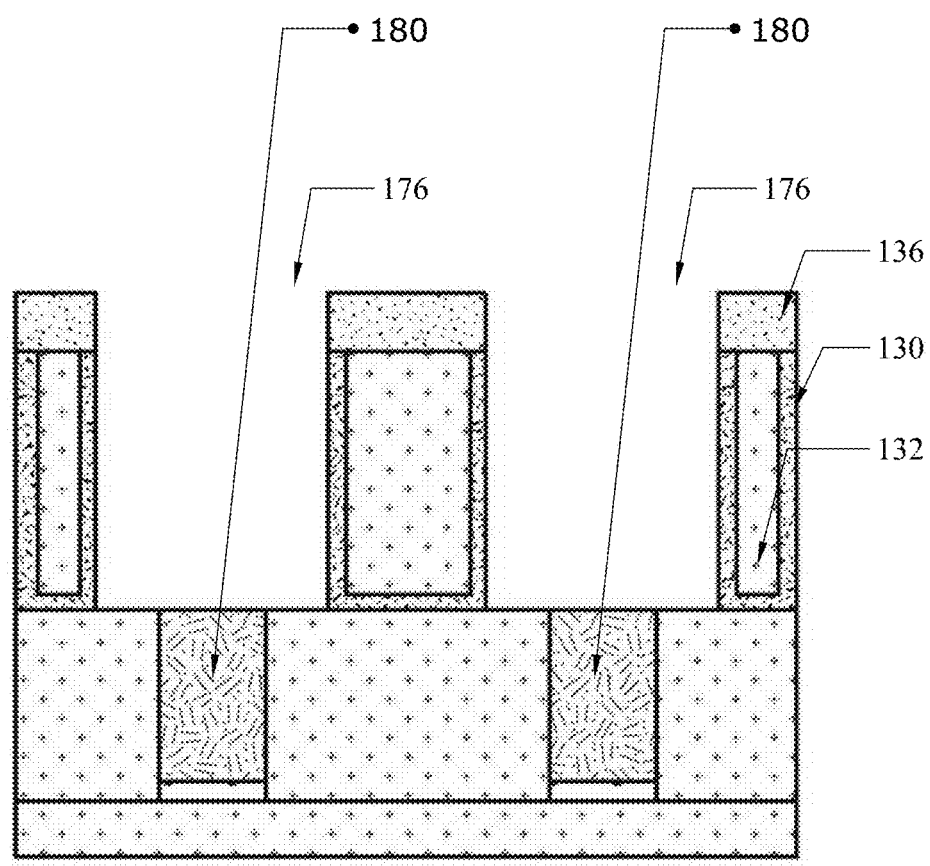

As shown in the perspective view of FIG. 16A, the x-direction cross-sectional view of FIG. 16B, and the y-direction cross-sectional view of FIG. 16C in the first source/drain region, in some embodiments, a first sacrificial source/drain contact 180 is formed under the first source/drain region 176 with a hard mask layer 182 covering the second source/drain region 178. In some embodiments, a trench is formed firstly by etching a portion of the first semiconductor layer 152 and/or the semiconductor substrate layer 146 directly under the first source/drain region 176. Then, a sacrificial material is filled in the trench to form the first sacrificial source/drain contact 180. In some embodiments, the first sacrificial source/drain contact 180 may comprise SiGe material having a germanium atomic percentage greater than zero. In some embodiments, the germanium percentage of the first sacrificial source/drain contact 180 is in a range between about 10 percent and about 50 percent. In some embodiments, the first sacrificial source/drain contact 180 comprises the same material as the second semiconductor layers 154. Further, in some embodiments, the first sacrificial source/drain contact 180 may be formed by an epitaxy growth process or a deposition process (e.g., PVD, CVD, PE-CVD, ALD, sputtering, etc.). By forming the trench and the first sacrificial source/drain contact 180 therein, a source/drain contact can be formed self-aligned later by replacing the first sacrificial source/drain contact 180, such that an overlay shift of contact landing is eliminated.

Figure 17A:
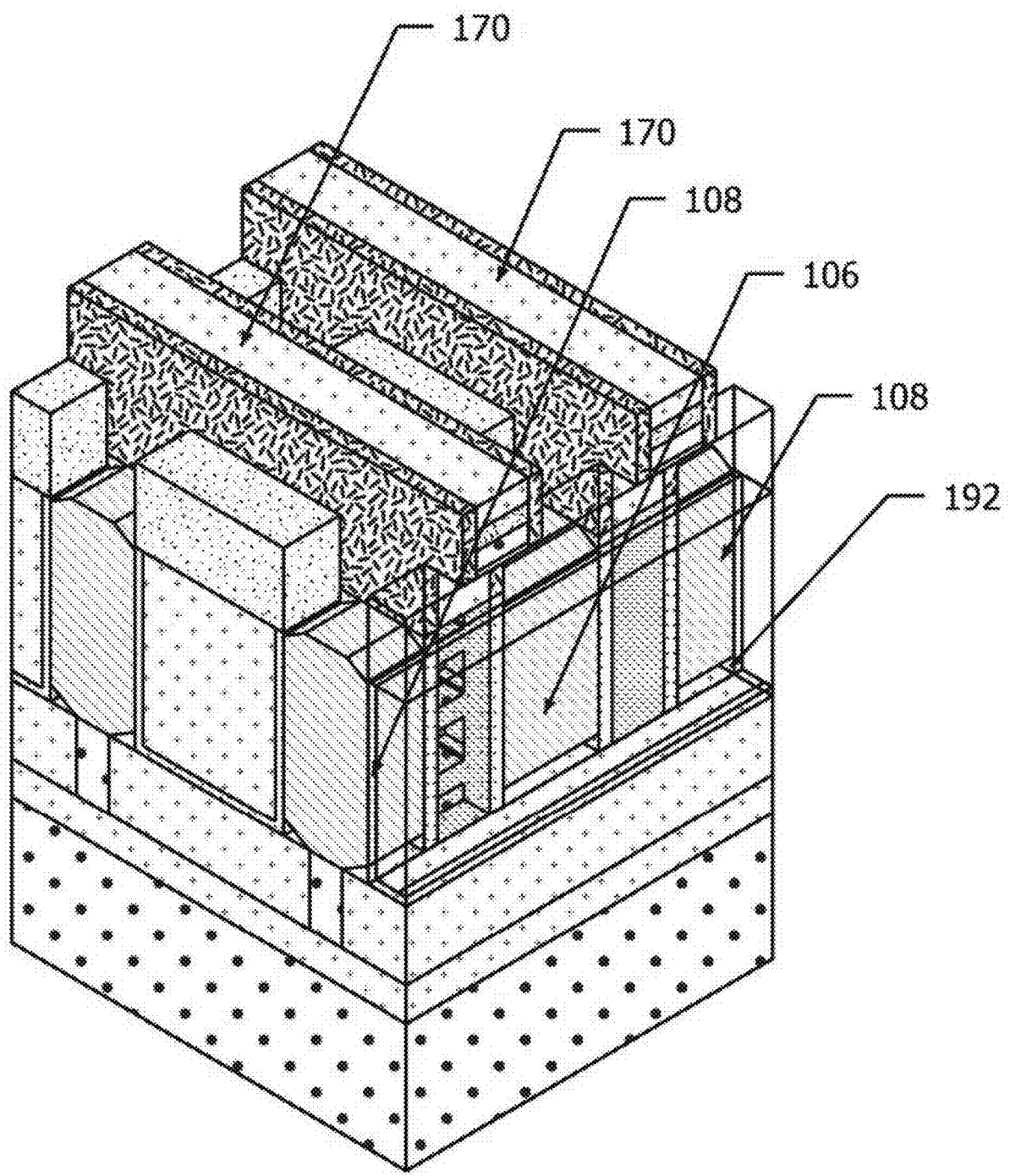
Figure 17B:
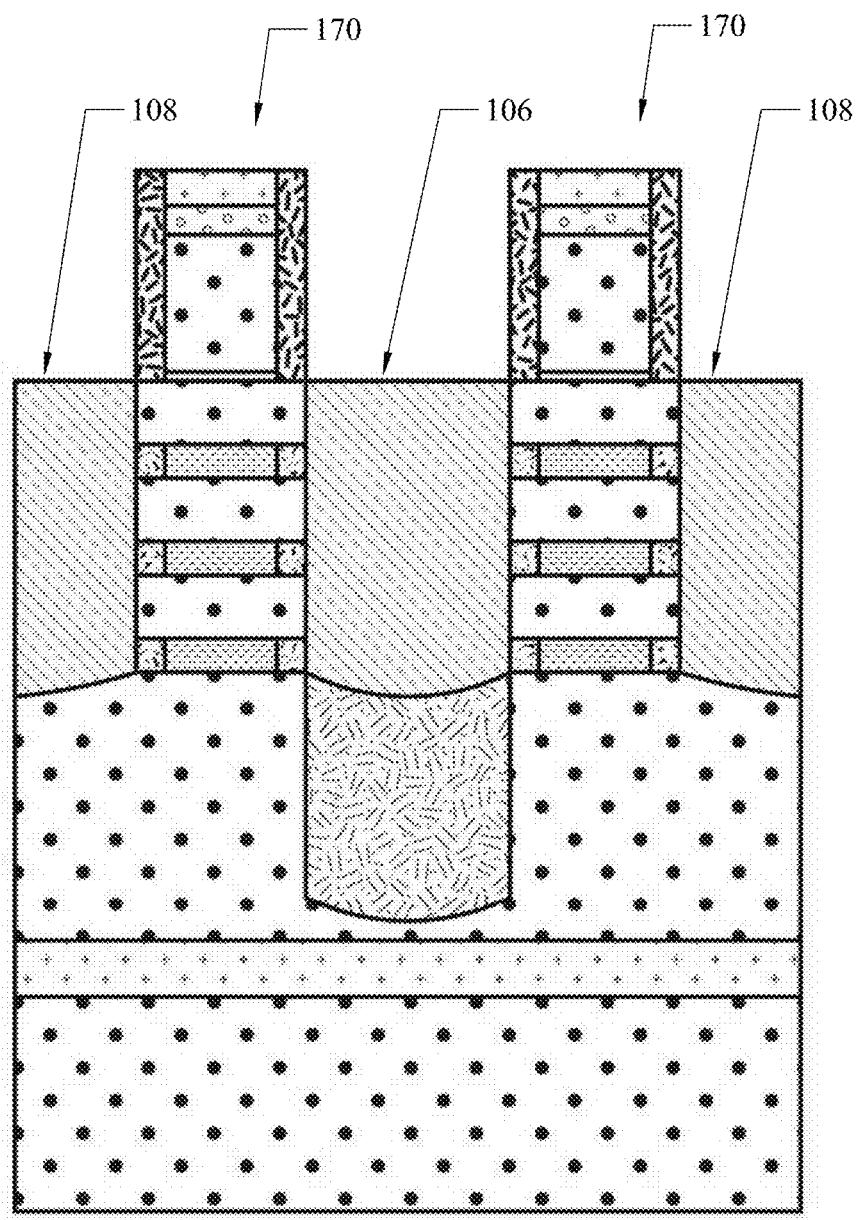
Figure 17C:
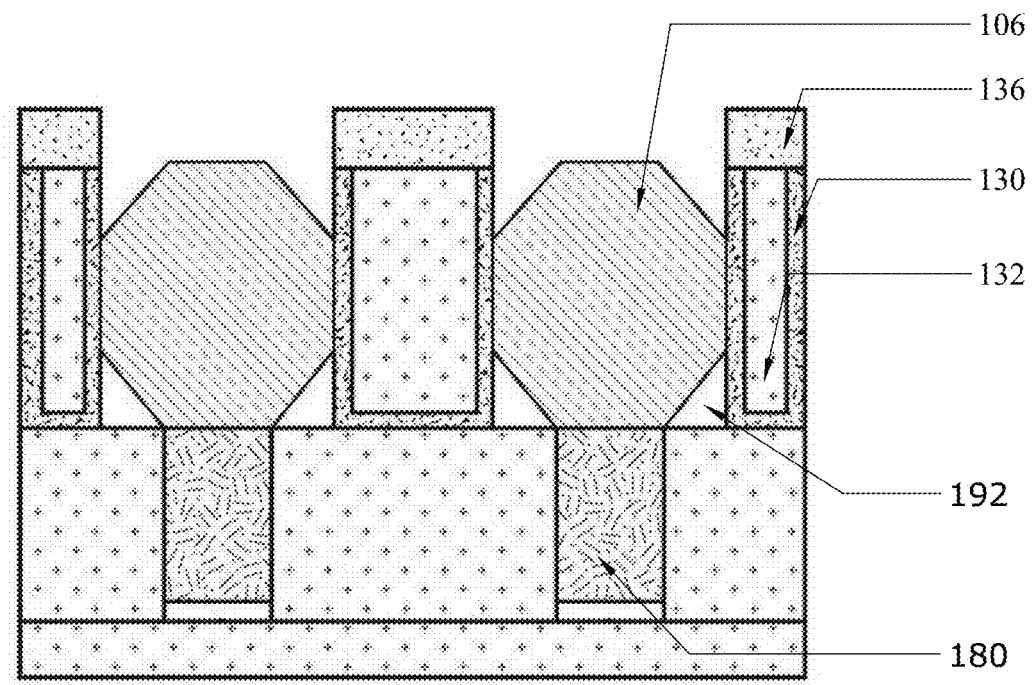
Figure 17D:
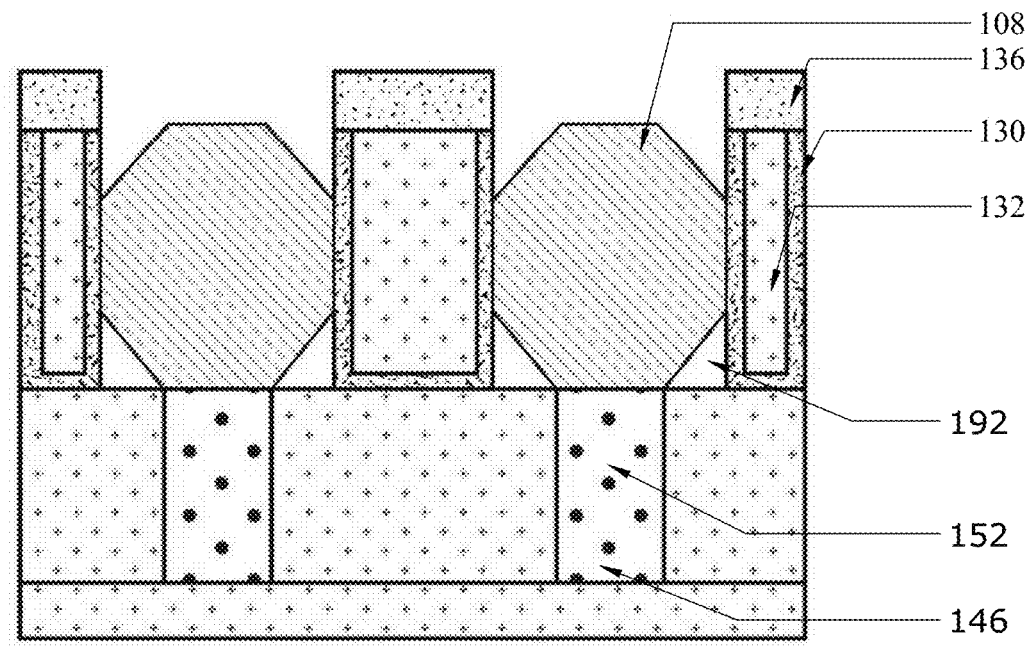

As shown in the perspective view of FIG. 17A, the x-direction cross-sectional view of FIG. 17B, the y-direction cross-sectional view of FIG. 17C in the first source/drain region, and the y-direction cross-sectional view of FIG. 17D in the second source/drain region, in some embodiments, a first source/drain epitaxial structure 106 and a second source/drain epitaxial structure 108 are formed on opposite sides of the dummy gate structure 170 (See FIG. 17B). In some embodiments, the first and second source/drain epitaxial structures 106, 108 may directly contact endings of the first semiconductor layer 152. The first source/drain epitaxial structure 106 may be formed on the first sacrificial source/drain contact 180 (See FIG. 17C). The second source/drain epitaxial structure 108 may be formed on the bottommost first semiconductor layer 152 or the semiconductor substrate layer 146 (See FIG. 17D). The first and second source/drain epitaxial structures 106, 108 may respectively be a source and a drain of the semiconductor transistor device. In some embodiments, the first and second source/drain epitaxial structures 106, 108 comprise a semiconductor material. For example, the first and second source/drain epitaxial structures 106, 108 may comprise silicon, germanium, or silicon germanium. In some embodiments, the first and second source/drain epitaxial structures 106, 108 are formed by way of an epitaxy growth process. The first and second source/drain epitaxial structures 106, 108 may be hexagonal or diamond-like shapes. Air gaps 192 may be formed surrounding lower portions of the first source/drain epitaxial structure 106 and the second source/drain epitaxial structure 108.

Figure 18A:
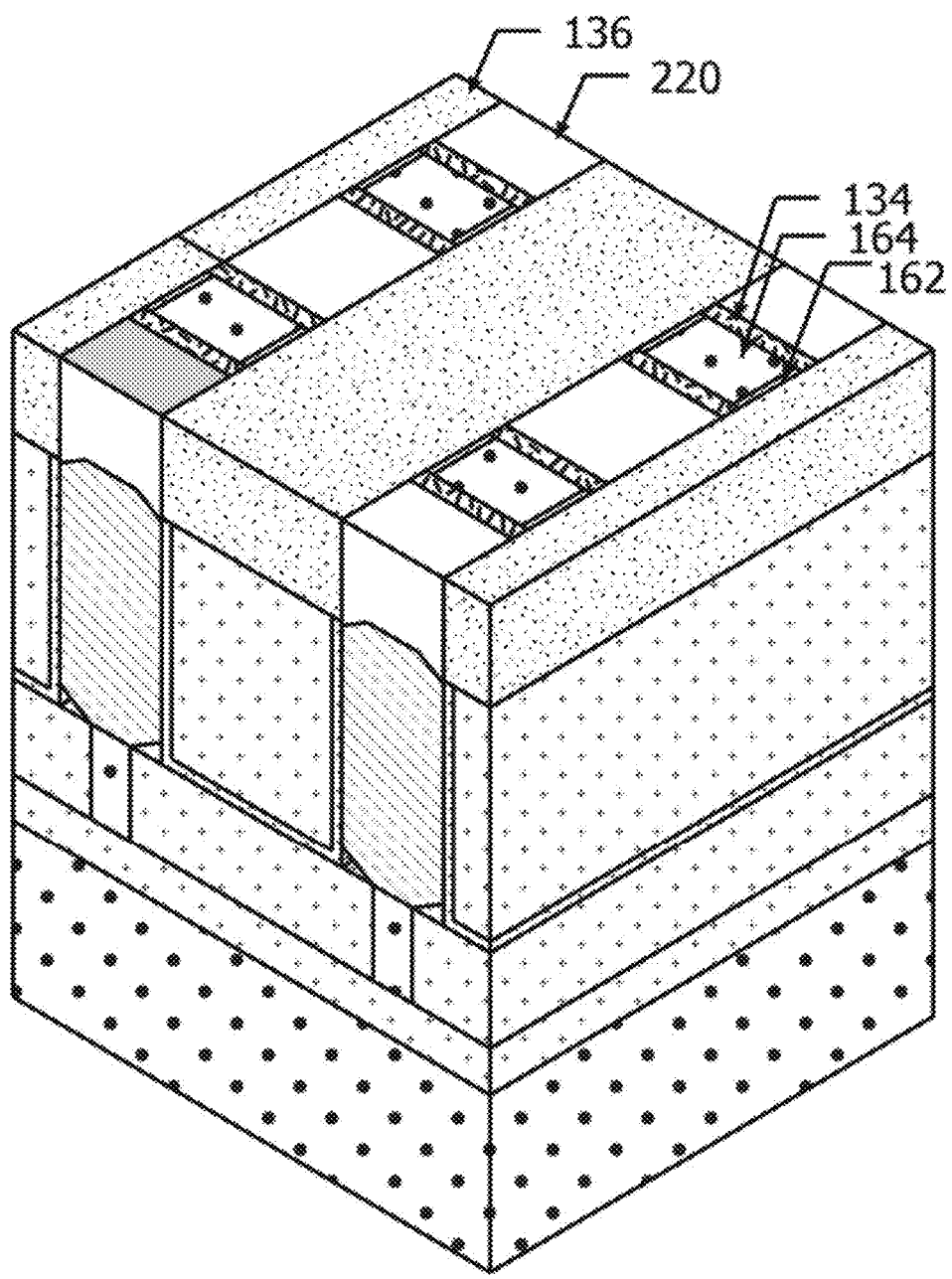
Figure 18B:
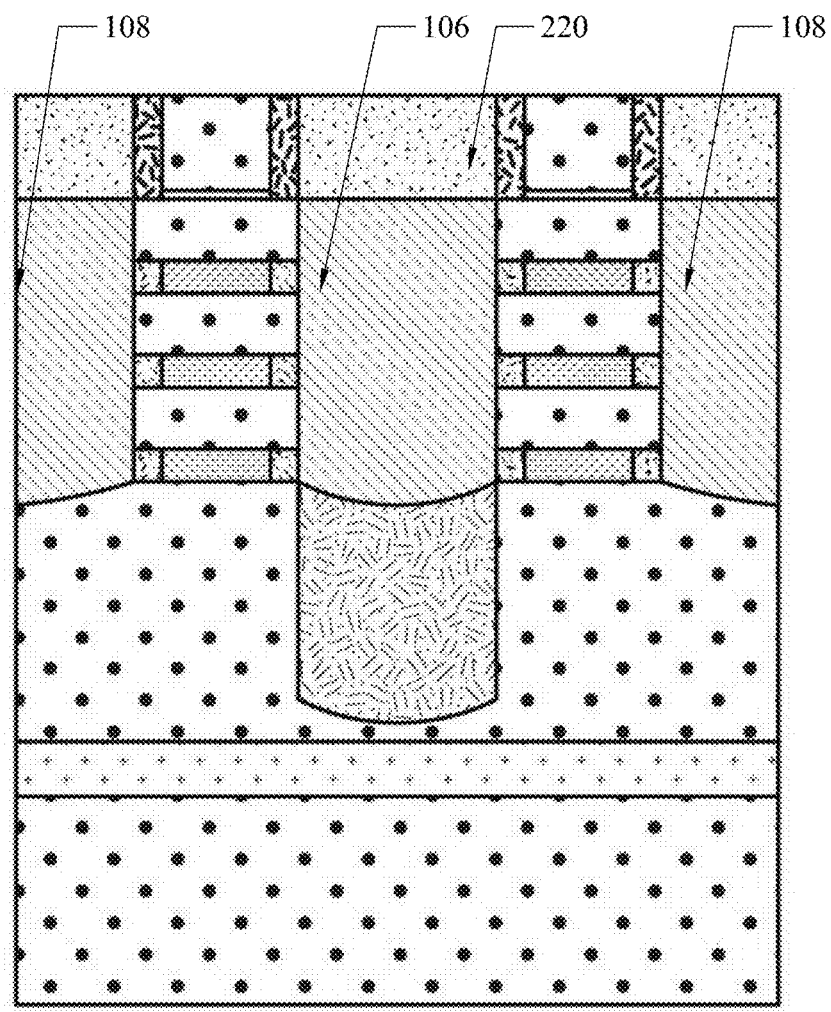
Figure 18C:
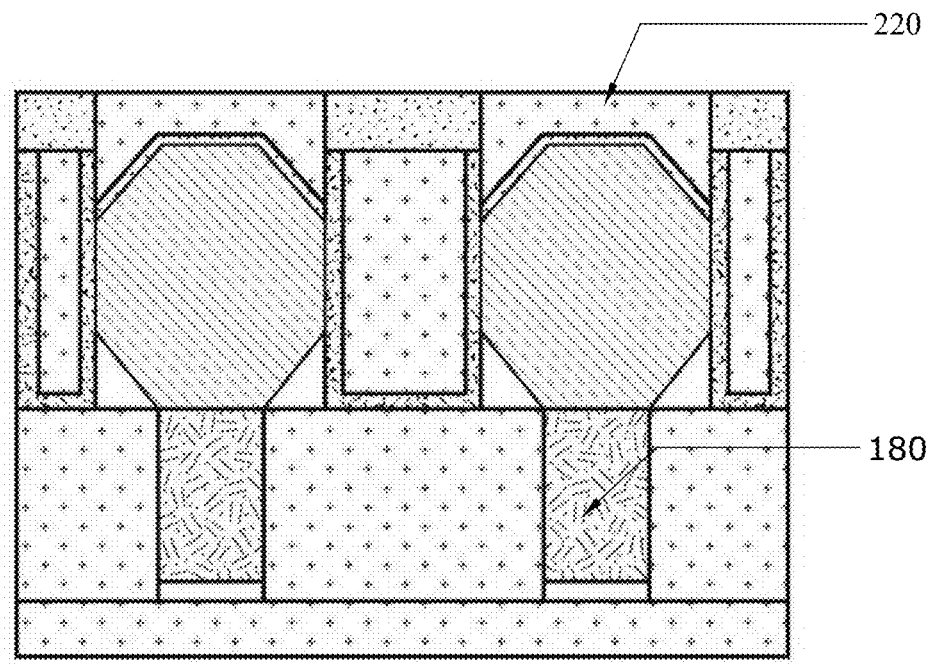
Figure 18D:
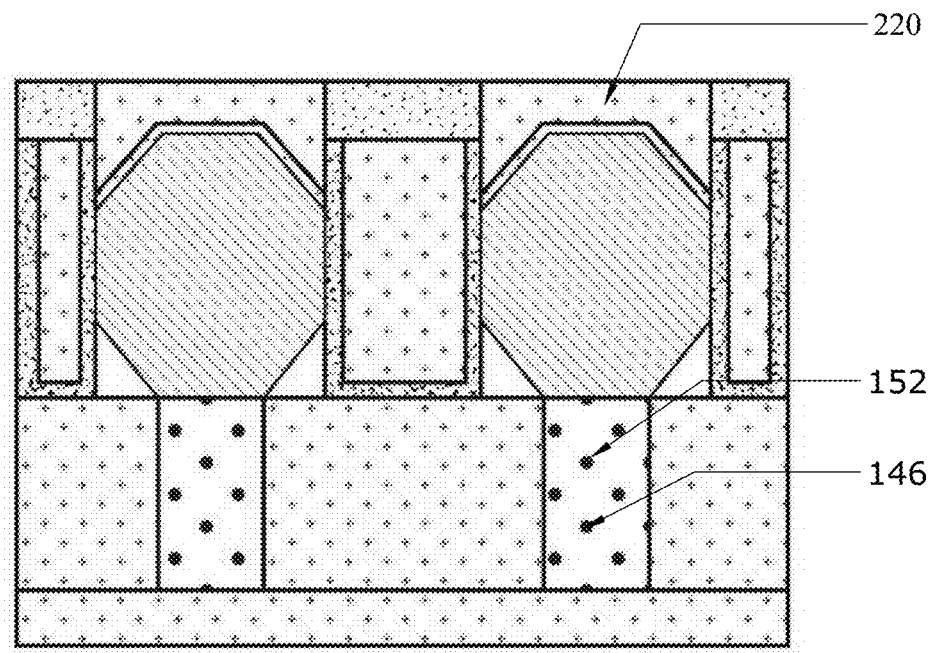

As shown in the perspective view of FIG. 18A, the x-direction cross-sectional view of FIG. 18B, the y-direction cross-sectional view of FIG. 18C in the first source/drain region, and the y-direction cross-sectional view of FIG. 18D in the second source/drain region, in some embodiments, an upper isolation structure 220 is formed over the structure previously formed covering the first and second source/drain epitaxial structures 106, 108. A planarization process is subsequently performed to lower the gate spacers 134 and expose the sacrificial gate dielectric layer 162 and the sacrificial gate electrode layer 164 on a same horizontal plane. Though not shown in the figure, an etch stop liner may be conformally formed lining the structure previously formed prior to forming the upper isolation structure 220. The etch stop liner may have a tensile stress and may be formed of Si3N4. In some other embodiments, the etch stop liner includes materials such as oxynitrides. In yet some other embodiments, the etch stop liner may have a composite structure including a plurality of layers, such as a silicon nitride layer overlying a silicon oxide layer. The etch stop liner can be formed using plasma enhanced CVD (PECVD), however, other suitable methods, such as low pressure CVD (LPCVD), atomic layer deposition (ALD), and the like, can also be used. The upper isolation structure 220 may be formed by chemical vapor deposition (CVD), high-density plasma CVD, spin-on, sputtering, or other suitable methods. In some embodiments, the upper isolation structure 220 includes silicon oxide. In some other embodiments, the upper isolation structure 220 may include silicon oxynitride, silicon nitride, compounds including Si, O, C and/or H (e.g., silicon oxide, SiCOH and SiOC), a low-κ material, or organic materials (e.g., polymers). The planarization operation may comprise a chemical-mechanical process (CMP).

Figure 19A:
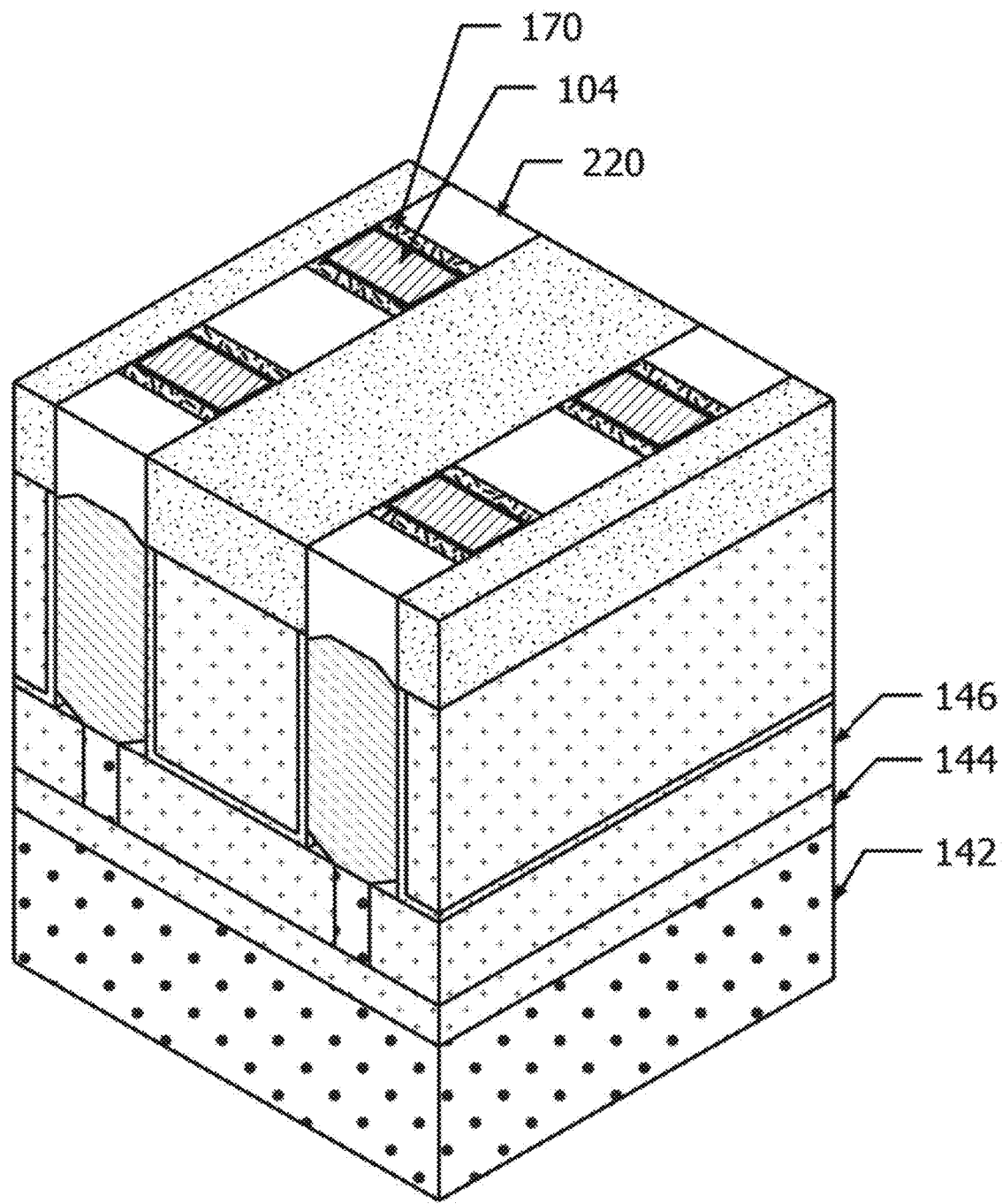
Figure 19B:
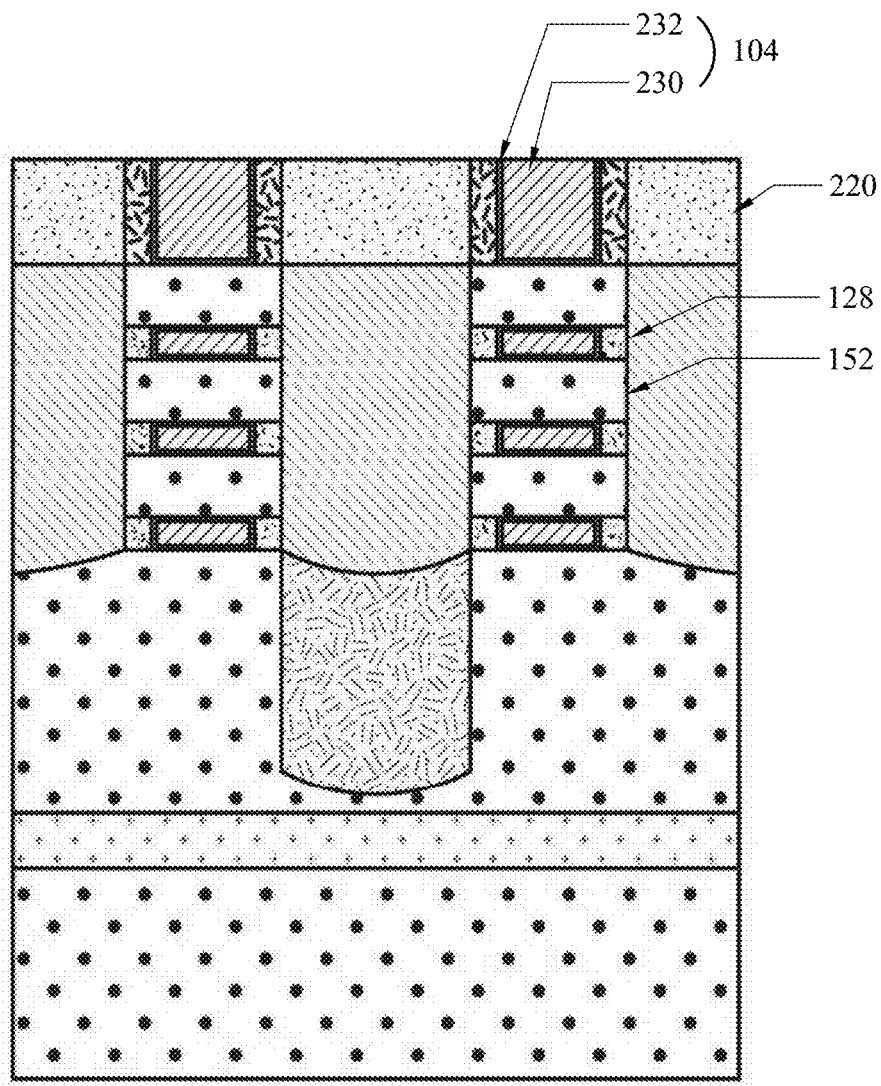
Figure 19C:
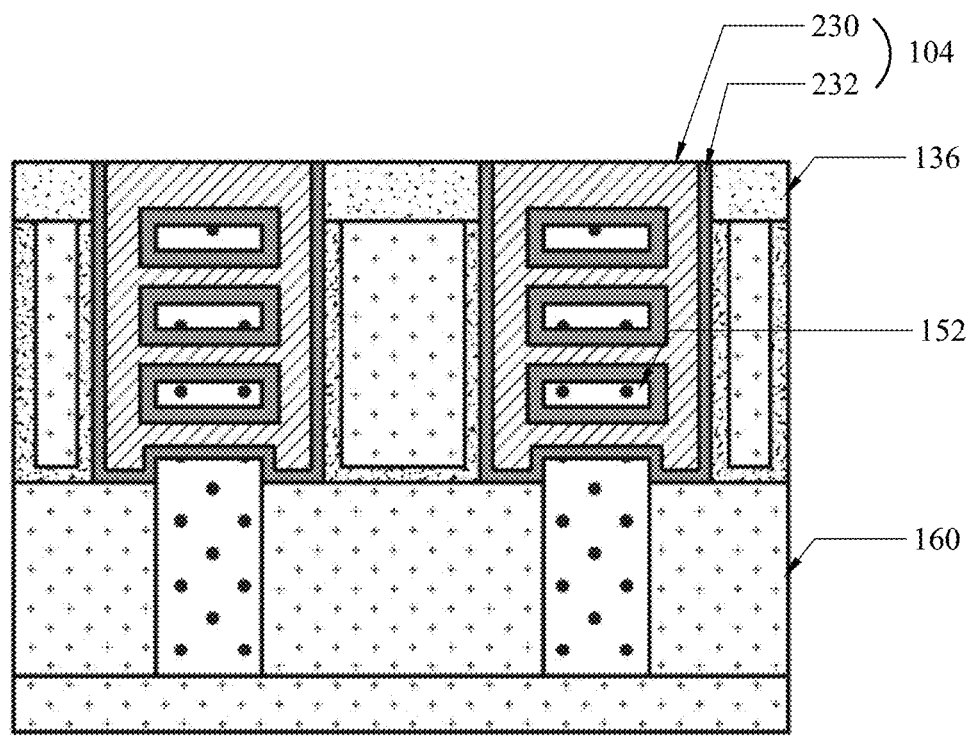

As shown in the perspective view of FIG. 19A, the x-direction cross-sectional view of FIG. 19B, the y-direction cross-sectional view of FIG. 19C in the gate region, in some embodiments, a replacement gate process is performed to form a gate structure 104. The sacrificial gate dielectric layer 162 and the sacrificial gate electrode layer 164 are removed, thereby exposing the first and second semiconductor layers 152, 154. The upper isolation structure 220 protects the first and second source/drain epitaxial structures 106, 108 during the removal of the sacrificial gate dielectric layer 162 and the sacrificial gate electrode layer 164. The sacrificial gate electrode layer 164 can be removed using plasma dry etching and/or wet etching. When the sacrificial gate electrode layer 164 is polysilicon and the upper isolation structure 220 is silicon oxide, a wet etchant such as a TMAH solution can be used to selectively remove the sacrificial gate electrode layer 164. The sacrificial gate electrode layer 164 can be removed using plasma dry etching and/or wet etching. Subsequently, the sacrificial gate dielectric layer 162 is removed as well. As such, the first and second semiconductor layers 152, 154 are exposed.

The second semiconductor layers 154 and the cladding semiconductor layer 161 (see FIG. 14C) are then removed or etched using an etchant that can selectively etch the second semiconductor layers 154 and the cladding semiconductor layer 161 at a faster etching rate than etching the first semiconductor layers 152. The inner spacers 128 protect the first and second source/drain epitaxial structures 106, 108 from the etchant used in etching the second semiconductor layers 154 and the cladding semiconductor layer 161 since the inner spacers 128 is made of a material that has etching selectivity to that of the second semiconductor layers 154 and the cladding semiconductor layer 161.

A gate structure 104 is then formed and/or filled between the gate spacers 134 and the inner spacers 128. That is, the gate structure 104 encircles (or surrounds or wraps) the first semiconductor layers 152, in which the first semiconductor layers 152 are referred to as channels of the semiconductor transistor device. The gate spacers 134 are disposed on opposite sides of the gate structure 104. The gate structure 104 includes a gate dielectric layer 232 and a gate electrode 230. The gate electrode 230 includes one or more work function metal layer (s) and a filling metal. The gate dielectric layer 232 may be conformally formed. That is, the gate dielectric layer 232 is in contact with the lower isolation structure 160 and the first semiconductor layers 152. In some embodiments, the gate dielectric layer 232 includes a high-κ material (κ is greater than 7) such as hafnium oxide (HfO2), zirconium oxide (ZrO2), lanthanum oxide (La2O3), hafnium aluminum oxide (HfAlO2), hafnium silicon oxide (HfSiO2), aluminum oxide (Al2O3), or other suitable materials. In some embodiments, the gate dielectric layer 232 may be formed by performing an ALD process or other suitable process.

The work function metal layer of the gate electrode 230 is formed on the gate dielectric layer 232, and the work function metal layer surrounds the first semiconductor layers 152 in some embodiments. The work function metal layer may include materials such as titanium nitride (TiN), tantalum (TaN), titanium aluminum silicon (TiAlSi), titanium silicon nitride (TiSiN), titanium aluminum (TiAl), tantalum aluminum (TaAl), or other suitable materials. In some embodiments, the work function metal layer may be formed by performing an ALD process or other suitable process. The filling metal of the gate electrode 230 fills the remained space between the gate spacers 134 and between the inner spacers 128. That is, the work function metal layer(s) is in contact with and between the gate dielectric layer 232 and the filling metal. The filling metal may include material such as tungsten or aluminum. After the deposition of the gate dielectric layer 232 and the gate electrode 230, a planarization process, such as a CMP process, may be then performed to remove excess portions of the gate dielectric layer 232 and the gate electrode 230 to form the gate structure 104.

In some embodiments, an interfacial layer (not shown) is optionally formed prior to forming the gate structure 104 to surround exposed surfaces of the first semiconductor layers 152 and exposed surfaces of the semiconductor substrate layer 146. In various embodiments, the interfacial layer may include a dielectric material such as silicon oxide (SiO2) or silicon oxynitride (SiON), and may be formed by chemical oxidation, thermal oxidation, atomic layer deposition (ALD), chemical vapor deposition (CVD), and/or other suitable methods.

Figure 20:
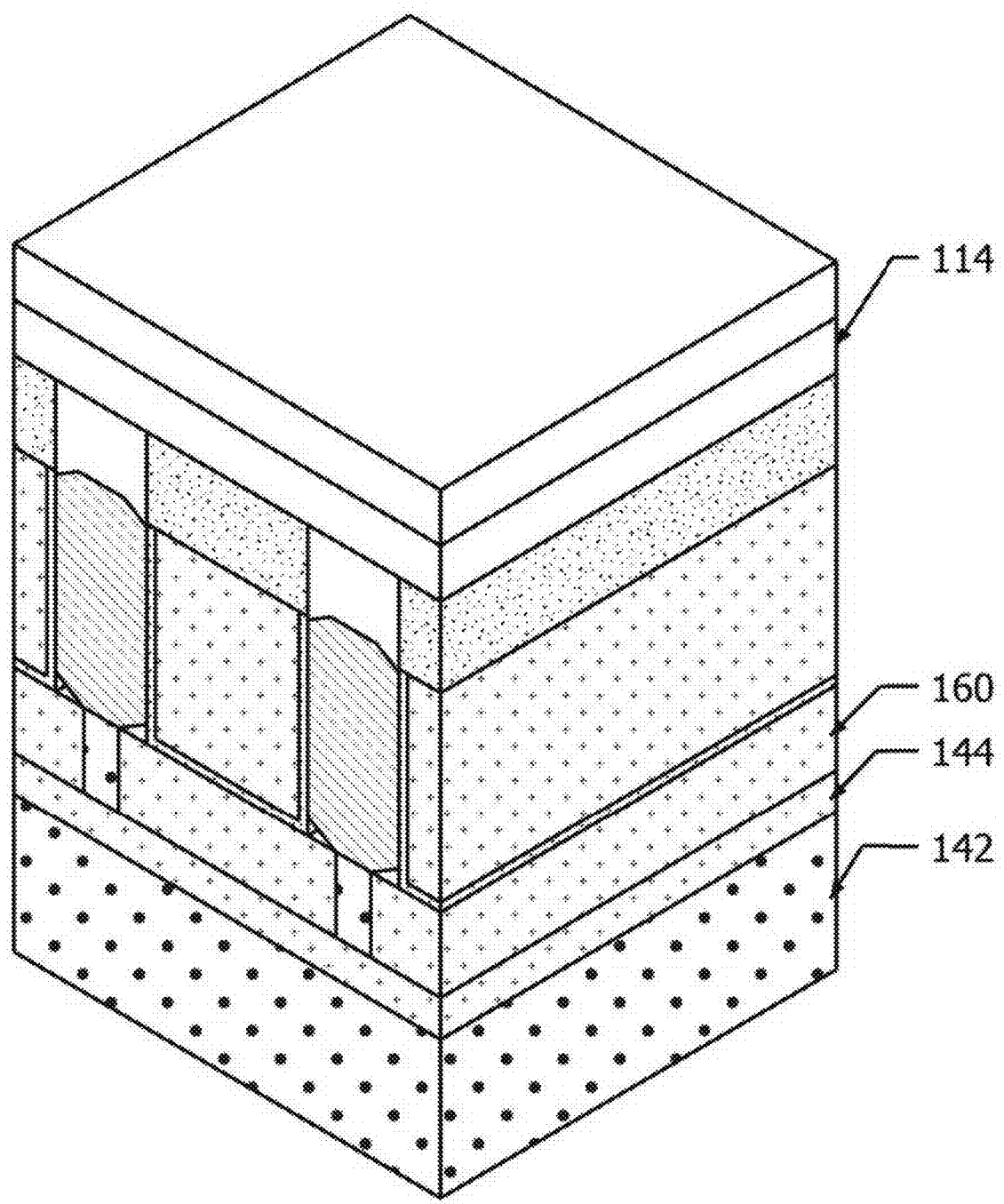

As shown in the perspective view of FIG. 20, in some embodiments, a front-side interconnect structure 114 is formed over the gate structure 104 and the first and second source/drain epitaxial structures 106, 108. The front-side interconnect structure 114 may comprise a plurality of front-side metal layers 116 disposed within and surrounded by a front-side interlayer dielectric layer 112. The front-side interconnect structure 114 electrically connects various features or structures (e.g., a gate contact 110 and/or other contacts) of the semiconductor transistor device. The front-side metal layers 116 includes vertical interconnects, such as vias or contacts, and horizontal interconnects, such as metal lines. The various interconnection features may implement various conductive materials including copper, tungsten and silicide. In some examples, a damascene process is used to form copper multilayer interconnection structure. Subsequently, a carrier substrate 240 is formed above the front-side interconnect structure 114. For example, the carrier substrate 240 is bond to the front-side interconnect structure 114. In some embodiments, carrier substrate 240 is sapphire. In some other embodiments, the carrier substrate 240 is silicon, a thermoplastic polymer, oxide, carbide, or other suitable material.

Figure 21:
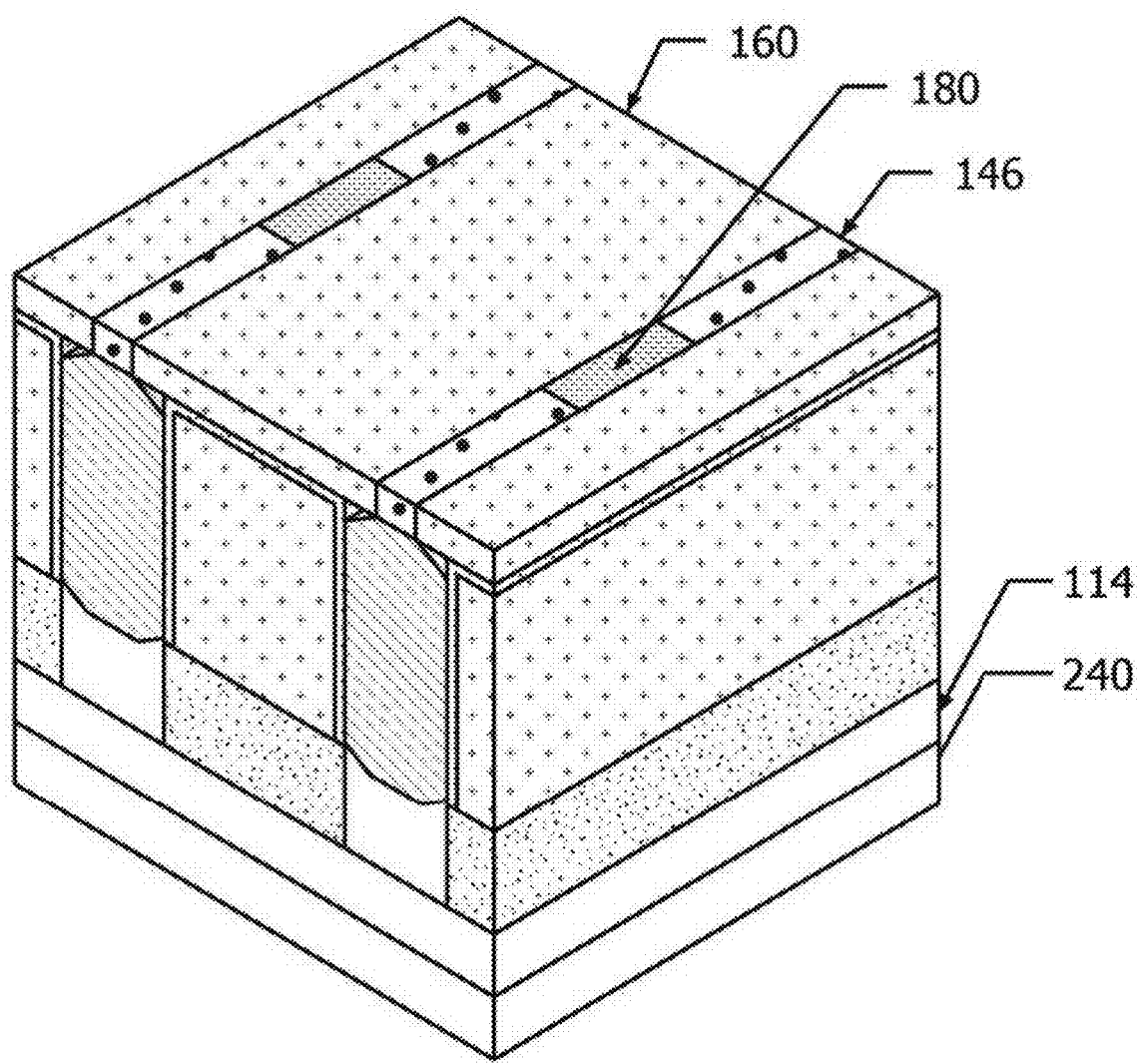

As shown in the perspective view of FIG. 21, in some embodiments, the workpiece is "flipped" upside down and thinned to expose the first sacrificial source/drain contact 180 and the semiconductor substrate layer 146 from a back-side. The bulk substrate 142, the insulator substrate layer 144, and at least an upper portion of the lower isolation structure 160 are removed. The bulk substrate 142 and the lower isolation structure 160 may be removed in a plurality of process operations, for example, firstly removing the bulk substrate 142 followed by removal of the lower isolation structure 160. In some embodiments, the removal processes include removal of the bulk substrate 142 and the lower isolation structure 160 using, for example, CMP, HNA, and/or TMAH etching.

Figure 22A:
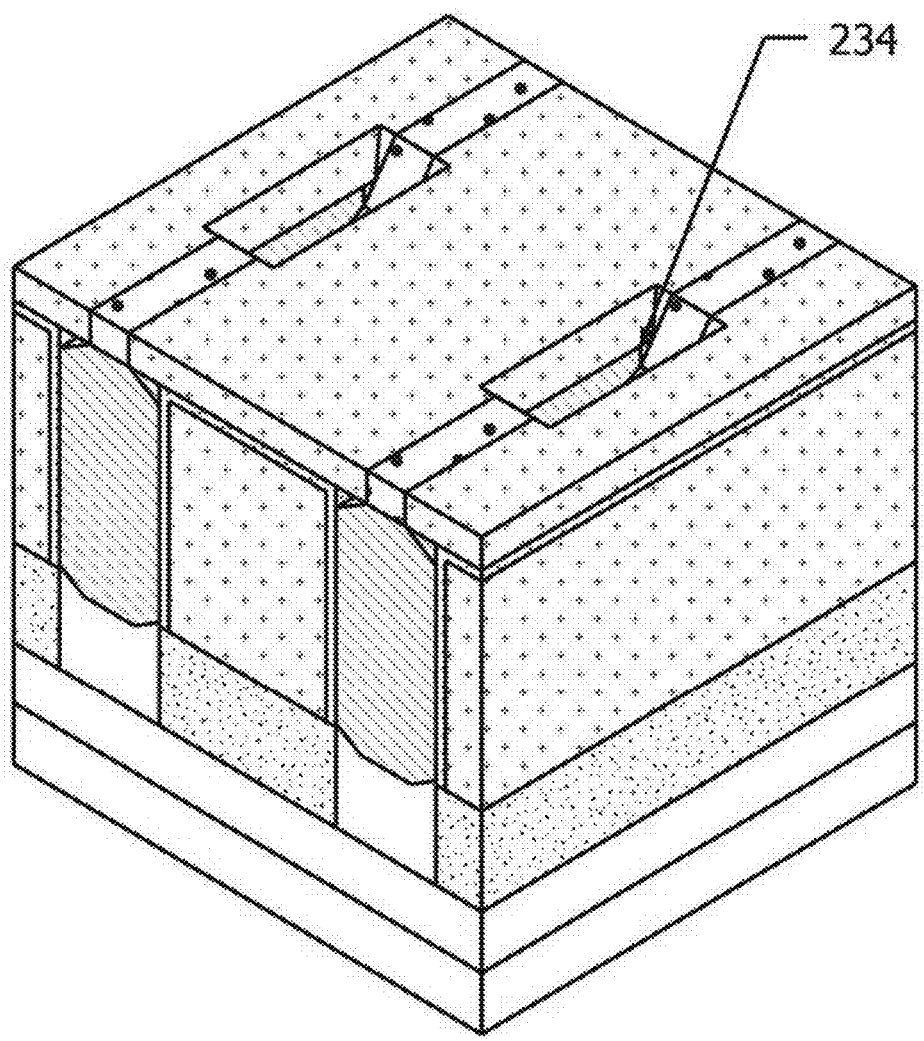
Figure 22B:
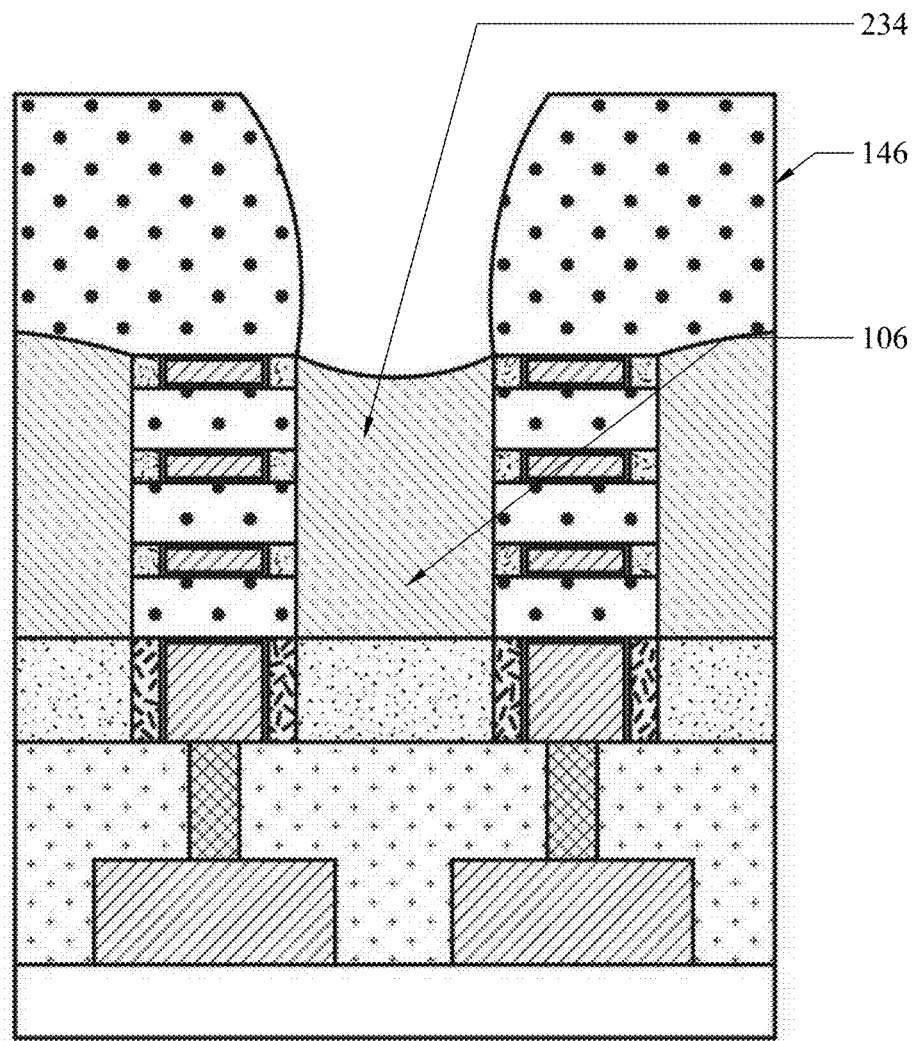
Figure 22C:
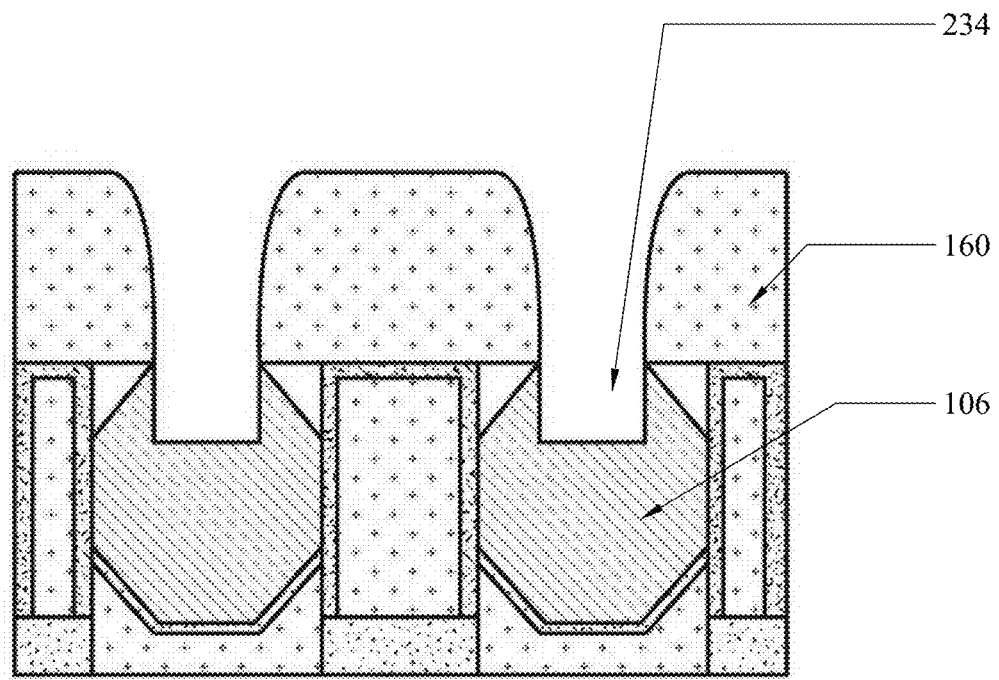

As shown in the perspective view of FIG. 22A, the x-direction cross-sectional view of FIG. 22B, and the y-direction cross-sectional view of FIG. 22C in the first source/drain region, in some embodiments, the first sacrificial source/drain contact 180 is removed, and the underlying first source/drain epitaxial structure 106 is recessed from the back-side thereof to form a back-side source/drain contact trench 234 recessed into an upper portion of the first source/drain epitaxial structure 106. The first source/drain epitaxial structure 106 can be recessed or etched using an etchant that can selectively etch the first source/drain epitaxial structure 106 at a faster etching rate than etching surrounding dielectric materials.

Figure 23A:
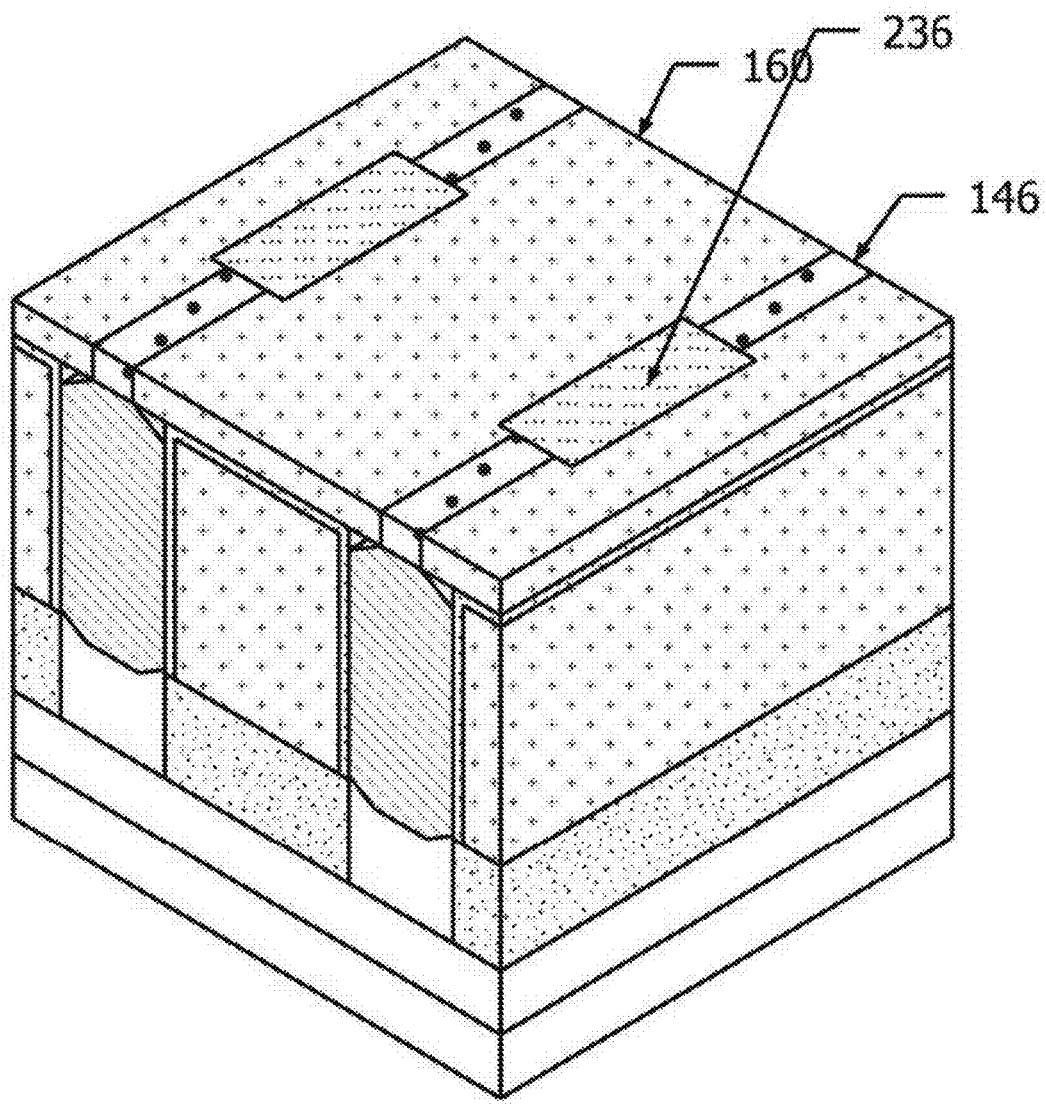
Figure 23B:
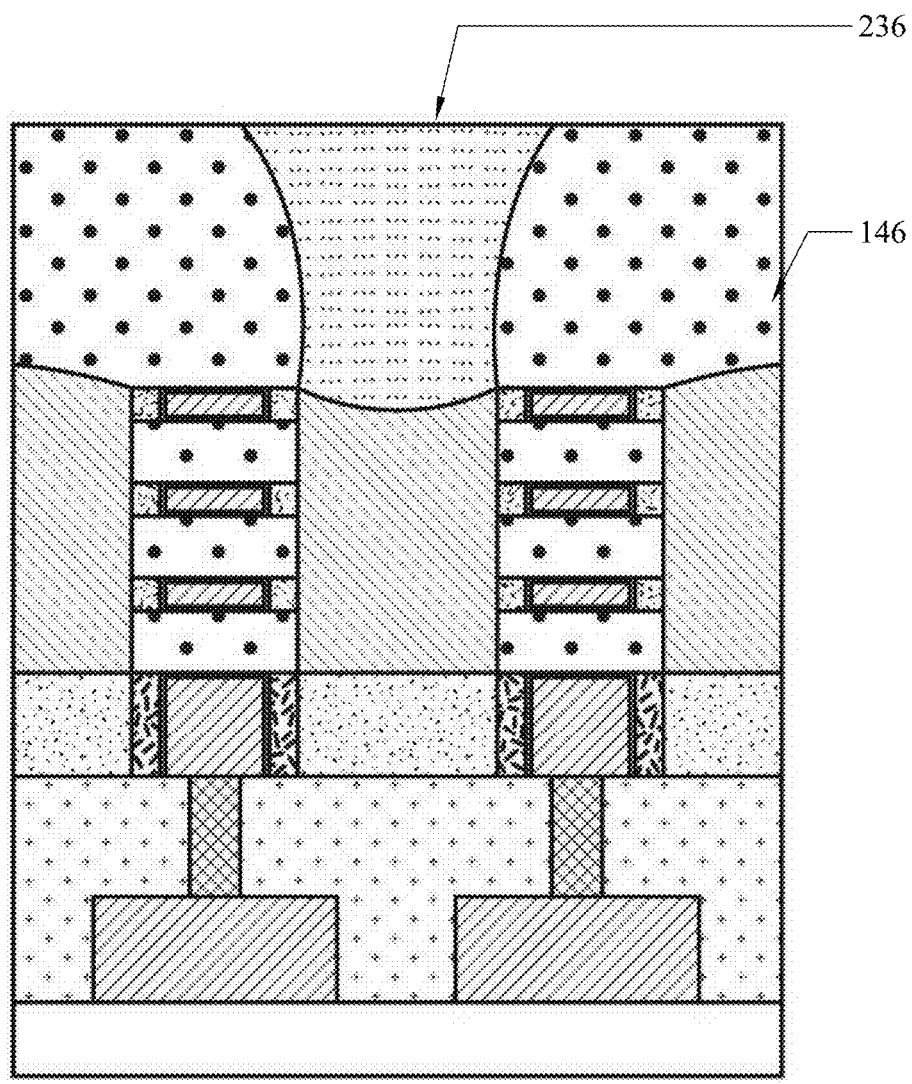
Figure 23C:
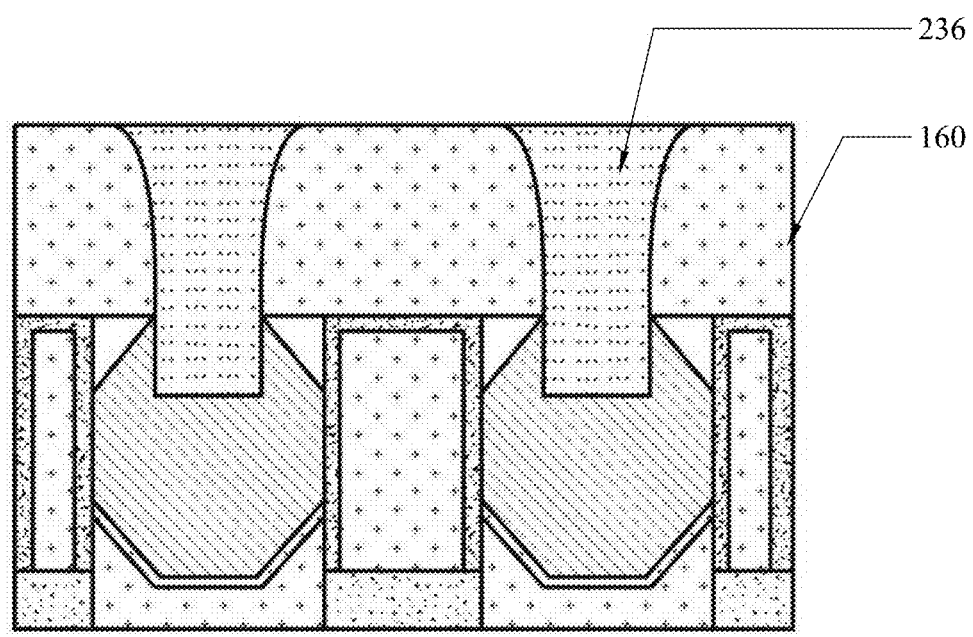

As shown in the perspective view of FIG. 23A, the x-direction cross-sectional view of FIG. 23B, and the y-direction cross-sectional view of FIG. 23C in the first source/drain region, in some embodiments, a second sacrificial source/drain contact 236 is filled in the back-side source/drain contact trench 234. In some embodiments, the second sacrificial source/drain contact 236 is formed by depositing a dielectric material such as silicon nitride in the back-side source/drain contact trench 234 followed by a planarization process to remove excessive portions, such that the second sacrificial source/drain contact 236 may be coplanar with the lower isolation structure 160 and the semiconductor substrate layer 146.

Figure 24A:
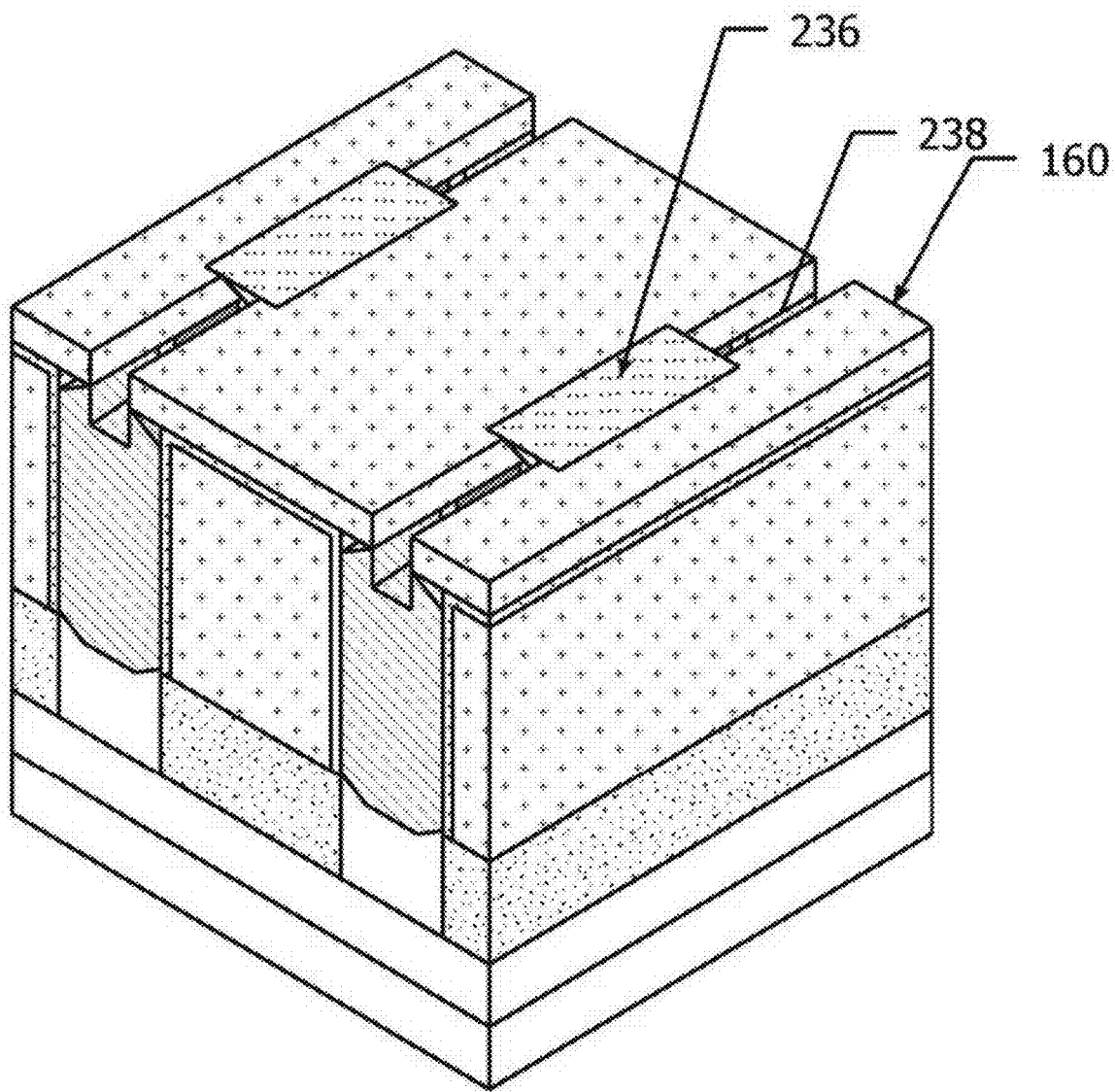
Figure 24B:
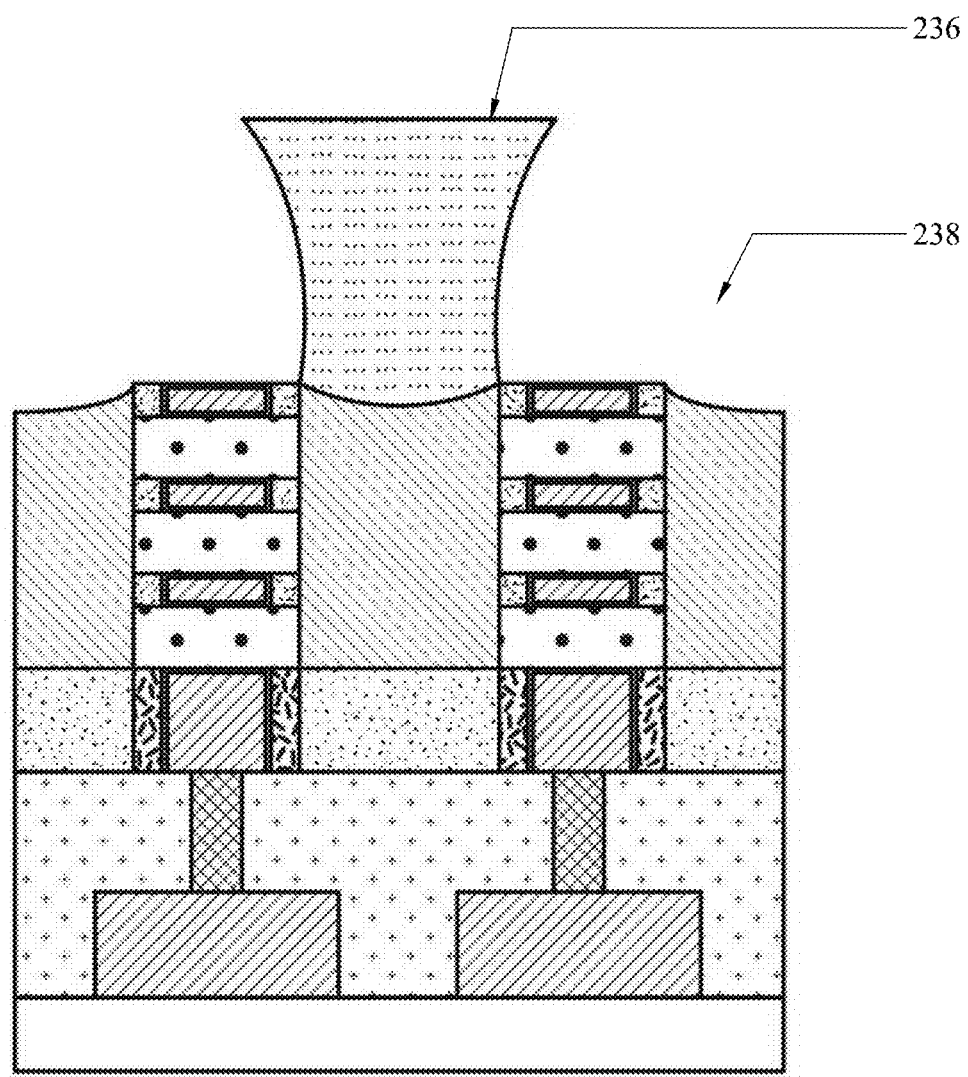
Figure 24C:
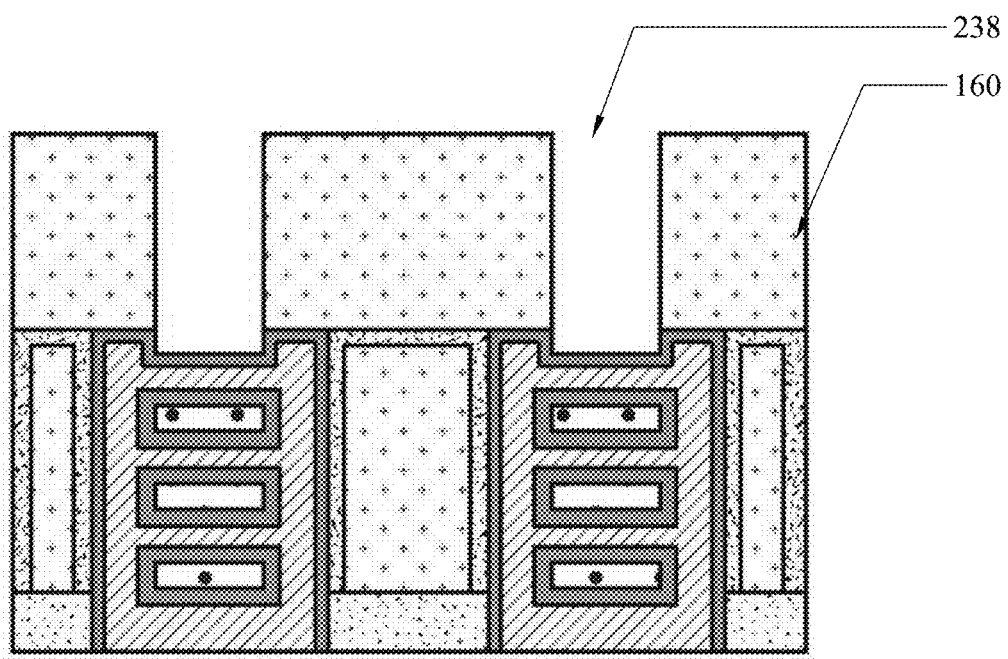
Figure 24D:
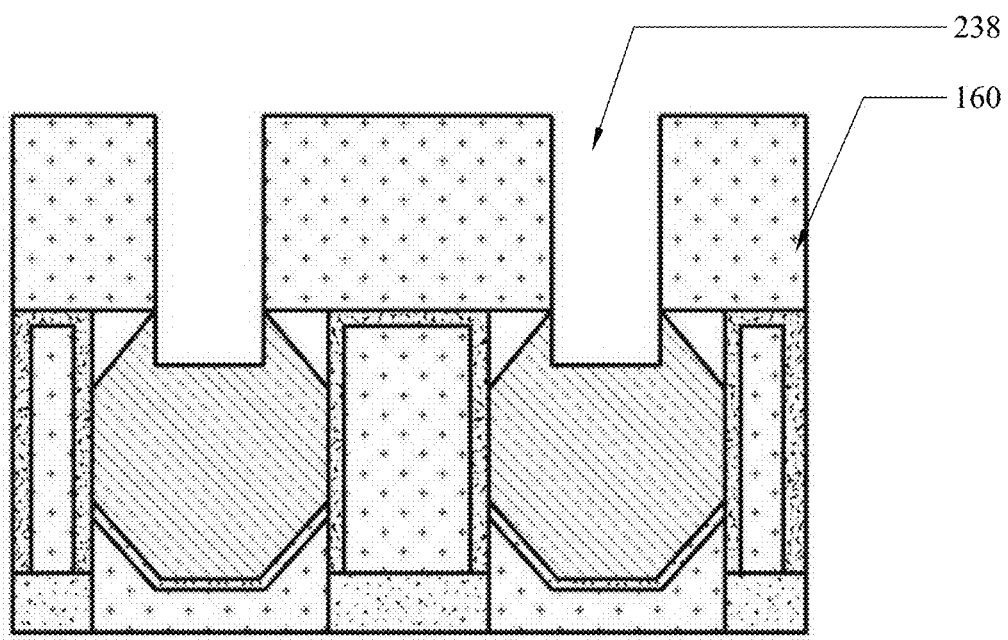

As shown in the perspective view of FIG. 24A, the x-direction cross-sectional view of FIG. 24B, and the y-direction cross-sectional view of FIG. 24C in the second source/drain region, in some embodiments, the semiconductor substrate layer 146 is removed to form a back-side capping trenches 238 above the second source/drain epitaxial structure 108 and the gate structure 104. The underlying second source/drain epitaxial structure 108 and the gate structure 104 may be exposed. In some embodiments, the second source/drain epitaxial structure 108 is recessed from the back-side, and the back-side capping trench 238 is formed into an upper portion of the second source/drain epitaxial structure 108.

Figure 25A:
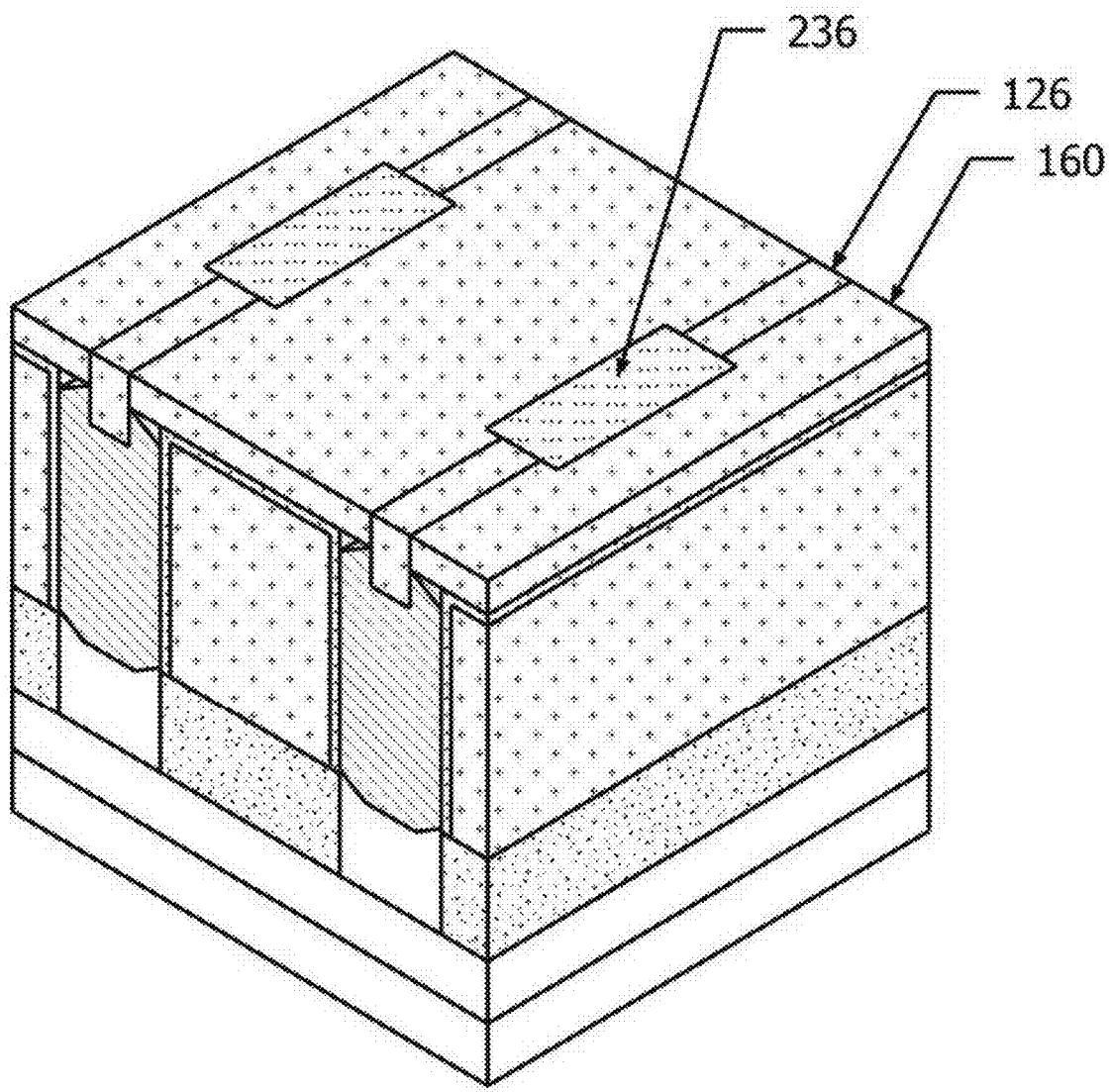
Figure 25B:
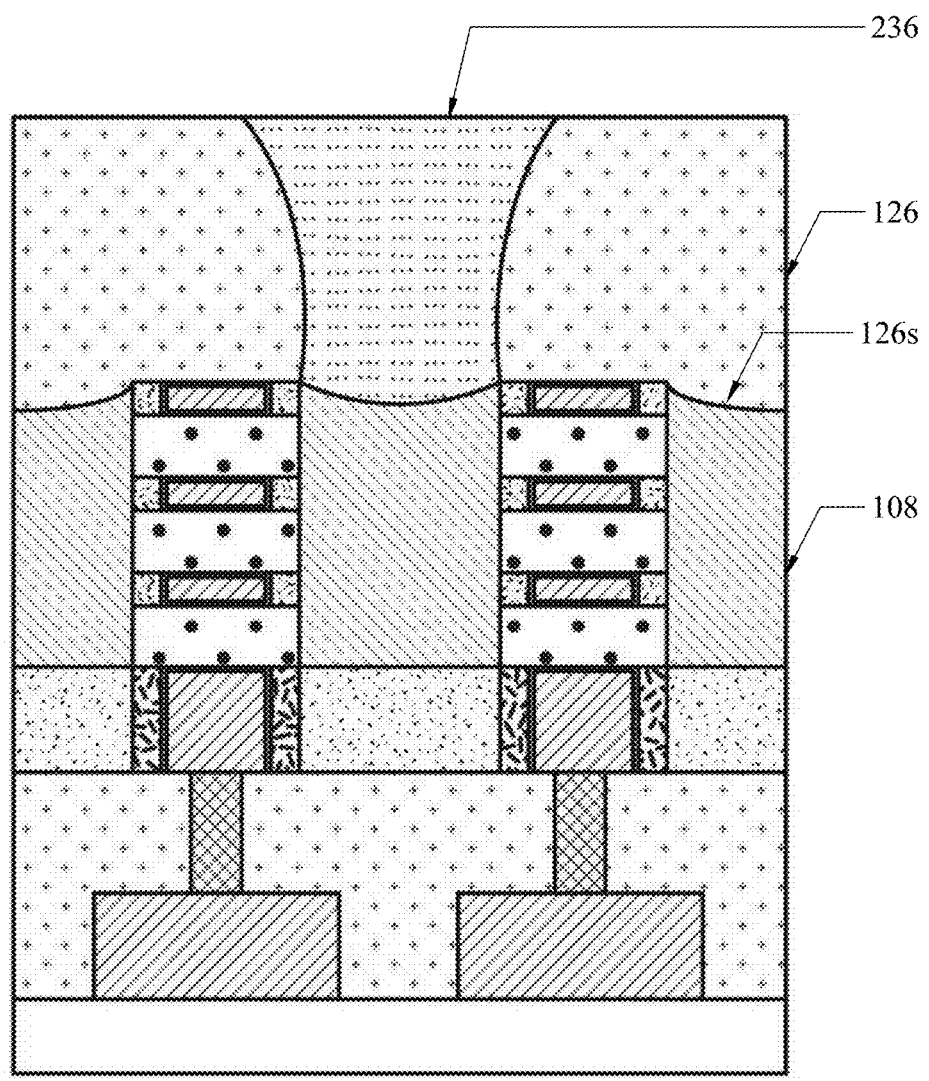
Figure 25C:
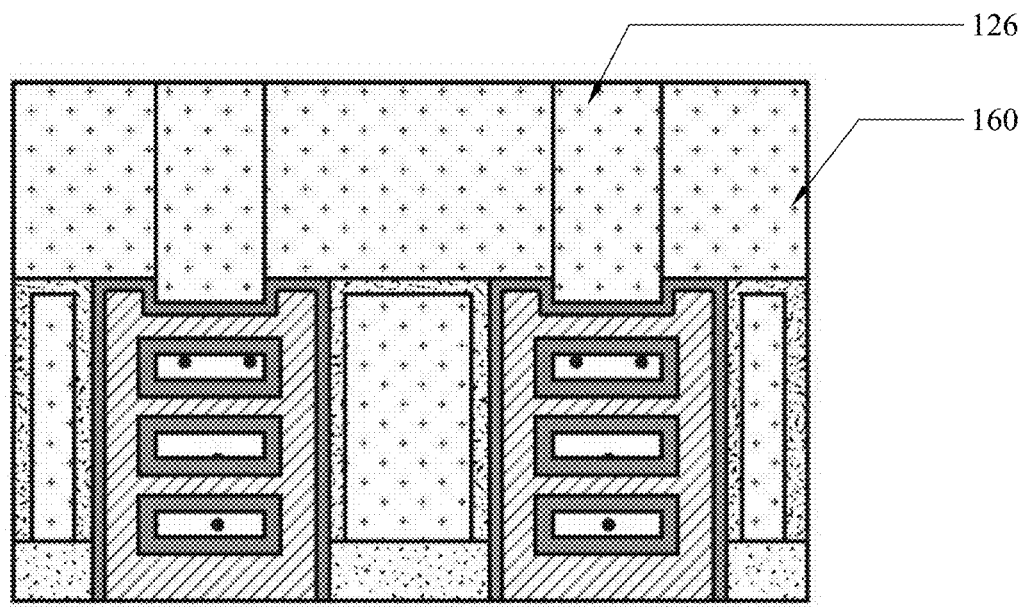
Figure 25D:
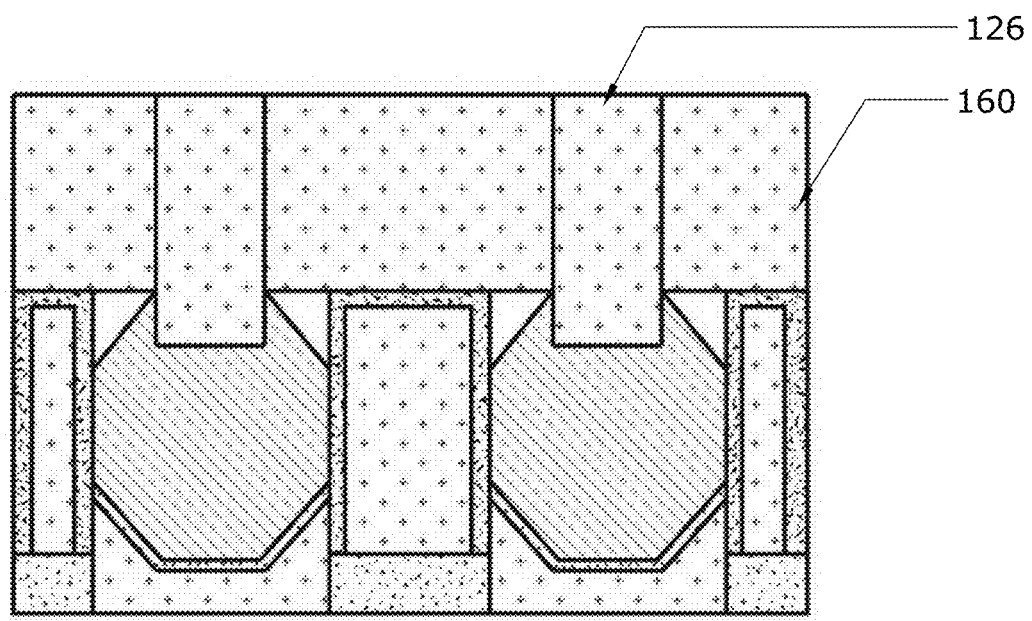

As shown in the perspective view of FIG. 25A, the x-direction cross-sectional view of FIG. 25B, the y-direction cross-sectional view of FIG. 25C in the gate region, and the y-direction cross-sectional view of FIG. 25D in the second source/drain region, in some embodiments, a back-side dielectric cap 126 is formed in the back-side capping trenches 238 (see FIG. 24A). The back-side dielectric cap 126 may be formed directly above the second source/drain epitaxial structure 108 and the gate structure 104. The back-side dielectric cap 126 may be formed by for example, a deposition process to deposit a dielectric material in the back-side capping trenches 238, followed by a CMP process to remove excess dielectric material outside the back-side capping trenches 238. In some embodiments, the back-side dielectric cap 126 comprises a dielectric material different from the second sacrificial source/drain contact 236, such as silicon oxide. Other applicable materials may include SiO2, SiN, SiCN, SiOCN, Al2O3, AlON, ZrO2, HfO2, combinations thereof, or the like. In some embodiments, the back-side dielectric cap 126 have a convex top surface 126s at an interface between the back-side dielectric cap 126 and the second source/drain epitaxial structure 108.

Figure 26A:
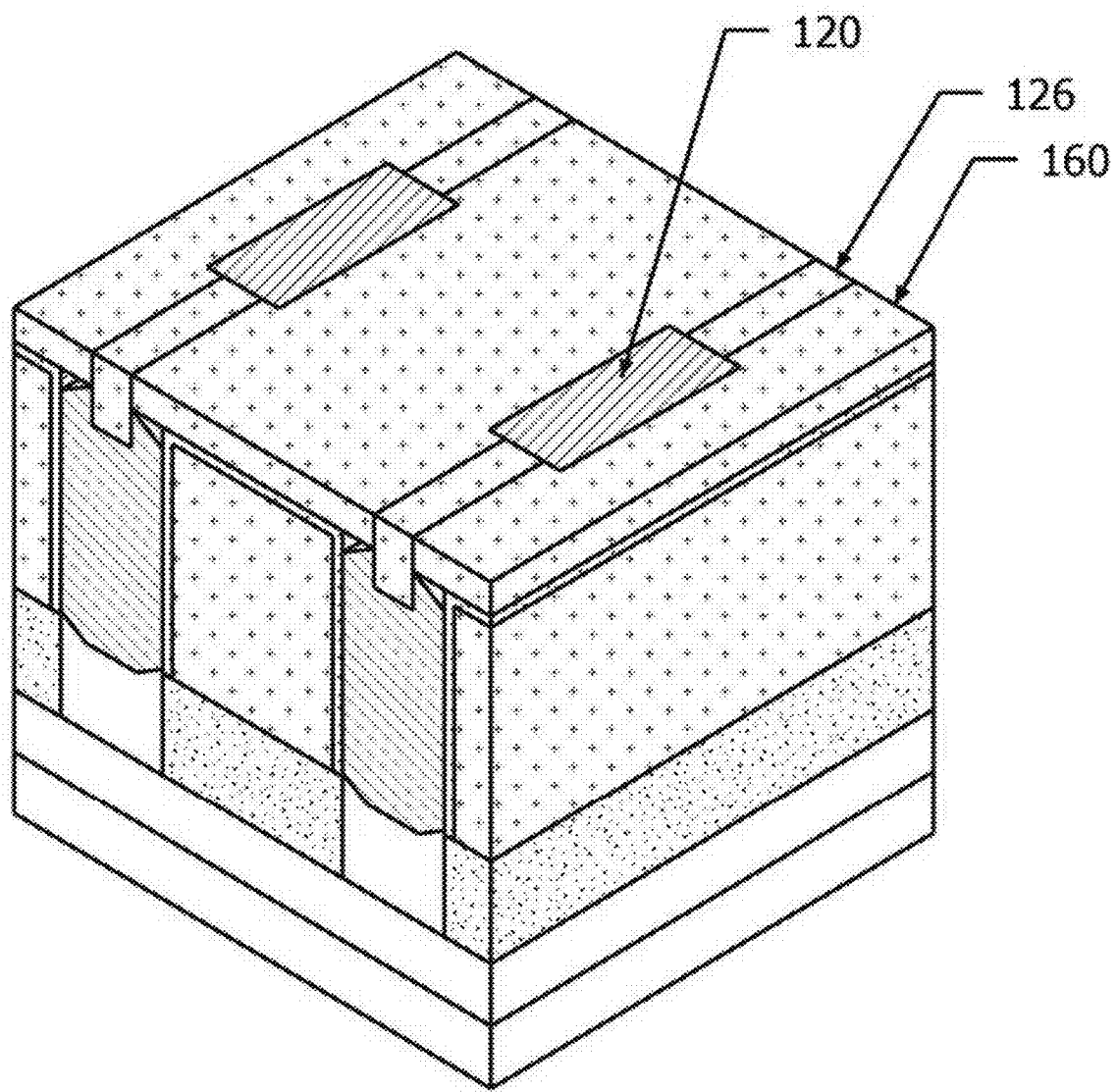
Figure 26B:
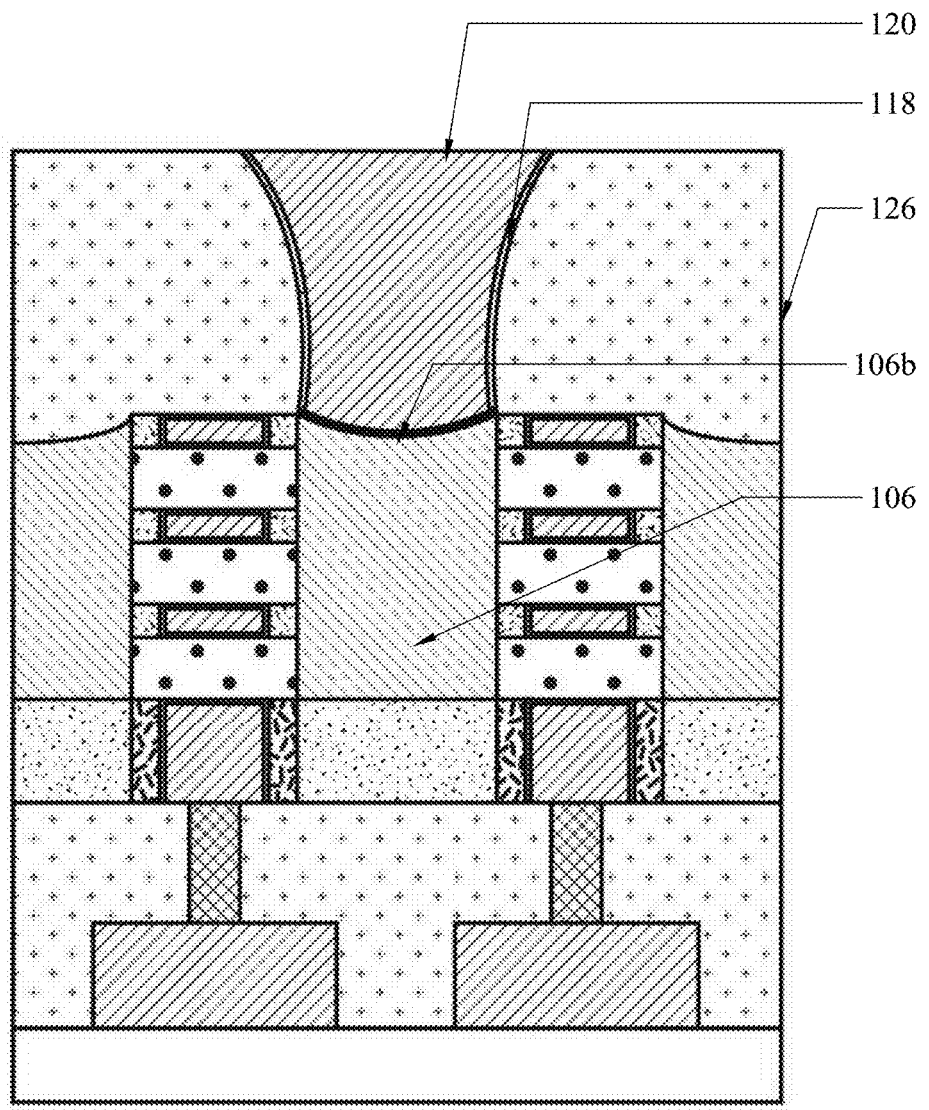
Figure 26C:
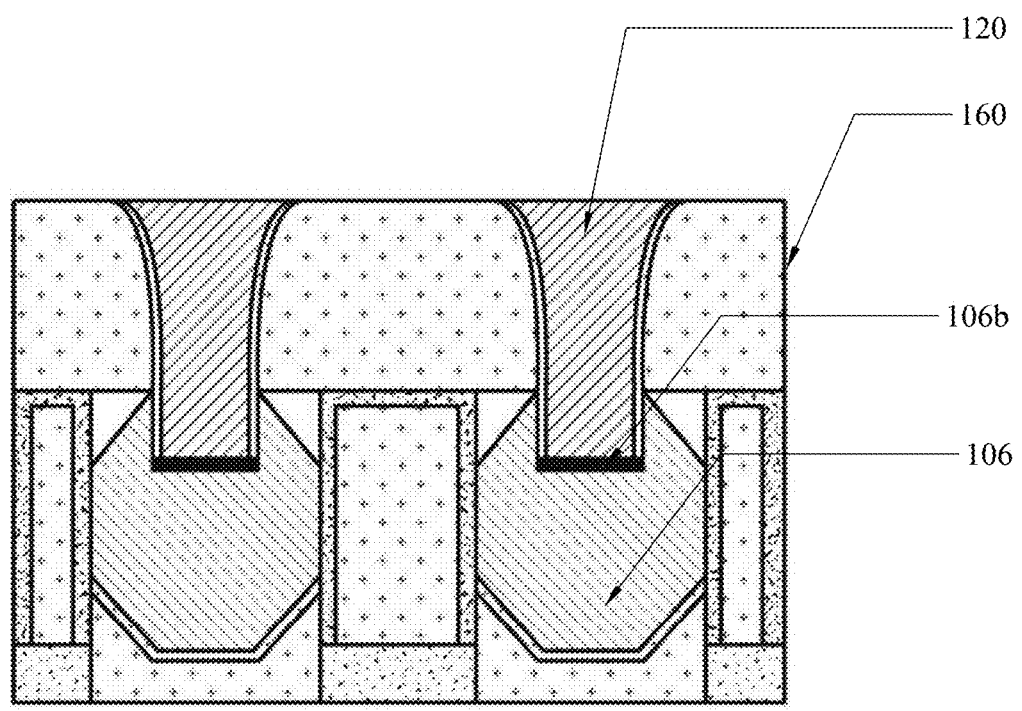

As shown in the perspective view of FIG. 26A, the x-direction cross-sectional view of FIG. 26B, and the y-direction cross-sectional view of FIG. 26C in the first source/drain region, in some embodiments, a back-side source/drain contact 120 is formed in at least a portion of the back-side source/drain contact trench 234 replacing the second sacrificial source/drain contact 236 (see FIG. 23A). In some embodiments, an outer portion of the second sacrificial source/drain contact 236 is left in the back-side source/drain contact trench 234 as a dielectric sidewall spacer 118 separating the back-side source/drain contact 120 from the back-side dielectric cap 126. The back-side source/drain contact 120 reaches on a recessed bottom surface 106b of the first source/drain epitaxial structure 106. The bottom surface 106b may be recessed during previous steps as shown by FIGS. 22A-22C for example. In some embodiments, prior to forming the back-side source/drain contact 120, a back-side metal alloy layer may be formed on the first source/drain epitaxial structure 106. The back-side metal alloy layer may be a silicide layers formed by a self-aligned salicide process. The back-side metal alloy layer may include a material selected from titanium silicide, cobalt silicide, nickel silicide, platinum silicide, nickel platinum silicide, erbium silicide, palladium silicide, combinations thereof, or other suitable materials. In some embodiments, the back-side metal alloy layer may include germanium. In some embodiments, the back-side source/drain contact 120 may be made of metal, such as W, Co, Ru, Al, Cu, or other suitable materials. After the deposition of the back-side source/drain contact 120, a planarization process, such as a chemical mechanical planarization (CMP) process, may be then performed. In some embodiments, a barrier layer may be formed in the back-side source/drain contact trench 234 before the formation of the back-side source/drain contact 120. The barrier layer may be made of TiN, TaN, or combinations thereof.

Figure 27A:
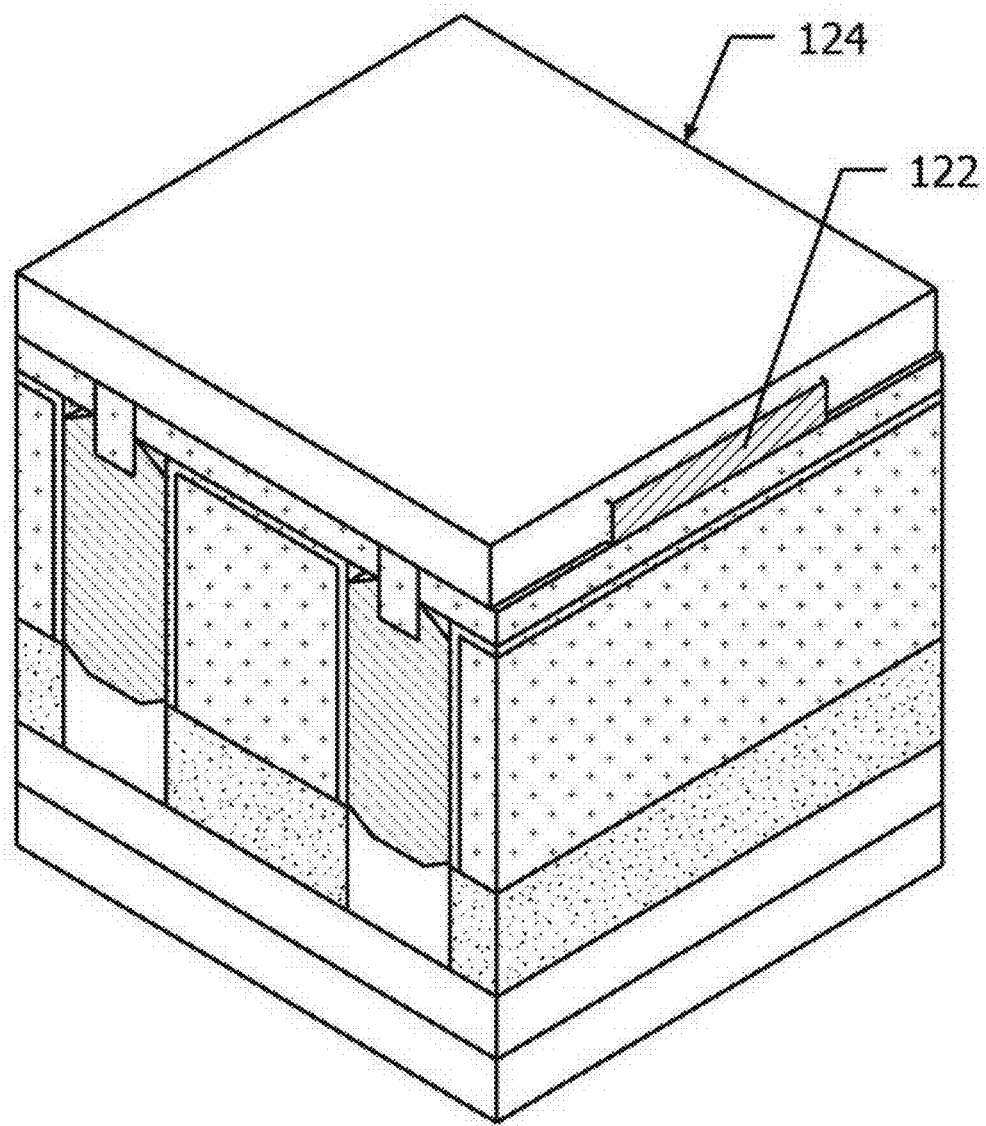
Figure 27B:
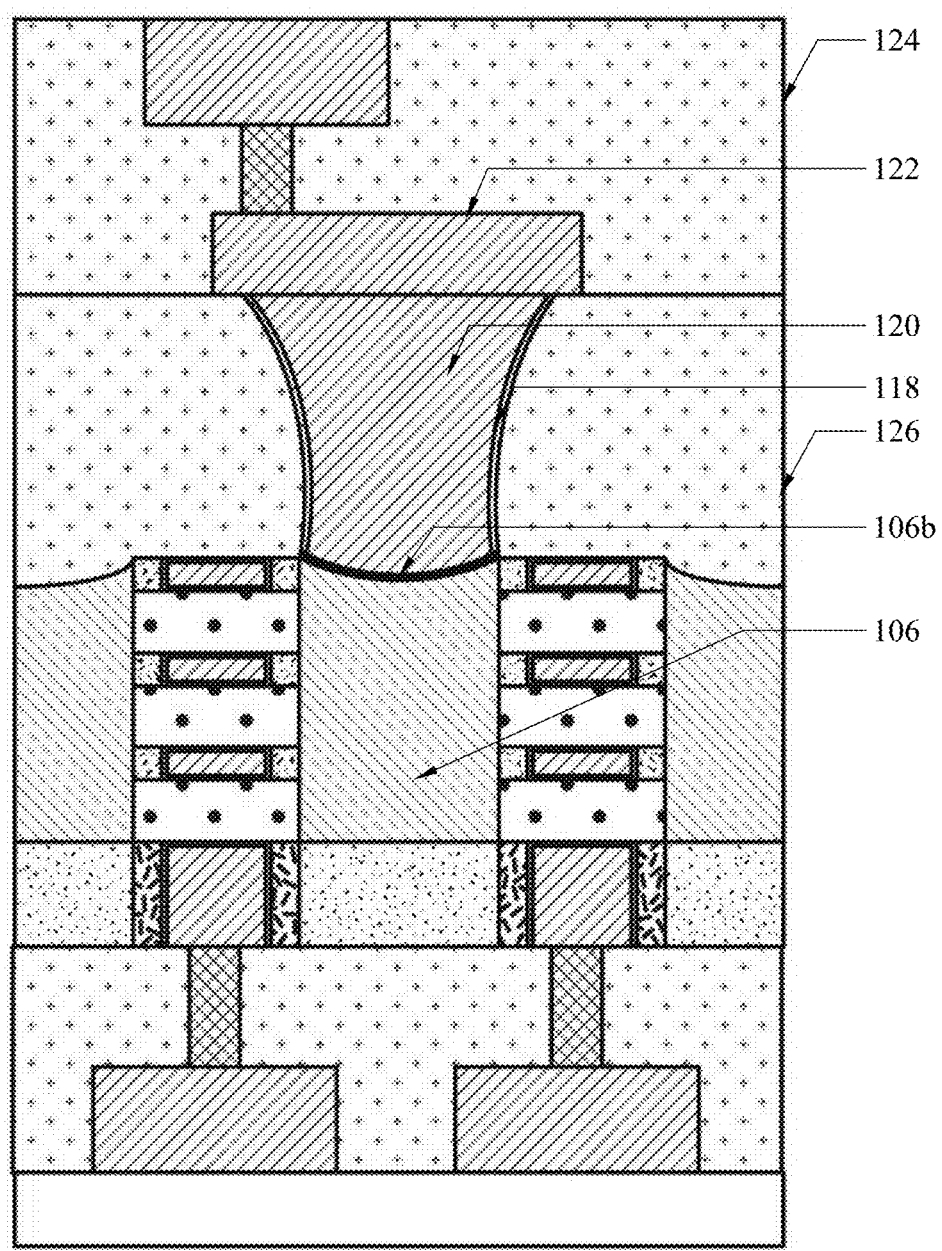

As shown in the perspective view of FIG. 27A and the x-direction cross-sectional view of FIG. 27B, in some embodiments, a back-side power rail 122 and a back-side interconnect structure 124 are formed to be electrically coupled to the back-side source/drain contact 120.

Figure 28:
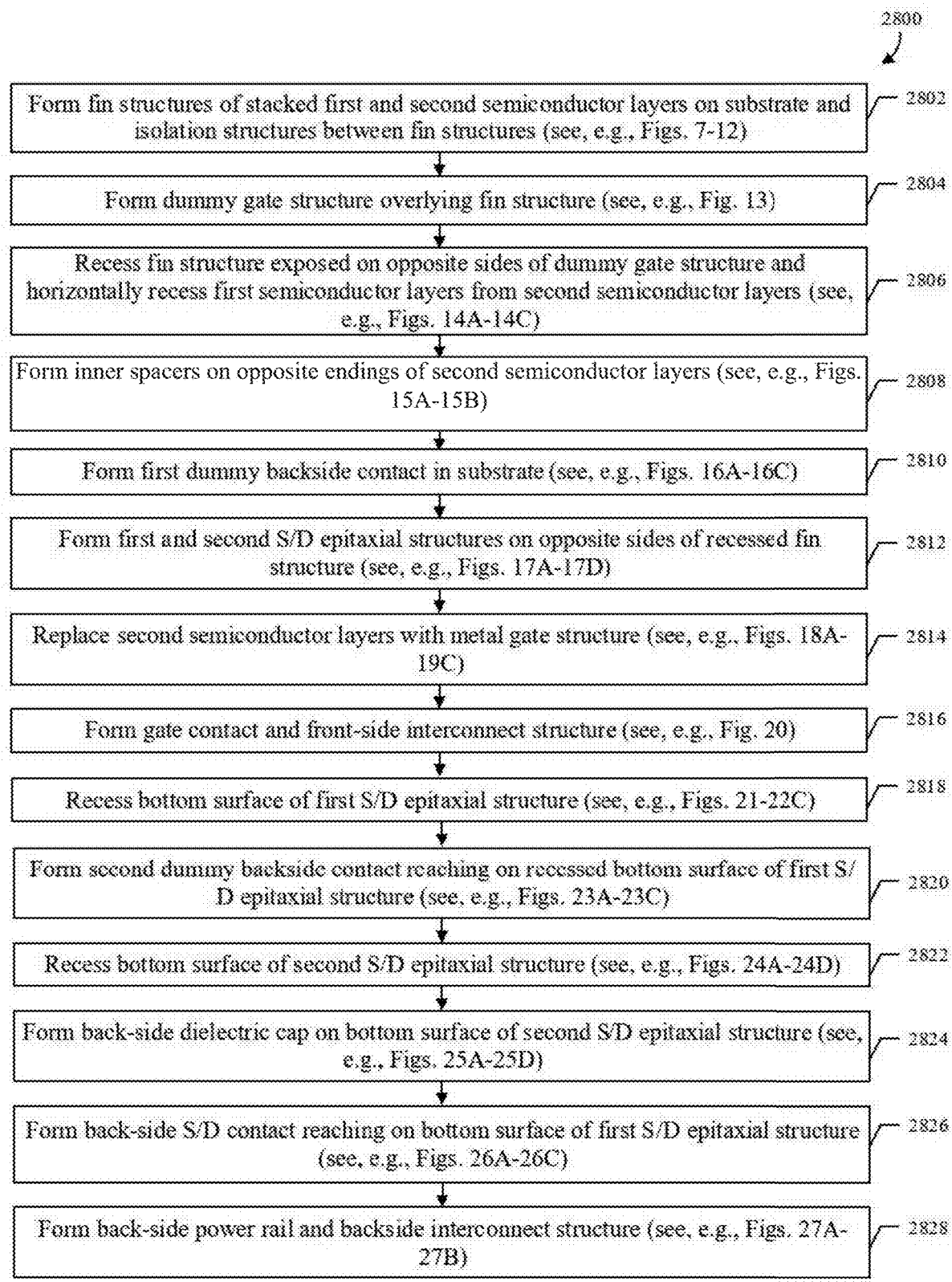
FIG. 28 illustrates a flow diagram of some embodiments of a method corresponding to FIGS. 7-27B.

FIG. 28 illustrates a flow diagram of some embodiments of a method 2800 of forming an integrated chip having multiple transistor devices with a high device density due to air spacer structures and high-κ dielectric spacer structures.

While method 2800 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2802, a plurality of fin structures of stacked first and second semiconductor layers are formed on a substrate. An isolation structure is formed between the fin structures (see, e.g., FIGS. 7-12). FIGS. 7-12 illustrate the perspective views of some embodiments corresponding to act 2802.

At act 2804, a plurality of dummy gate structures is formed overlying the fin structures. FIG. 13 illustrates the perspective view of some embodiments corresponding to act 2804.

At act 2806, portions of the fin structures not covered by the dummy gate structures are etched and removed from opposite sides of dummy gate structure. The second semiconductor layers are horizontally recessed from the first semiconductor layers. FIGS. 14A-14C illustrate the various views of some embodiments corresponding to act 2806.

At act 2808, inner spacers are formed on opposite endings of second semiconductor layers. FIGS. 15A-15B illustrate the various views of some embodiments corresponding to act 2808.

At act 2810, a first dummy backside contact is formed in the substrate. FIGS. 16A-16C illustrate the various views of some embodiments corresponding to act 2810.

At act 2812, first and second source/drain epitaxial structures are formed on opposite sides of the recessed fin structure. FIGS. 17A-17D illustrate the various views of some embodiments corresponding to act 2812.

At act 2814, the second semiconductor layers are replaced with a metal gate structure. FIGS. 18A-19C illustrate the various views of some embodiments corresponding to act 2814.

At act 2816, a gate contact and a front-side interconnect structure are formed. FIG. 20 illustrates the perspective view of some embodiments corresponding to act 2816.

At act 2818, a bottom surface of first source/drain epitaxial structure is recessed. FIGS. 21-22C illustrate the various views of some embodiments corresponding to act 2818.

At act 2820, a second dummy backside contact is formed reaching on the recessed bottom surface of the first source/drain epitaxial structure. FIGS. 23A-23C illustrate the various views of some embodiments corresponding to act 2820.

At act 2822, a bottom surface of second source/drain epitaxial structure is recessed. FIGS. 24A-24D illustrate the various views of some embodiments corresponding to act 2822.

At act 2824, a back-side dielectric cap is formed on the bottom surface of the second source/drain epitaxial structure. FIGS. 25A-25D illustrate the various views of some embodiments corresponding to act 2824.

At act 2826, a back-side source/drain contact is formed reaching on bottom surface of first source/drain epitaxial structure. FIGS. 26A-26C illustrate the various views of some embodiments corresponding to act 2826.

At act 2828, a back-side power rail and a backside interconnect structure are formed. FIGS. 27A-27B illustrate the various views of some embodiments corresponding to act 2828.

Accordingly, in some embodiments, the present disclosure relates to a semiconductor transistor device. The semiconductor transistor device comprises a channel structure and a gate structure wrapping around the channel structure. The semiconductor transistor device further comprises a first source/drain epitaxial structure and a second source/drain epitaxial structure disposed on opposite endings of the channel structure and a back-side source/drain contact disposed under the first source/drain epitaxial structure. The first source/drain epitaxial structure has a concave bottom surface contacting the back-side source/drain contact. The semiconductor transistor device further comprises a gate contact disposed on the gate structure.

In other embodiments, the present disclosure relates to a semiconductor transistor device. The semiconductor transistor device comprises a channel structure and a gate structure wrapping around the channel structure. The semiconductor transistor device further comprises a first source/drain epitaxial structure and a second source/drain epitaxial structure disposed on opposite endings of the channel structure and a back-side source/drain contact disposed under and contacting the first source/drain epitaxial structure. The semiconductor transistor device further comprises a gate contact disposed on the gate structure and a back-side dielectric cap disposed under and contacting the second source/drain epitaxial structure and the gate structure.

In yet other embodiments, the present disclosure relates to a method of manufacturing a semiconductor transistor device. The method comprises forming a fin structure over a substrate by alternately stacking first semiconductor layers and second semiconductor layers and forming a dummy gate structure over the fin structure. The method further comprises removing a portion of the fin structure uncovered by the dummy gate structure and forming inner spacers on opposite sides of remaining portions of the first semiconductor layers. The method further comprises forming a first source/drain epitaxial structure and a second source/drain epitaxial structure on opposite endings of the fin structure. The method further comprises replacing the dummy gate structure and the first semiconductor layers with a metal gate structure. The method further comprises removing the substrate and forming a back-side capping trench to expose a bottom surfaces of the metal gate structure and a bottom surface of the second source/drain epitaxial structure. The bottom surface of the second source/drain epitaxial structure is recessed. The method further comprises forming a back-side dielectric cap in the back-side capping trench and forming a back-side source/drain contact under and contacting the first source/drain epitaxial structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor transistor device, comprising:
    a channel structure;
    a gate structure wrapping around the channel structure;
    a first source/drain epitaxial structure and a second source/drain epitaxial structure disposed on opposite endings of the channel structure;
    a gate contact disposed on the gate structure; and
    a back-side source/drain contact disposed under the first source/drain epitaxial structure;
    wherein the first source/drain epitaxial structure has a concave bottom surface contacting the back-side source/drain contact.

2. The semiconductor transistor device of claim 1, further comprising a back-side dielectric cap disposed under and in direct contact with the second source/drain epitaxial structure.

3. The semiconductor transistor device of claim 2, wherein the second source/drain epitaxial structure has a concave bottom surface contacting the back-side dielectric cap.

4. The semiconductor transistor device of claim 2, wherein the back-side dielectric cap extends under the gate structure.

5. The semiconductor transistor device of claim 4, wherein the back-side dielectric cap directly contacts the gate structure.

6. The semiconductor transistor device of claim 2, further comprising a middle isolation structure surrounding the gate structure, the first source/drain epitaxial structure, and the second source/drain epitaxial structure.

7. The semiconductor transistor device of claim 6, further comprising a lower isolation structure disposed under the middle isolation structure and surrounding the back-side dielectric cap.

8. The semiconductor transistor device of claim 1, further comprising a dielectric sidewall spacer disposed along a sidewall of the back-side source/drain contact.

9. The semiconductor transistor device of claim 1, further comprising an inner spacer separating the gate structure from the first source/drain epitaxial structure and the second source/drain epitaxial structure.

10. The semiconductor transistor device of claim 1, wherein the channel structure comprises a stack of semiconductor nanowires.

11. A semiconductor transistor device, comprising:
    a channel structure;
    a gate structure wrapping around the channel structure;
    a first source/drain epitaxial structure and a second source/drain epitaxial structure disposed on opposite endings of the channel structure;
    a gate contact disposed on the gate structure; and
    a back-side source/drain contact disposed under and contacting the first source/drain epitaxial structure; and
    a back-side dielectric cap disposed under and contacting the second source/drain epitaxial structure and the gate structure.

12. The semiconductor transistor device of claim 11, wherein the second source/drain epitaxial structure has a bottom surface locating higher than a bottom surface of the gate structure.

13. The semiconductor transistor device of claim 11, wherein the back-side source/drain contact has a top surface locating higher than a bottom surface of the gate structure.

14. The semiconductor transistor device of claim 11, further comprising a dielectric sidewall spacer disposed between the back-side source/drain contact and the back-side dielectric cap.

15. The semiconductor transistor device of claim 11, wherein the gate structure comprises:
    a gate electrode; and
    a gate dielectric between the gate electrode and the channel structure.

16. The semiconductor transistor device of claim 11, wherein the channel structure comprises a stack of semiconductor nanowires.

17. The semiconductor transistor device of claim 11, further comprising an inner spacer separating with the gate structure from the first source/drain epitaxial structure and the second source/drain epitaxial structure.

18. The semiconductor transistor device of claim 11, wherein the back-side dielectric cap comprises $SiO_2$, SiN, SiCN, SiOCN, $Al_2O_3$, AlON, $ZrO_2$, $HfO_2$, or combinations thereof.

19. A method of forming a semiconductor transistor device, the method comprising:
    forming a fin structure over a substrate by alternately stacking first semiconductor layers and second semiconductor layers;
    forming a dummy gate structure over the fin structure;
    removing a portion of the fin structure uncovered by the dummy gate structure;
    forming inner spacers on opposite sides of remaining portions of the first semiconductor layers;
    forming a first source/drain epitaxial structure and a second source/drain epitaxial structure on opposite endings of the fin structure;
    replacing the dummy gate structure and the first semiconductor layers with a metal gate structure;
    removing the substrate and forming a back-side capping trench to expose a bottom surfaces of the metal gate structure and a bottom surface of the second source/drain epitaxial structure, wherein the bottom surface of the second source/drain epitaxial structure is recessed;
    forming a back-side dielectric cap in the back-side capping trench; and
    forming a back-side source/drain contact under and contacting the first source/drain epitaxial structure.

20. The method of claim 19, wherein forming the back-side source/drain contact comprises:
    forming a back-side contact trench after forming the inner spacers;
    filling the back-side contact trench with a sacrificial semiconductor material;

removing the sacrificial semiconductor material and replacing with a sidewall spacer dielectric material prior to forming the back-side capping trench;
removing at least a portion of the sidewall spacer dielectric material; and
replacing with the back-side source/drain contact after forming the back-side dielectric cap.

* * * * *